United States Patent
Giusti et al.

(10) Patent No.: US 11,810,604 B2
(45) Date of Patent: Nov. 7, 2023

(54) READ/WRITE DEVICE FOR A HARD-DISK MEMORY SYSTEM, AND CORRESPONDING MANUFACTURING PROCESS

(71) Applicant: STMICROELECTRONICS S.r.l., Agrate Brianza (IT)

(72) Inventors: Domenico Giusti, Caponago (IT); Marco Ferrera, Concorezzo (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 0 days.

(21) Appl. No.: 17/949,712

(22) Filed: Sep. 21, 2022

(65) Prior Publication Data
US 2023/0019422 A1 Jan. 19, 2023

Related U.S. Application Data

(63) Continuation of application No. 17/088,394, filed on Nov. 3, 2020, now Pat. No. 11,482,248.

(30) Foreign Application Priority Data

Nov. 29, 2019 (IT) .................. 102019000022488

(51) Int. Cl.
*G11B 5/60* (2006.01)
*G11B 5/48* (2006.01)
(Continued)

(52) U.S. Cl.
CPC ............ *G11B 5/6058* (2013.01); *G11B 5/483* (2015.09); *G11B 5/73919* (2019.05); *H10N 30/03* (2023.02); *H10N 30/2047* (2023.02)

(58) Field of Classification Search
None
See application file for complete search history.

(56) References Cited

U.S. PATENT DOCUMENTS 6,239,952 B1 5/2001 Bonin
6,487,045 B1 11/2002 Yanagisawa
(Continued)

FOREIGN PATENT DOCUMENTS

CN 101064115 A 10/2007
CN 108701470 A 10/2018
(Continued)

OTHER PUBLICATIONS

Liu et al., "Thermal actuator for accurate positioning read/write element in hard disk drive," *Microsystem Technologies*, vol. 18, Jun. 2012, pp. 1-9.

*Primary Examiner* — Peter Vincent Agustin
(74) *Attorney, Agent, or Firm* — SEED IP LAW GROUP LLP

(57) ABSTRACT

Various embodiments of the present disclosure provide a read/write device for a hard-disk memory system. The read/write device includes a fixed structure; a membrane region including a first and a second membrane, which are constrained to the fixed structure, and a central portion, interposed between the first and second membranes; a first and a second piezoelectric actuator, mechanically coupled, respectively, to the first and second membranes; and a read/write head, which is fixed to the central portion of the membrane region. The first and second piezoelectric actuators can be controlled so as to cause corresponding deformations of the first and second membranes, said deformations of the first and second membranes causing corresponding movements of the read/write head with respect to the fixed structure.

20 Claims, 42 Drawing Sheets

(51) Int. Cl.
   *G11B 5/73* (2006.01)
   *H10N 30/03* (2023.01)
   *H10N 30/20* (2023.01)

(56) References Cited

U.S. PATENT DOCUMENTS

| | | | |
|---|---|---|---|
| 6,590,747 B1* | 7/2003 | Boutaghou | G11B 5/5552 |
| 6,600,619 B1* | 7/2003 | Morris | G11B 5/596 |
| | | | 360/78.12 |
| 6,611,399 B1 | 8/2003 | Mei et al. | |
| 6,697,232 B1 | 2/2004 | Hipwell, Jr. et al. | |
| 6,859,346 B1 | 2/2005 | Meyer | |
| 6,883,062 B2* | 4/2005 | Susnjar | G11B 5/5578 |
| 7,538,983 B1 | 5/2009 | Meyer | |
| 11,482,248 B2* | 10/2022 | Giusti | H10N 30/03 |
| 2001/0036683 A1* | 11/2001 | Vigna | G11B 5/5552 |
| 2002/0176212 A1 | 11/2002 | Ota et al. | |
| 2003/0030942 A1* | 2/2003 | Hipwell | G11B 5/5552 |
| 2003/0095361 A1* | 5/2003 | Shimanouchi | G11B 5/54 |
| 2003/0161071 A1* | 8/2003 | Bonin | G11B 5/5552 |
| 2006/0193087 A1* | 8/2006 | Yao | G11B 5/4826 |
| 2008/0094758 A1 | 4/2008 | Liao et al. | |
| 2008/0239571 A1* | 10/2008 | Juang | G11B 5/6005 |
| | | | 360/234.3 |
| 2009/0086379 A1 | 4/2009 | Hanya et al. | |
| 2010/0200900 A1 | 8/2010 | Iwayama | |
| 2021/0166726 A1* | 6/2021 | Giusti | G11B 5/5552 |
| 2023/0019422 A1* | 1/2023 | Giusti | H10N 30/2047 |

FOREIGN PATENT DOCUMENTS

| | | |
|---|---|---|
| CN | 215834253 U | 2/2022 |
| JP | 2001357640 A | 12/2001 |

\* cited by examiner

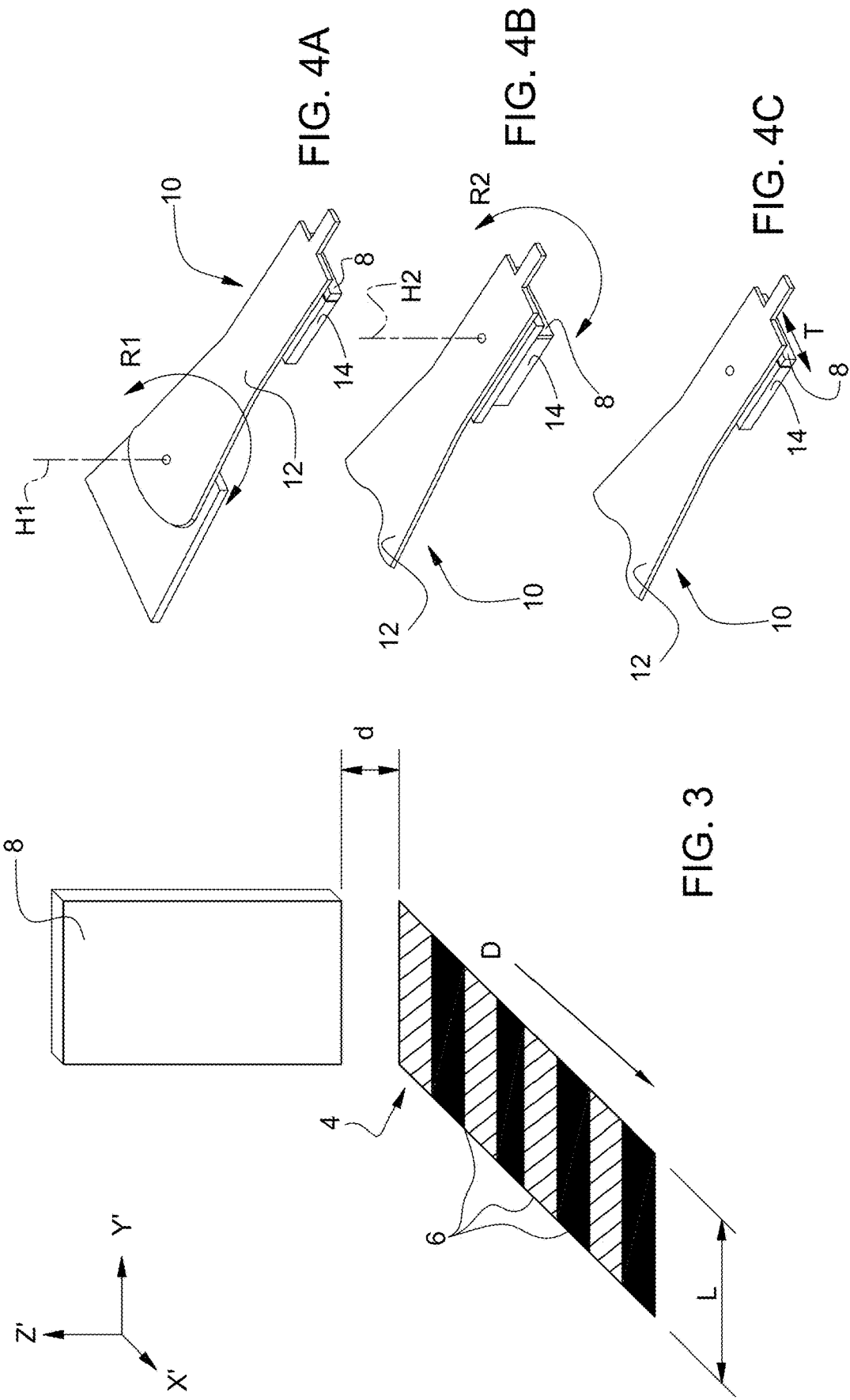

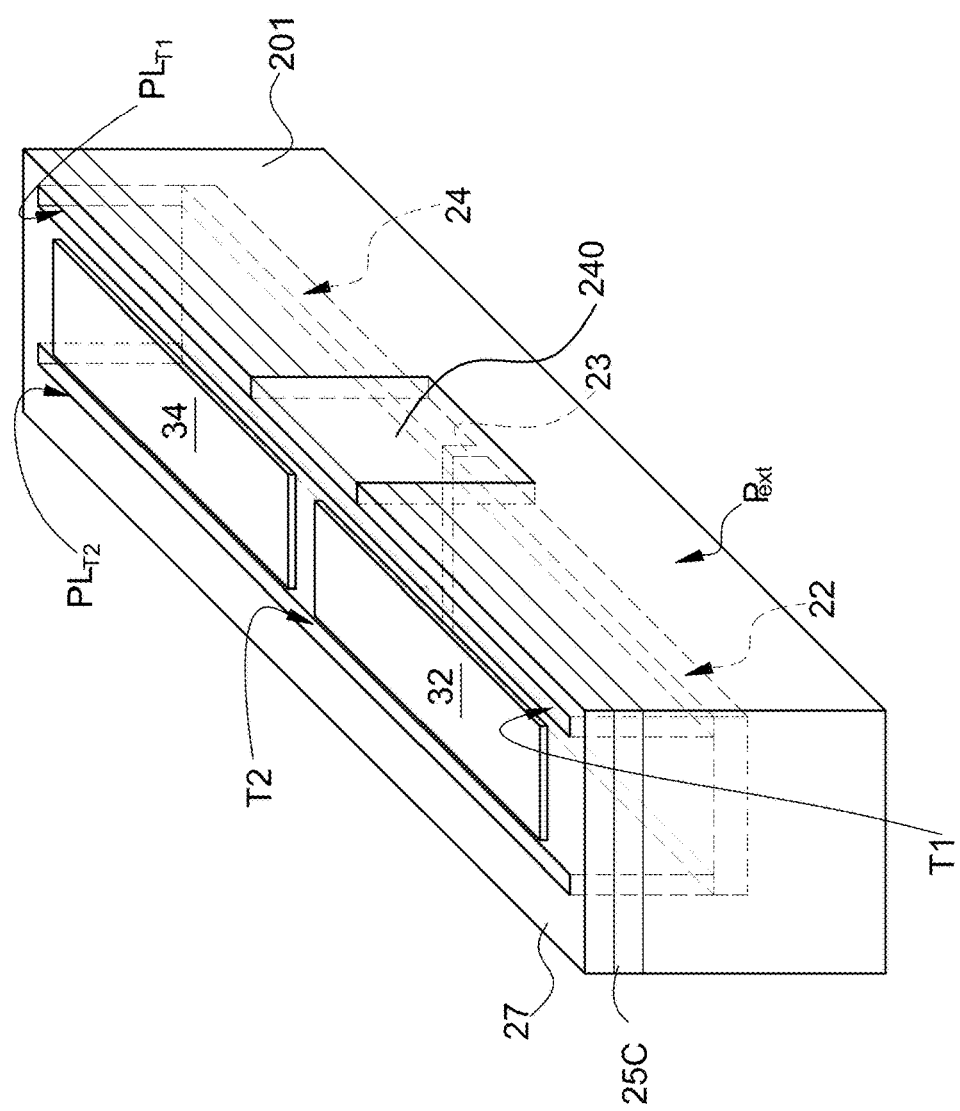
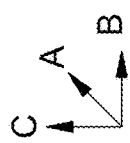
FIG. 8

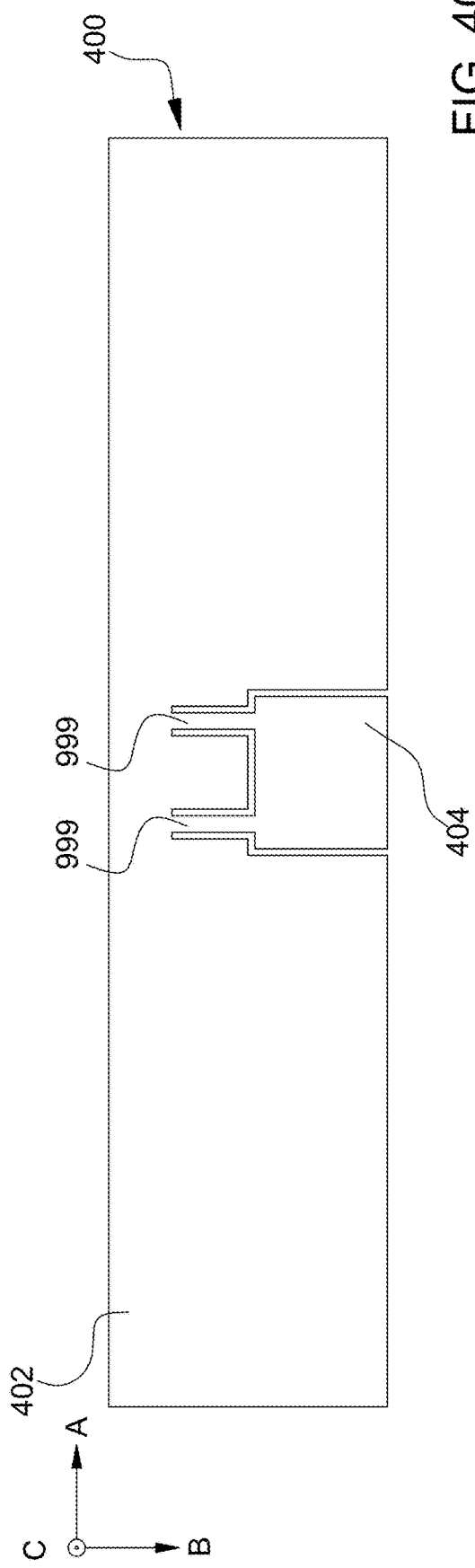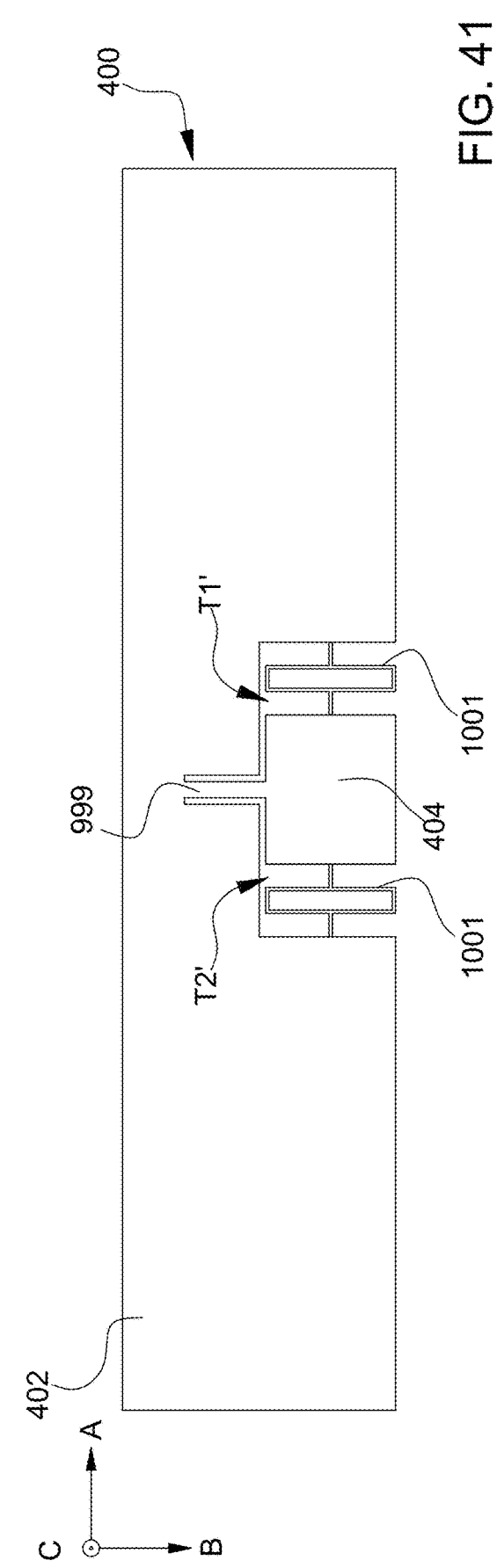

READ/WRITE DEVICE FOR A HARD-DISK MEMORY SYSTEM, AND CORRESPONDING MANUFACTURING PROCESS

BACKGROUND

Technical Field

The present disclosure relates to a read/write device for a hard-disk memory system; furthermore, the present disclosure refers to the corresponding manufacturing process.

Description of the Related Art

As is known, numerous memory systems of the so-called hard-disk type are available today, each of which includes a respective disk, which functions as memory medium and in which the data can be read and written and a respective read/write system.

FIG. 1 shows a memory system 1 that includes a disk 2 of magnetic material, in which data tracks are present (one of which is represented and designated by 4). As illustrated in FIGS. 2 and 3, each track 4 comprises a plurality of magnetic portions 6; furthermore, the state (orientation) of magnetization of each magnetic portion 6, and more precisely of a corresponding number of Weiss domains, can be associated with a corresponding logic value, and therefore with the value of a corresponding bit.

Reading/writing of the magnetic portions 6 of the tracks 4 is carried out by a read/write head 8, the position of which with respect to the disk 2 is varied via an actuation system 10, which typically includes an arm 12 (FIG. 1) and a slider 14 (FIG. 2).

In particular, assuming an orthogonal reference system XYZ fixed with respect to the memory system 1, the arm 12 can turn, under the action of a corresponding electric motor (not shown), about a first axis H1 parallel to the axis Z, which is laterally staggered with respect to the disk 2 and traverses a first end of the arm 12. The slider 14 (not shown in FIG. 1) is constrained to a second end of the arm 12 so as to be able to turn, under the action of a corresponding electric actuator (not shown), about a second axis H2, which is parallel to the axis Z and traverses the second end of the arm 12.

As illustrated in FIG. 2, the read/write head 8 is fixed to the slider 14 and overlies the disk 2, at a distance therefrom. As illustrated in FIG. 3, where it may be observed that the disk 2 has a cylindrical shape, and if we refer to the surface $S_{data}$ to denote the base of the cylindrical shape facing the read/write head 8, the read/write head 8 is spaced from the surface $S_{data}$ by a distance d that is typically 1 nm. The gap between the read/write head 8 and the surface $S_{data}$ is occupied by air.

In use, the disk 2 is kept in rotation about a third axis H3 by a corresponding electric motor (not shown); the third axis H3 is parallel to the axis Z and coincides with the axis of the disk 2. Furthermore, the actuation system 10 moves the read/write head 8, to a first approximation in a way parallel to the surface $S_{data}$, i.e., parallel to the plane XY.

In particular, the actuation system 10 moves the read/write head 8 so as to arrange it each time over a desired track 4. Furthermore, given a generic position in which the read/write head 8 is arranged above a track 4, and considering the small sizes of the read/write head 8, the rotation of the underlying disk 2 causes, as may be seen in FIGS. 2 and 3, a part of track 4, arranged underneath the read/write head 8, to slide with respect to the latter approximately along a direction D, with a speed in the order of 130 km/h. Furthermore, as shown in FIG. 3, the magnetic portions 6 of the track 4 have a width L (measured in a direction perpendicular to the direction D) that is typically less than 50 nm. Once again with reference to FIGS. 2 and 3, an orthogonal reference system X'Y'Z' is represented therein, which is fixed to the slider 14 and is orientated so that the axis Z' is parallel to the axis Z, and moreover so that the aforementioned direction D of sliding of the track 4 with respect to the read/write head 8 is parallel to the axis X'.

Further examples of coupling between the arm 12, the slider 14, and the read/write head 8 are illustrated in FIGS. 4A and 4B, which highlight, respectively: the movement of rotation (designated by R1) of the arm 12 about the first axis H1; and the movement of rotation (designated by R2) of the slider 14 about the second axis H2.

As shown in FIG. 4C, solutions are known in which the actuation system 10 is such as to enable, in addition to the aforementioned rotations, a translation (designated by T in FIG. 4C) of the read/write head 8 with respect to the slider 14. In particular, with reference to FIGS. 2 and 3, id is desirable to translate the read/write head 8 with respect to the slider 14 in a direction parallel to the axis Y'. In this way, the positioning of the read/write head 8 with respect to the tracks 4 can be particularly precise, with consequent possibility of increasing the density of the tracks 4 of the disk 2, and therefore increasing the data-storage capacity.

An example of solution of the type shown in FIG. 4C is described in the paper by J. Liu, et al. Thermal actuator for accurate positioning read/write element in hard disk drive, Microsystem Technologies, Springer-Verlag (published online on Jun. 28, 2012); in this document, a thermal actuator is described, which enables translation of the read/write head with respect to the slider. Unfortunately, the degree of possible translation along the axis Y' that can be obtained using the aforementioned thermal actuator is somewhat limited (less than 10 nm).

BRIEF SUMMARY

The present disclosure provides an actuator device that will enable translation of the read/write head with respect to the slider and that will overcome at least in part the drawbacks of the prior art.

According to the present disclosure, a read/write device and a corresponding manufacturing method are provided.

BRIEF DESCRIPTION OF THE SEVERAL VIEWS OF THE DRAWINGS

For a better understanding of the present disclosure, various embodiments thereof will now be described, purely by way of non-limiting example, with reference to the attached drawings, wherein:

FIG. 3 schematically shows an enlarged perspective view, with parts removed, of a portion of the memory system shown in FIG. 1;

FIGS. 4A-4C schematically show perspective views of actuation systems for hard-disk memory systems;

FIG. 8 schematically shows a perspective view, with portions removed, of a part of the actuator device shown in FIGS. 5, 6, 7 and 9;

FIGS. 40 and 41 schematically show top views of variants of the read/write device;

DETAILED DESCRIPTION

Figure 1:
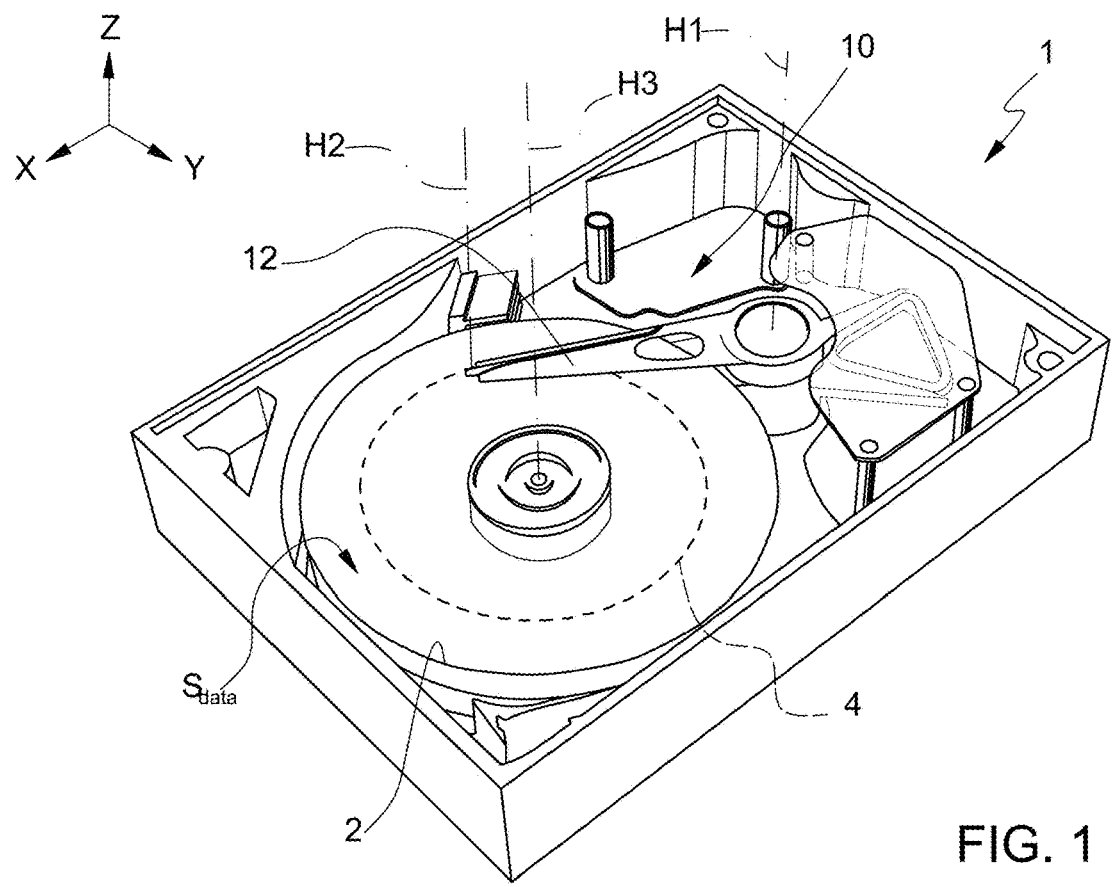
FIG. 1 schematically shows a perspective view of a hard-disk memory system.
Figure 2:
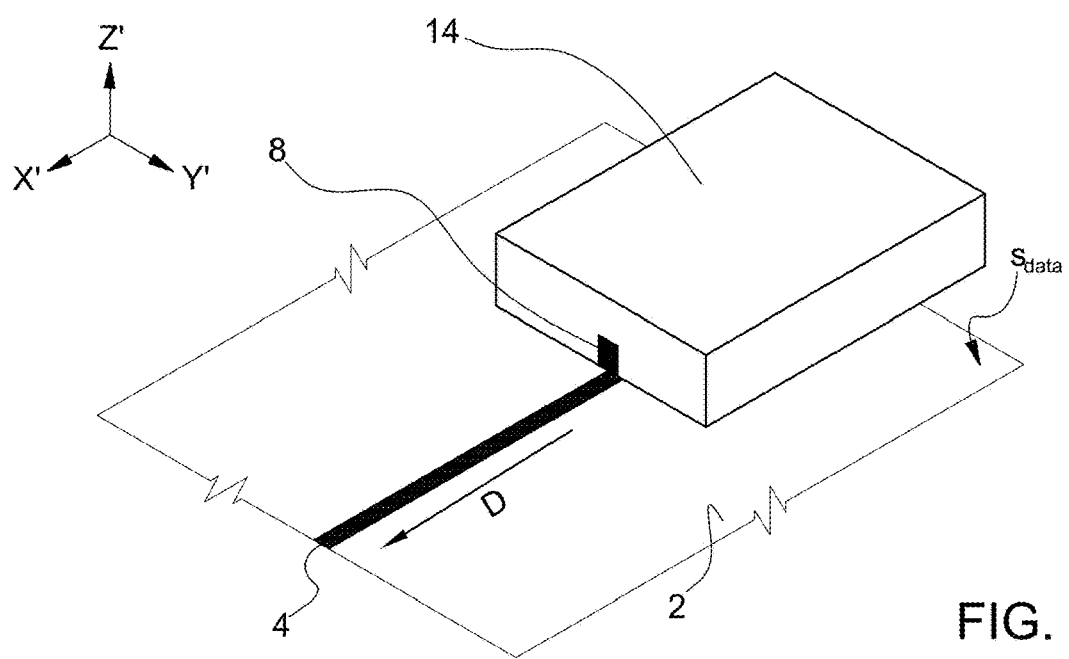
FIG. 2 schematically shows an enlarged perspective view of a portion of the memory system shown in FIG. 1.
Figure 5:
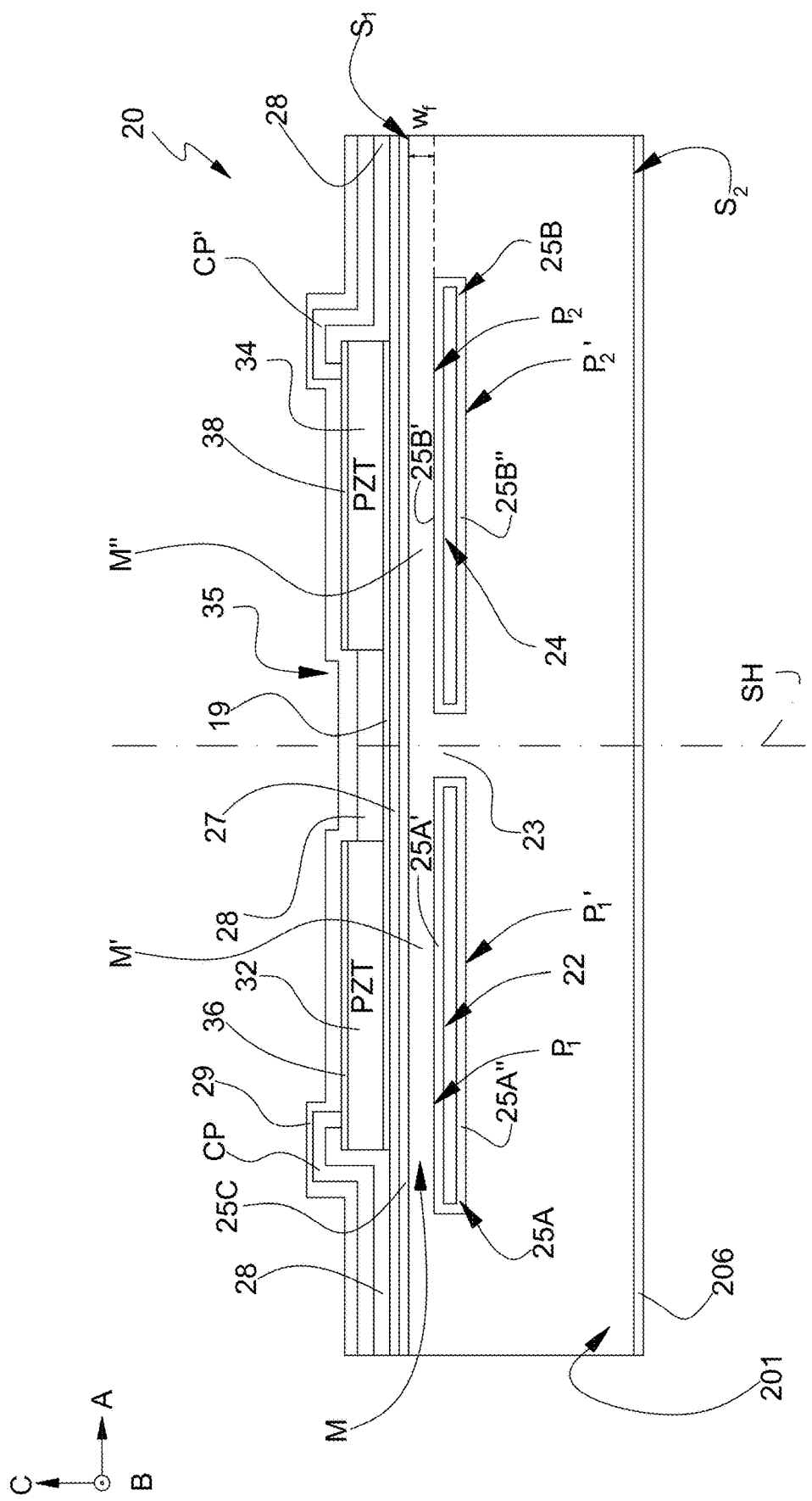
FIGS. 5, 6, and 9 schematically show cross-sectional views of an actuator device, taken along the lines of section V-V, VI-VI, and IX-IX, respectively, shown in FIG. 7.

FIG. 5 shows an actuator device 20 of a MEMS type, which comprises a semiconductor body 201, which is, for example, of silicon, has an approximately parallelepipedal shape and is delimited at the top and at the bottom by a first and a second surface $S_2$, $S_1$, respectively. Moreover, FIG. 5 shows an orthogonal reference system ABC such that the first and second surfaces $S_1$, $S_2$ are parallel to the plane AB.

The semiconductor body 201 has a thickness, for example, comprised between 50 μm and 500 μm. Moreover, present within the semiconductor body 201 are a first and a second cavity 22, 24, which have, for example, parallelepipedal shapes, that are approximately the same and with sides parallel or perpendicular to the plane AB.

In greater detail, the first and second cavities 22, 24 extend to a same depth. In particular, if we denote, respectively, by $P_1$ and $P_2$ the top walls of the first and second cavities 22, 24, respectively, these are parallel to the plane AB and spaced by a distance $w_f$ (for example, of approximately 3 μm) from the first surface $S_1$. Said distance $w_f$ represents the thickness of a front portion of the semiconductor body 201 that is interposed between the first surface $S_1$ and the first and second cavities 22, 24 and is referred to in what follows as the membrane region M. The membrane region M therefore comprises a first and a second membrane M', M" (which are shown in FIG. 5), formed by the portions of semiconductor body 201 that extend over the first and second cavities 22, 24, respectively.

In even greater detail, in top view (FIG. 7), the first and second cavities 22, 24 have elongated shapes along the axis A and are aligned along the axis A. Extending between the first and second cavities 22, 24 is a part of semiconductor body 201, referred to in what follows as the intermediate semiconductor region 23. Also the intermediate semiconductor region 23 is overlaid by the membrane region M.

A rear layer 206, of dielectric material is present underneath the semiconductor body 201.

Figure 6:
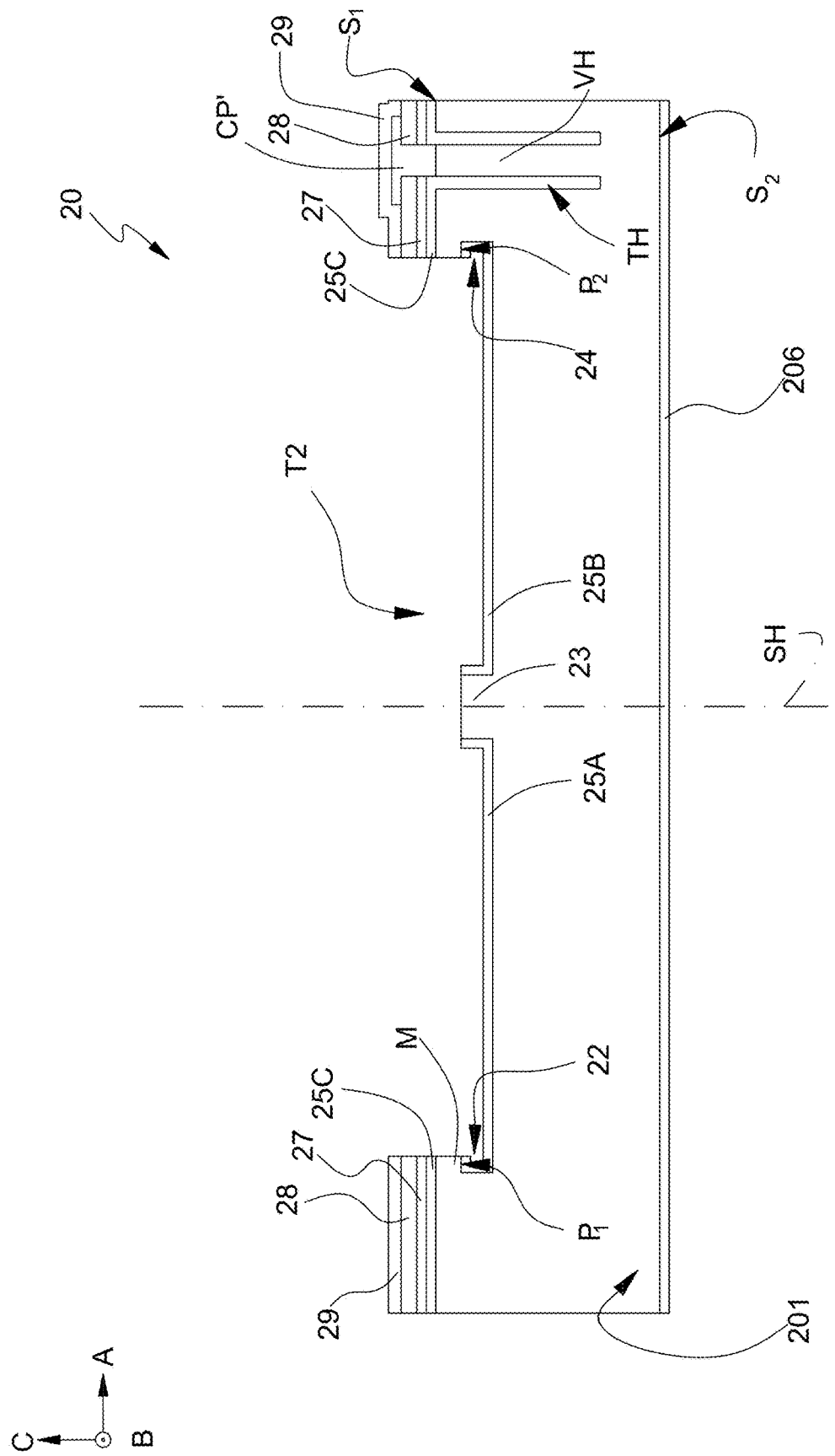

As may be seen in FIG. 6, moreover extending in the semiconductor body 201, starting from the first surface $S_1$, is a circular trench TH, which extends at a distance from the second surface $S_2$. In particular, the circular trench TH is laterally staggered with respect to the first and second cavities 22, 24; furthermore, the circular trench TH laterally delimits a cylindrical portion VH of semiconductor body 201. The circular trench TH may have a depth that is approximately 80% of the distance between the first and second surfaces $S_1$, $S_2$.

The actuator device 20 also comprises a first and a second inner coating region 25A, 25B, which are of thermal oxide and coat, respectively, the walls of the first cavity 22 and the walls of the second cavity 24. Furthermore, the actuator device 20 comprises a first outer coating region 25C, which is of thermal oxide and extends on the first surface $S_1$, as well as within the circular trench TH. The first and second inner coating regions 25A, 25B and the first outer coating region 25C have a thickness, for example, comprised between 0.2 μm and 3 μm.

If we denote by $P_1'$ and $P_2'$ the bottom walls of the first and second cavities 22, 24, respectively, the parts of the first inner coating region 25A that coat the top wall $P_1$ and the bottom wall $P_1'$, respectively, of the first cavity 22 will be referred to in what follows as first and second parts 25A', 25A" (FIG. 5) of the first inner coating region 25A. Likewise, the parts of the second inner coating region 25B that coat the top wall $P_2$ and the bottom wall $P_2'$, respectively, of the second cavity 24 will be referred to in what follows as first and second parts 25B', 25B" (FIG. 5) of the second inner coating region 25B.

The actuator device 20 further comprises a second outer coating region 27, which is of TEOS oxide and extends on the first outer coating region 25C. The second outer coating region 27 has a thickness, for example, comprised between 0.1 µm and 1 µm.

The first and second outer coating regions 25C, 27 overlie, among other things, the membrane region M.

The actuator device 20 further comprises an actuation system 35, which includes a conductive region 19 (for example, of a metal, such as platinum), which extends over portions of the first and second outer coating regions 25C, 27 that overlie the membrane region M. In addition, the conductive region 19 partially overlies, at a distance, both the first and the second cavities 22, 24, as well as the intermediate semiconductor region 23.

The actuation system 35 further comprises a first and a second piezoelectric region 32, 34, which are of piezoelectric material (for example, PZT) and have, to a first approximation, a planar shape, arranged parallel to the plane AB.

In greater detail, the first and second piezoelectric regions 32, 34 are approximately the same, have a rectangular shape, elongated along the axis A, and are arranged on the conductive region 19, in direct contact therewith.

In even greater detail, the first and second piezoelectric regions 32, 34 are arranged symmetrically with respect to a plane of symmetry SH, which is parallel to the plane BC. Also the first and second cavities 22, 24 are arranged symmetrically with respect to the plane of symmetry SH. Moreover, the first and second piezoelectric regions 32, 34 overlie at a distance the first and second cavities 22, 24, respectively.

In practice, the conductive region 19 functions as bottom electrode region, which is shared by the first and second piezoelectric regions 32, 34.

The actuation system 35 further comprises a first and a second top electrode region 36, 38, which are of a metal material (for example, platinum, or TiW or Ru) or iridium oxide, are the same as one another and overlie, in direct contact, the first and second piezoelectric regions 32, 34, respectively.

The actuator device 20 further comprises a third outer coating region 28, which is of dielectric material (for example, an oxide used in chemical vapor deposition, such as TEOS or USG) and is arranged on the parts of the second outer coating region 27 that are left exposed by the conductive region 19, as well as on the part of conductive region 19 left exposed by the first and second piezoelectric regions 32, 34.

The actuator device 20 further comprises conductive paths CP and a fourth outer coating region 29.

The conductive paths CP are interposed between the third and fourth outer coating regions 28, 29 and contact, the first or the second top electrode region 36, 38, alternatively. In particular, visible in FIGS. 5 and 6 is a path CP' (not shown in FIG. 7), which contacts part of the second top electrode region 38 and moreover extends in part through the first, second, and third outer coating regions 25C, 27, 28 so as to contact the cylindrical portion VH of the semiconductor body 201, which will function as TSV.

The fourth outer coating region 29 is of dielectric material (for example, silicon nitride) and extends over the exposed portions of the third outer coating region 28, as well as over the paths CP, CP' and over the exposed portions of the first and second top electrode regions 36, 38.

Figure 7:
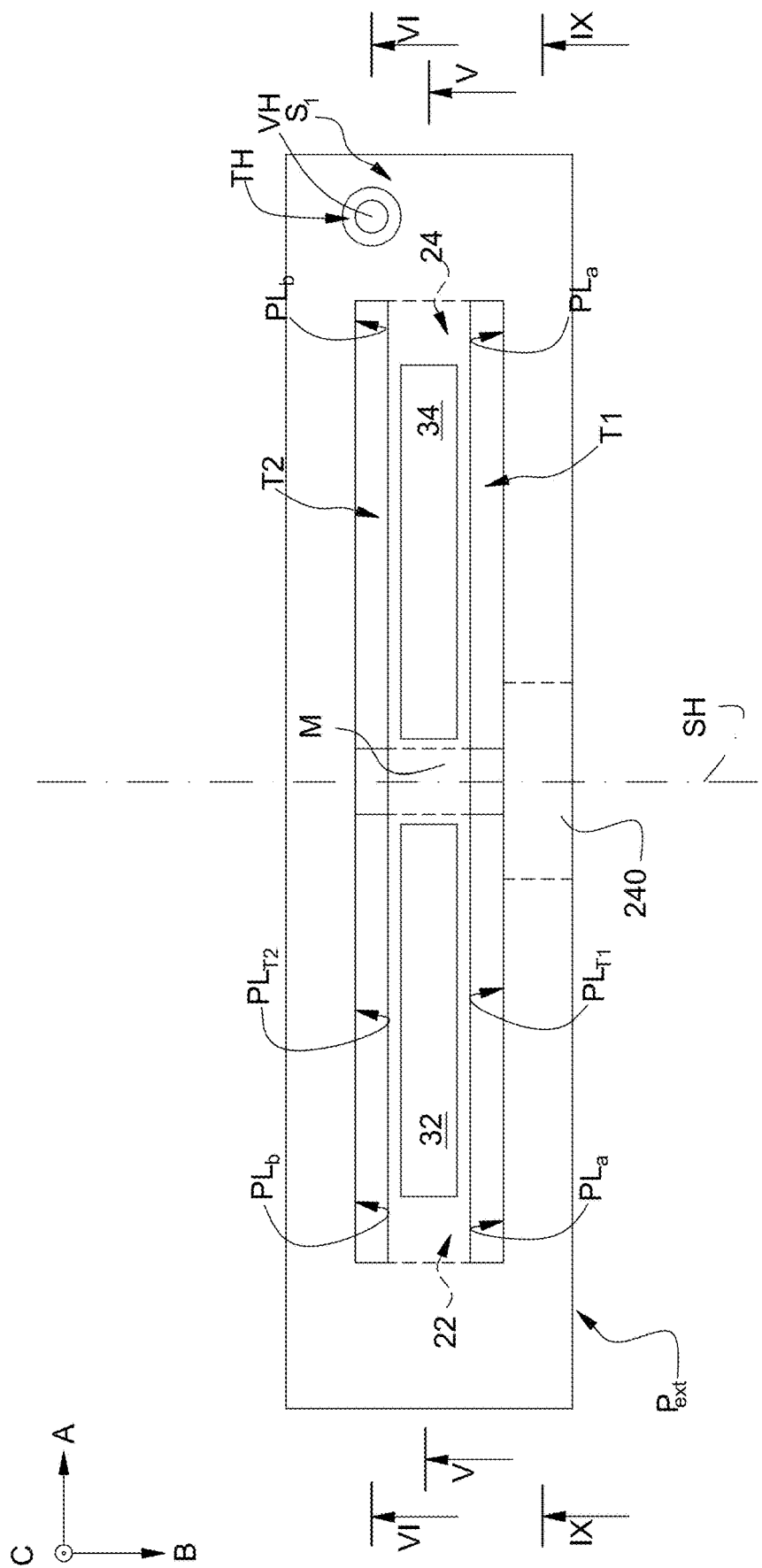
FIG. 7 schematically shows a top view, with portions removed, of the actuator device shown in FIGS. 5, 6 and 9.

As may be seen in FIGS. 7 and 8, also present in the actuator device 20 are a first and a second trench T1, T2. In this regard, for simplicity of representation, the conductive region 19, the conductive paths CP, the first and second top electrode regions 36, 38, the third and fourth outer coating regions 28, 29, the rear layer 206 and the circular trench TH are not shown in FIG. 8; moreover, for simplicity, in FIG. 8 it has been assumed that the first and second inner coating regions 25A, 25B have an infinitesimal thickness, and are therefore not illustrated.

The first and second trenches T1, T2 have the same shape, being (approximately) shaped like parallelepipeds that extend in a direction parallel to the axis A, symmetrically with respect to the first and second piezoelectric regions 32, 34. The first and second piezoelectric regions 32, 34 are therefore interposed between the first and second trenches T1, T2.

In greater detail, each of the first and second trenches T1, T2 overlies both the first and the second cavities 22, 24 and extends through the first, second, third and fourth outer coating regions 25C, 27, 28, 29, as well as through the membrane region M and the first parts 25A', 25B' of the first and second inner coating regions 25A, 25B. Consequently, each of the first and second trenches T1, T2 communicates or is fluidically coupled with the underlying first and second cavities 22, 24 and is open both at the top and at the bottom.

In even greater detail, each one of the first and second trenches T1, T2 is delimited by a respective inner side wall, parallel to the plane AC and facing the first and second piezoelectric regions 32, 34, and by a respective outer side wall, parallel to the plane AC and facing outwards; in particular, the outer side walls of the first and second trenches T1, T2 are denoted, respectively, by $PL_{T1}$ and $PL_{T2}$ in FIGS. 7 and 8. Likewise, each of the first and second cavities 22, 24 is delimited by a respective first side wall $PL_a$, parallel to the plane AC and arranged, in top view, on a side of the assembly formed by the first and second piezoelectric regions 32, 34, and by a respective second side wall $PL_b$, parallel to the plane AC and arranged, in top view, on another side of the ensemble formed by the first and second piezoelectric regions 32, 34. This having been said, as may be seen in FIG. 7, and without this implying any loss of generality, the outer side wall $PL_{T1}$ of the first trench T1 is approximately coplanar with the first side walls $PL_a$ of the first and second cavities 22, 24; furthermore, the outer side wall $PL_{T2}$ of the second trench T2 is approximately coplanar with the second side walls $PL_b$ of the first and second cavities 22, 24.

Figure 9:
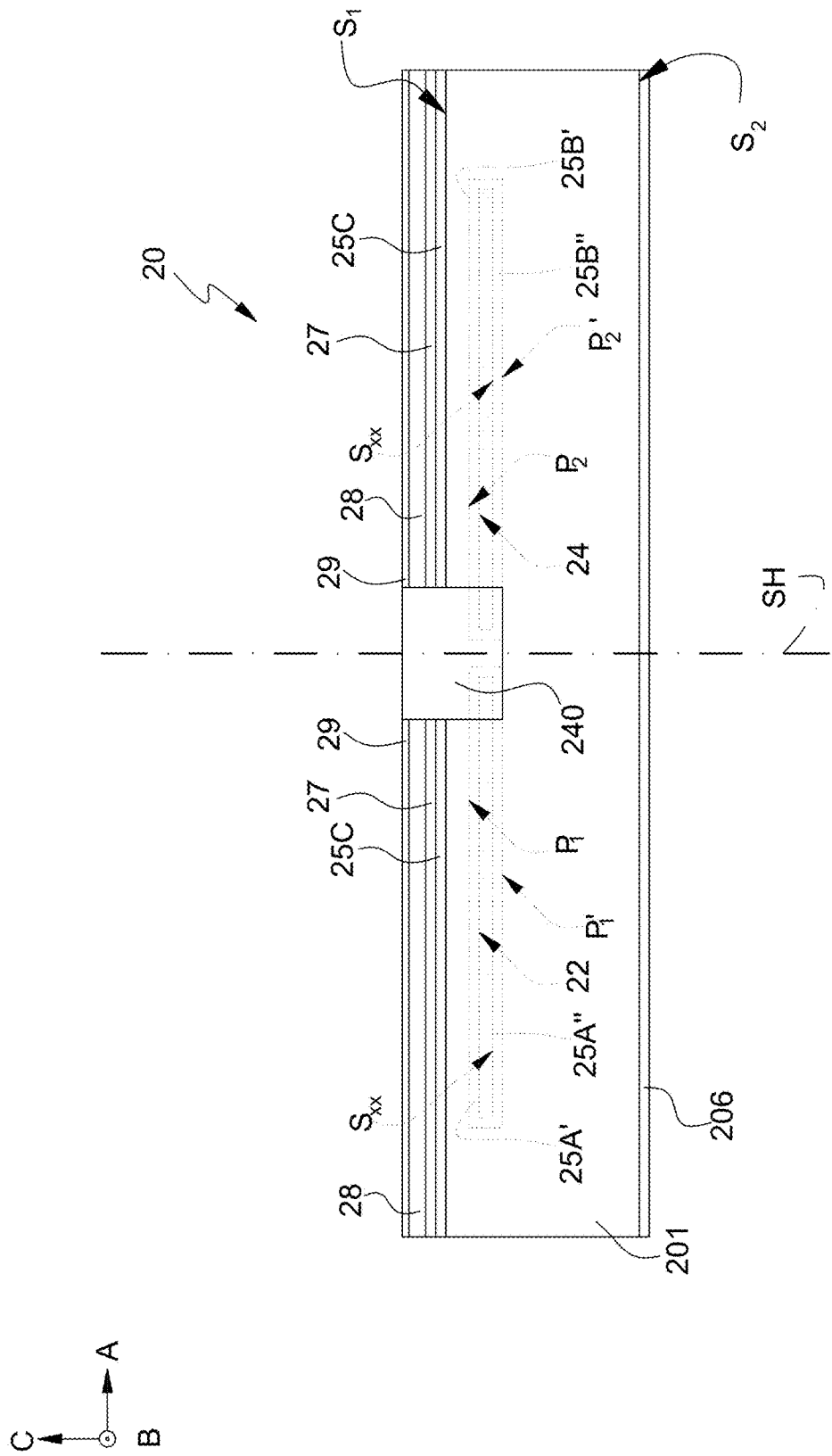

As may be seen in FIGS. 7-9, the actuator device 20 further comprises a deformable region 240, of a silicone polymer.

In detail, the deformable region 240 has approximately the shape of a parallelepiped and extends adjacent to the outer side wall $PL_{T1}$ of the first trench T1. In particular, part of the outer side wall $PL_{T1}$ of the first trench T1 is formed by the deformable region 240.

In greater detail, if we denote by $P_{ext}$ a side surface that delimits the semiconductor body 201, is parallel to the plane AC, and is such that the first trench T1 is interposed between the side surface $P_{ext}$ and the first and second piezoelectric regions 32, 34, the deformable region 240 faces out over the side surface $P_{ext}$. In other words, the deformable region 240 is interposed between the side surface $P_{ext}$ that laterally delimits the semiconductor body 201 and the outer side wall $PL_{T1}$ of the first trench T1. The deformable region 240 is therefore laterally staggered with respect to the first trench T1, and therefore is laterally staggered also with respect to the membrane region M.

As may be seen in FIG. 9 (where, to facilitate understanding, represented by a dotted line are the volumes of the first and second cavities 22, 24, in actual fact not visible in this section), the deformable region 240 extends vertically through the first, second, third and fourth outer coating regions 25C, 27, 28, 29, as well as through a part of the semiconductor body 201.

In greater detail, the deformable region 240 has a symmetrical shape with respect to the plane of symmetry SH. In addition, the deformable region 240 has a height such that it penetrates into the semiconductor body 201 up to a depth at least equal to the depth of extension of the surfaces (denoted by $S_{xx}$) that delimit at the top the second parts 25A", 25B" of the first and second inner coating regions 25A, 25B (which are also represented in FIG. 9, even though in actual fact they are not visible in this view, with the sole purpose of facilitating understanding). Without this implying any loss of generality, in FIGS. 8 and 9 the deformable region 240 penetrates into the semiconductor body 201 up to a depth equal to the depth of extension of the bottom walls $P_1'$ and $P_2'$ of the first and second cavities 22, 24. Furthermore, in a direction parallel to the axis C, the portion of deformable region 240 that extends through the semiconductor body 201 has a height, for example, of approximately 5 μm.

All this having been said, the actuator device 20 is formed, together with a plurality of other actuator devices that are identical to it (not shown), starting from a first wafer 200 (FIG. 10) and following the manufacturing process that is described hereinafter described with reference to just the actuator device 20, except where otherwise specified.

Figure 10:
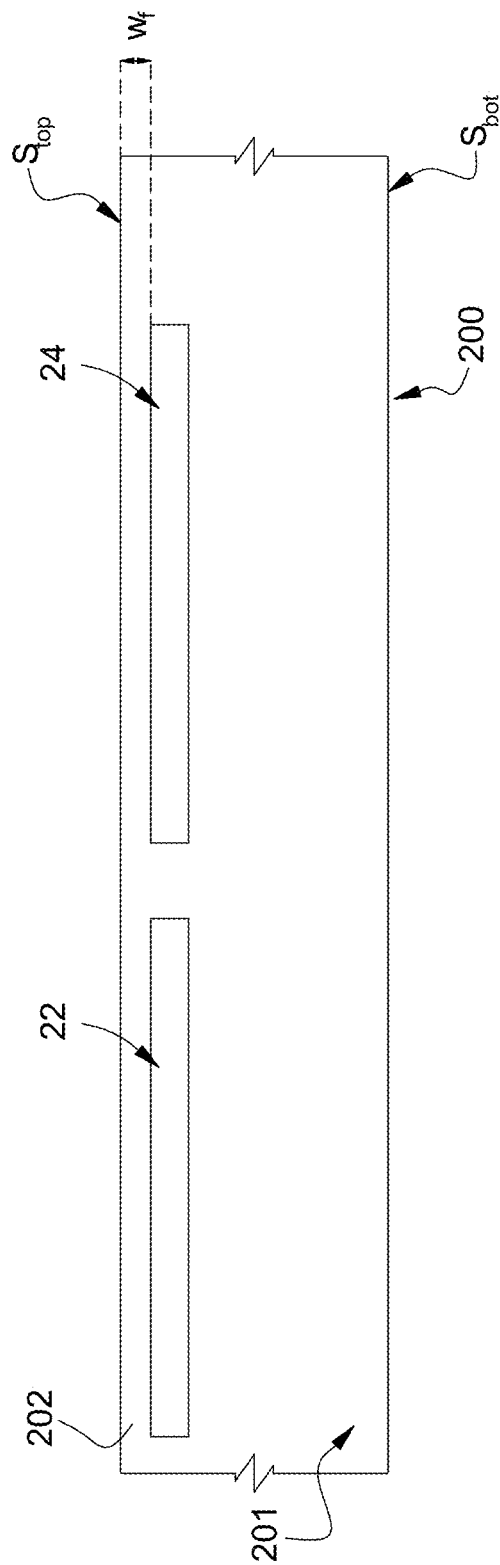
FIGS. 10-15 schematically show cross-sectional views of a semiconductor wafer, during successive steps of a manufacturing process (FIGS. 11-14 refer to a same first plane of section, whereas FIGS. 10 and 15 refer to a different second plane of section)

As illustrated in FIG. 10, initially provided is the first wafer 200, which includes the semiconductor body 201, is delimited at the top and at the bottom by a top surface $S_{top}$ and a bottom surface $S_{bot}$, respectively, which are designed to form the first and second surfaces $S_1$, $S_2$, respectively.

In addition, present within the semiconductor body 201 are the first and second cavities 22, 24, which are of a buried type, may be formed in a per se known manner and are overlaid by a front semiconductor region 202, which has the aforementioned thickness $w_f$ and is designed to form the membrane region M.

For instance, formation of the first and second cavities 22, 24 may be obtained as taught in the European patent EP 1577656. In this case, albeit not illustrated, for each one of the first and second cavities 22, 24, deep trenches are initially formed, separated by columns of semiconductor material; next, an epitaxial growth is carried out in a deoxidizing environment so as to grow, over the columns of semiconductor material, an epitaxial layer that closes the trenches at the top, trapping the gas present therein. Then, a thermal annealing treatment is carried out that causes a migration of the atoms of semiconductor material and formation of a buried cavity that is empty (except for possible residual gases), which delimits on the bottom, a corresponding suspended region, i.e., a corresponding membrane, forming part of the front semiconductor region 202.

Figure 11:
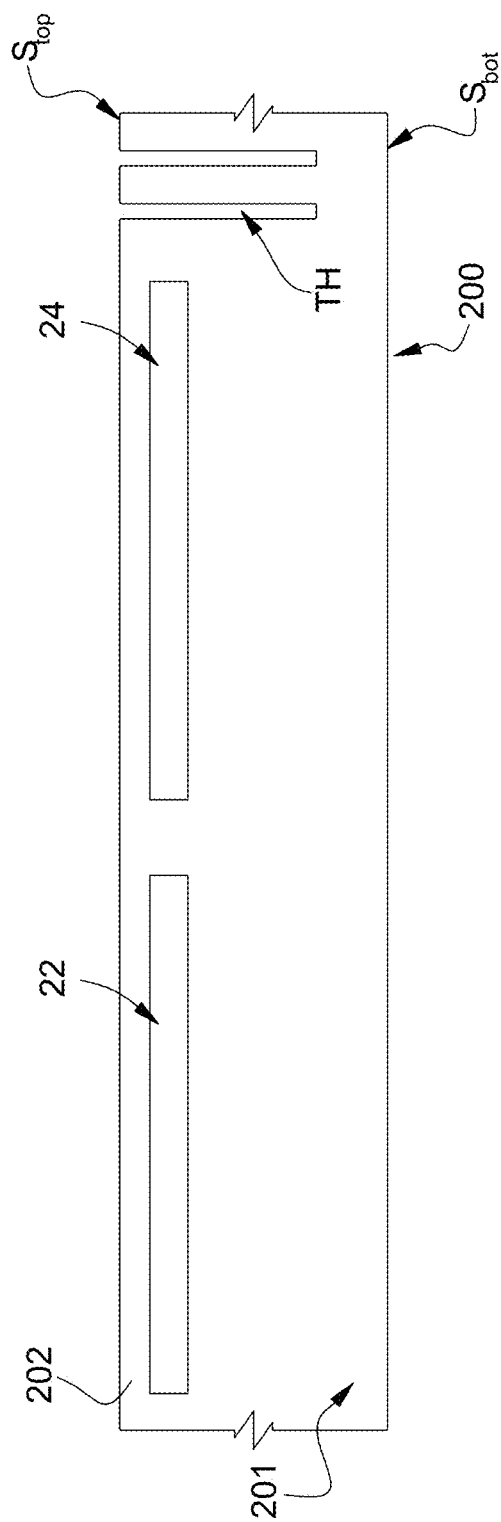

Next, as shown in FIG. 11, a chemical etch of a dry type is carried out in order to selectively remove portions of semiconductor body 201 and form the circular trench TH, which extends from the top surface $S_{top}$.

Figure 12:
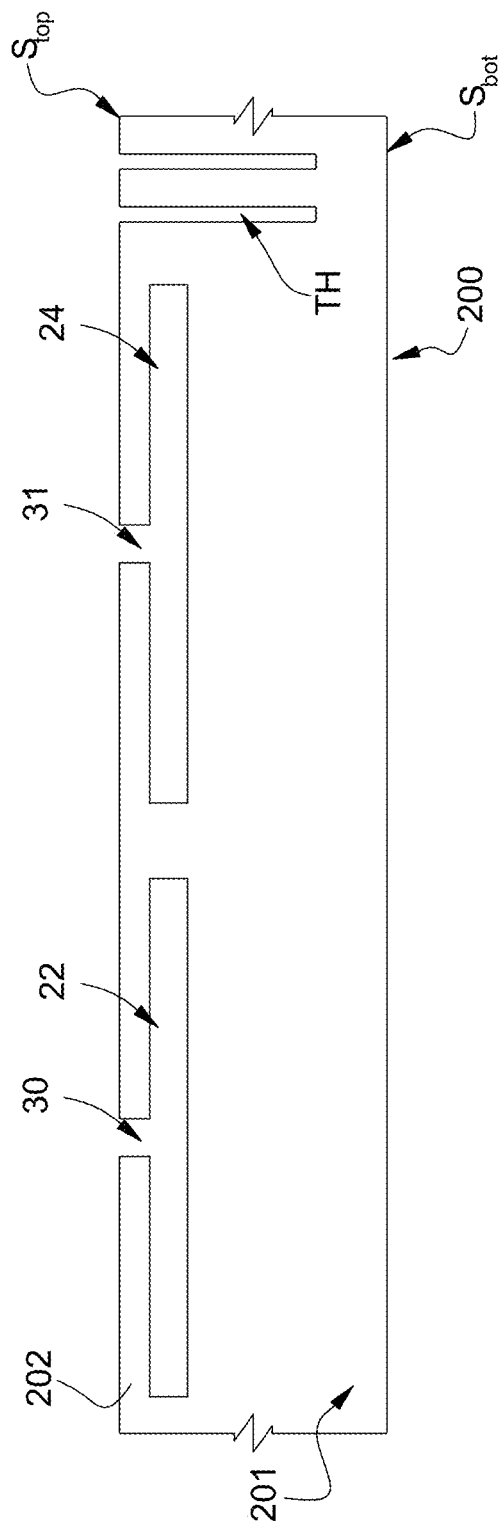

Next, as shown in FIG. 12, a further etch is carried out in order to form a first and a second hole 30, 31, which extend between the top surface $S_{top}$ and the first and second cavities 22, 24, respectively, and have a cylindrical shape with a diameter that is, for example, approximately 2 μm.

Figure 13:
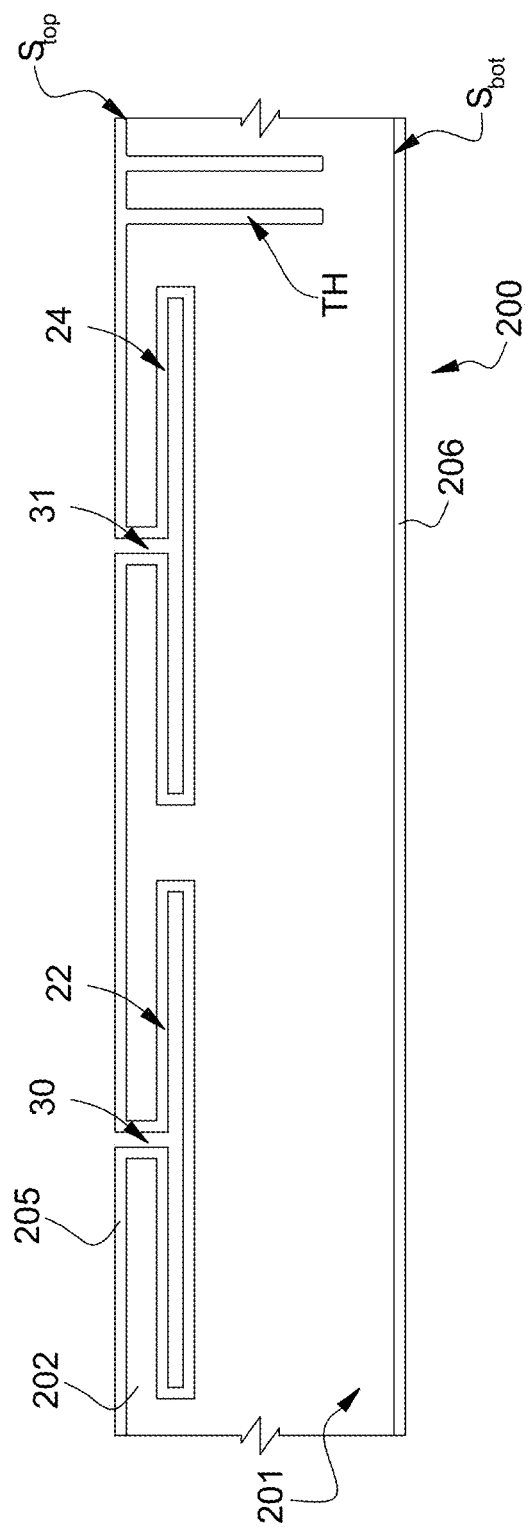

Then, as shown in FIG. 13, a process of thermal oxidation is carried out, which causes formation of a first dielectric layer 205, which has a thickness, for example, of approximately 1 μm and coats the walls of the first and second cavities 22, 24, without filling them. Moreover, the first dielectric layer 205 coats the side walls of the first and second holes 30, 31, without occluding them completely; in particular, the portions of first dielectric layer 205 that coat the side walls of the first and second holes 30, 31 laterally delimit, respectively, a first and a second opening A1, A2, which communicate with the first and second cavities 22, 24, respectively. In addition, the first dielectric layer 205 fills the circular trench TH completely and extends so as to coat the top surface $S_{top}$.

The first dielectric layer 205 is designed to form the first and second inner coating regions 25A, 25B and the first outer coating region 25C.

Once again with reference to FIG. 13, for simplicity of representation the reduction in thickness of the front semiconductor region 202 caused by the aforementioned thermal oxidation is neglected. Moreover, thermal oxidation also causes formation of the rear layer 206, arranged on the bottom surface $S_{bot}$ of the semiconductor body 201.

Figure 14:
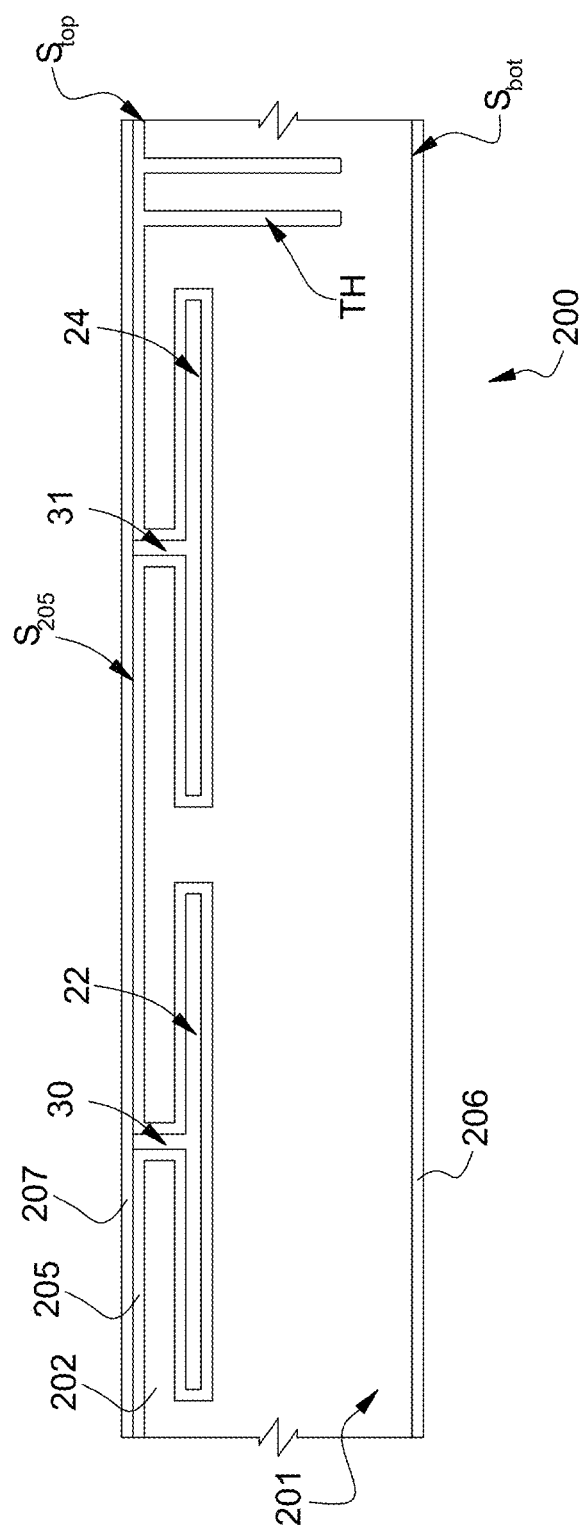

Next, as shown in FIG. 14, a deposition of TEOS oxide is carried out so as to form, on the first dielectric layer 205, a second dielectric layer 207. In particular, if we denote by $S_{205}$ the top surface of the first dielectric layer 205, the second dielectric layer 207 extends on the surface $S_{205}$. Moreover, the second dielectric layer 207 closes the first and second openings A1, A2 at the top without, to a first approximation, penetrating into them.

In greater detail, albeit not shown, formation of the second dielectric layer 207 may envisage deposition of an initial layer (not represented) of TEOS having a thickness, for example, of 1 μm, a subsequent process of densification, and a further subsequent process of chemical-mechanical polishing (CMP) to reduce the thickness of the initial layer down to 0.5 μm; the residual portion of initial layer forms, as a result, the second dielectric layer 207.

The second dielectric layer 207 is designed to form the second outer coating region 27.

Figure 15:
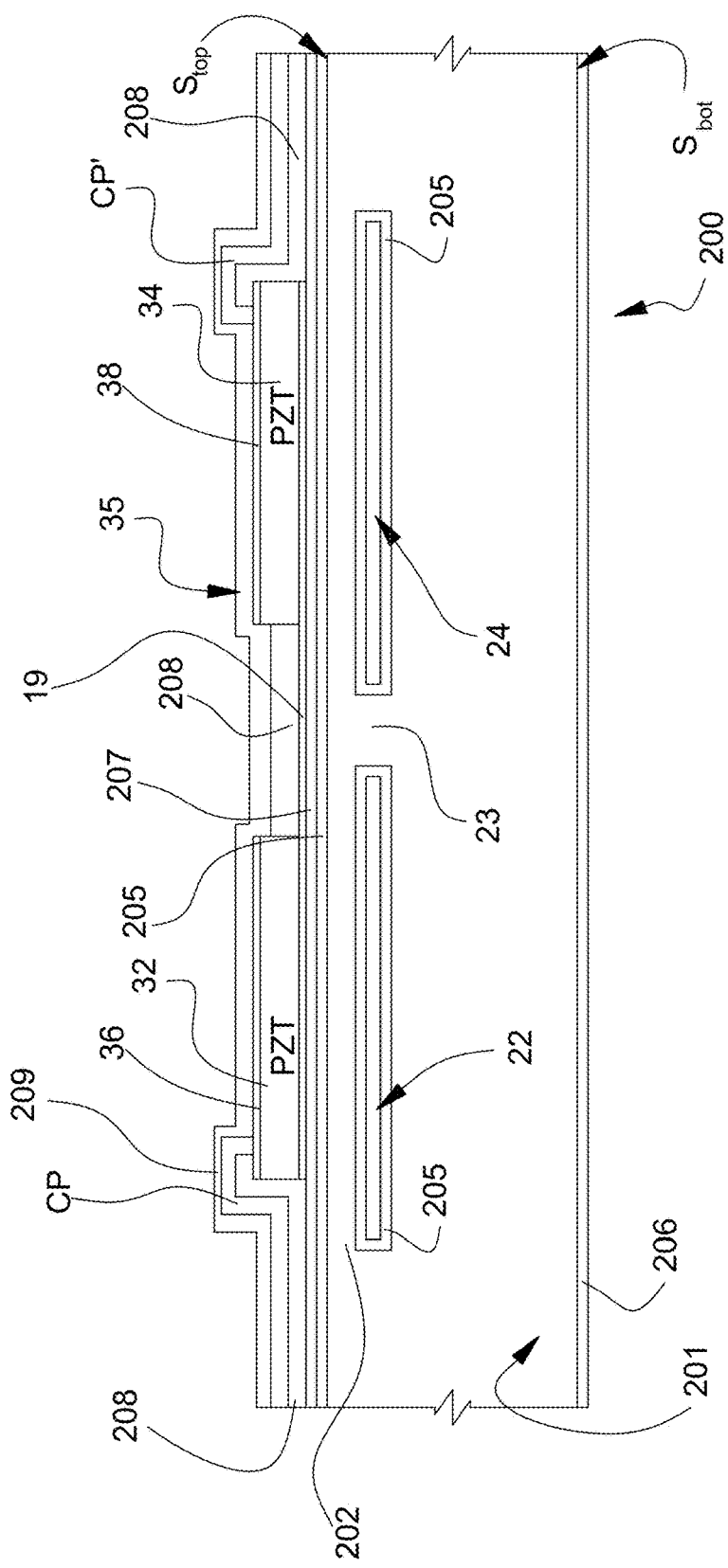
Figure 16:
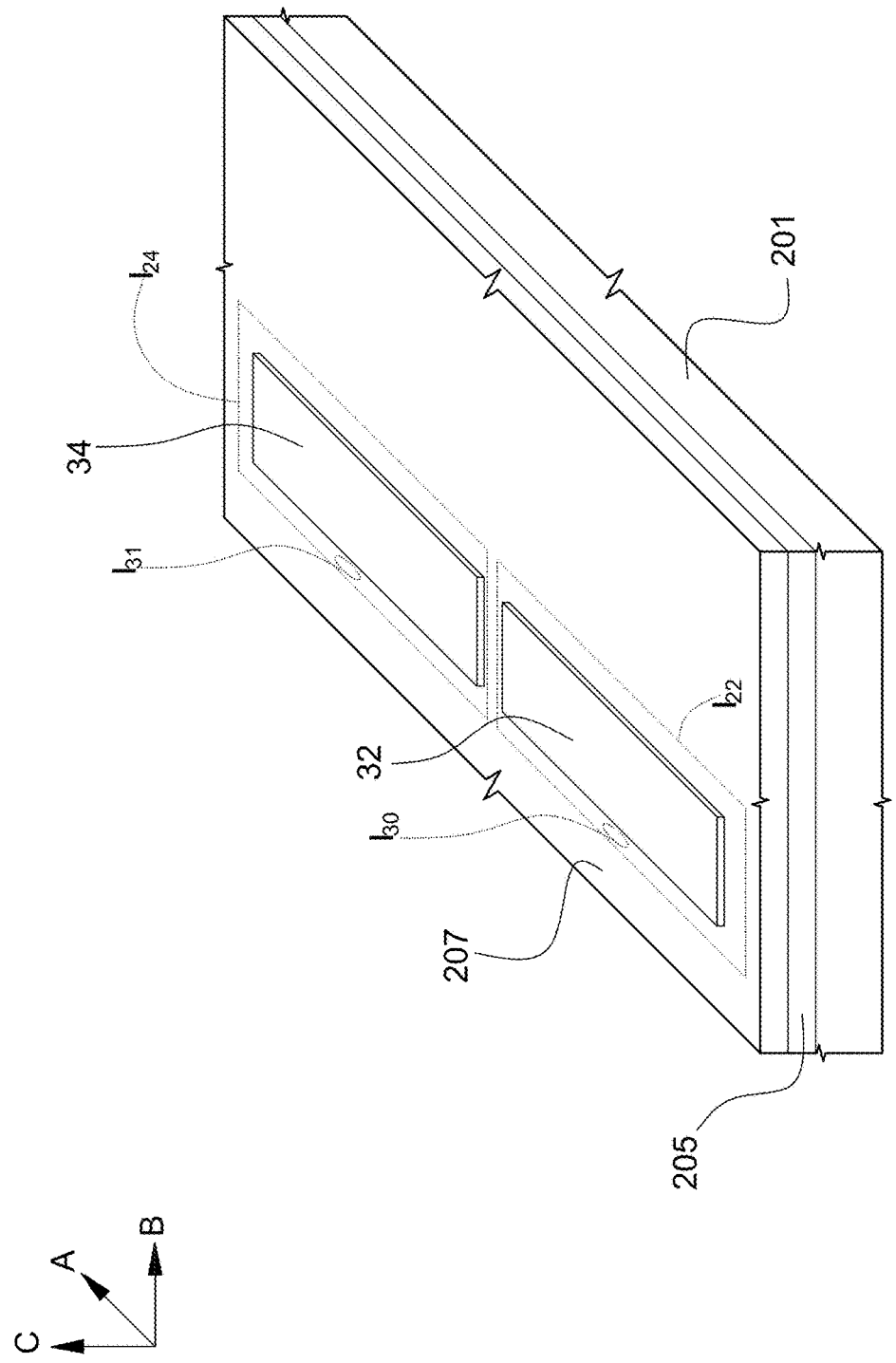
FIG. 16 schematically shows a perspective view, with portions removed, of the wafer shown in FIG. 15.

Next, as shown in FIGS. 15 and 16, in a per se known manner the actuation system 35 is formed over the second dielectric layer 207.

In particular, the conductive region 19 of platinum is formed, which overlies (at a distance) the first and second cavities 22, 24 and the intermediate semiconductor region 23, which is interposed between the first and second cavities 22, 24 and extends underneath the front semiconductor region 202. In addition, formed over the conductive region 19 are the first and second piezoelectric regions 32, 34 and the first and second top electrode regions 36, 38. Furthermore, a first and a second coating layer 208, 209 are formed, which are, for example, of USG and silicon nitride, respectively, and are designed to form the third and fourth outer coating regions 28, 29, respectively. Once again in a per se known manner, the conductive paths CP, CP' are formed between the first and second coating layers 208, 209.

Figure 18:
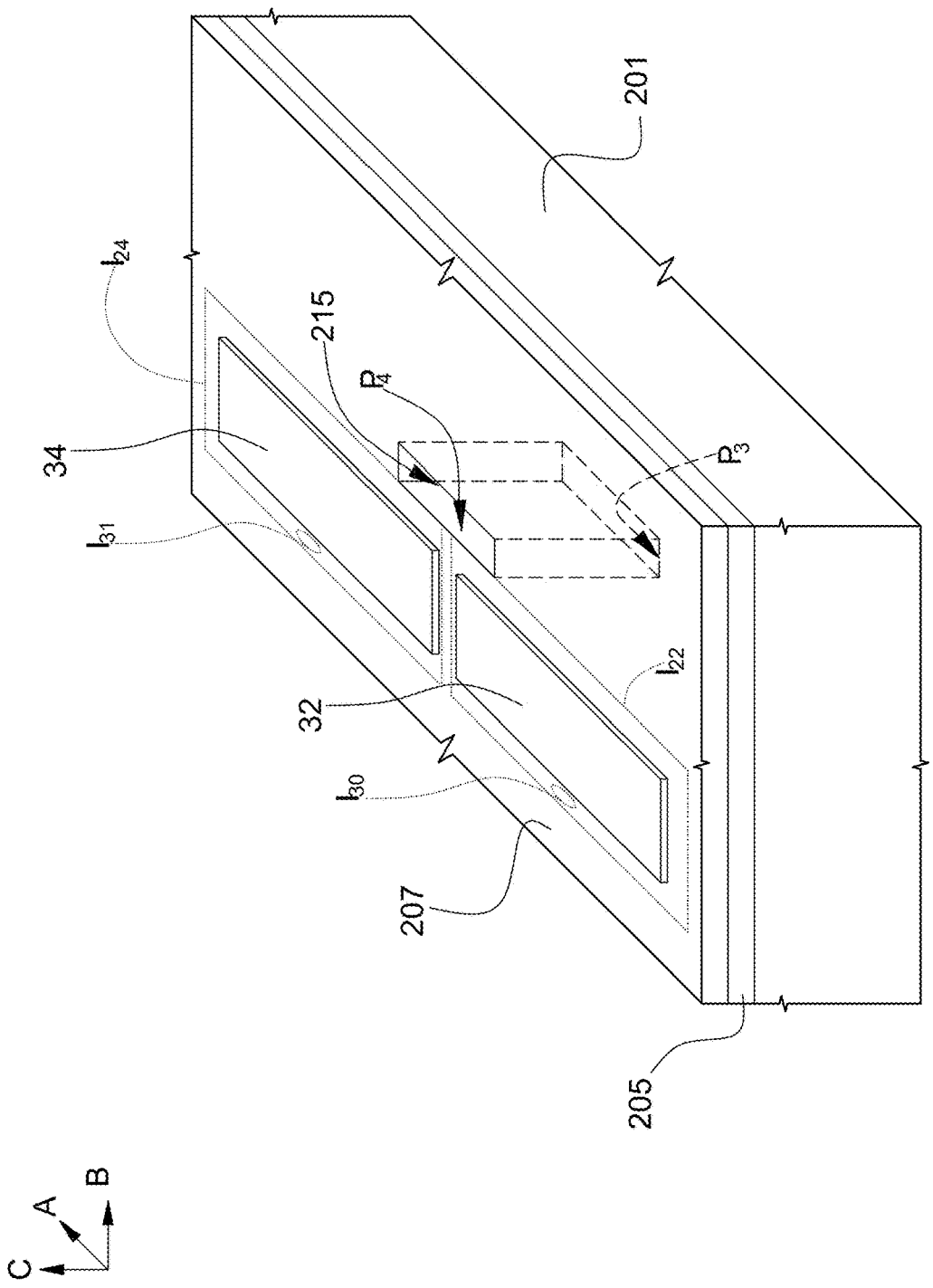
FIG. 18 schematically shows a perspective view, with portions removed, of the wafer shown in FIG. 17.

For simplicity of representation, FIG. 16 (as also the subsequent FIG. 18) shows just the semiconductor body 201, the first and second dielectric layers 205, 207, and the first and second piezoelectric regions 32, 34, as well as two imaginary lines 122, 124, which represent (approximately) the projections of the first and second cavities 22, 24, respectively, in a plane where it is assumed that the bases of the first and second piezoelectric regions 32, 34 lie; furthermore further contour lines 130, 131 are shown in FIG. 16, which represent the projections of the first and second holes 30, 31, respectively, in the aforementioned plane.

Figure 17:
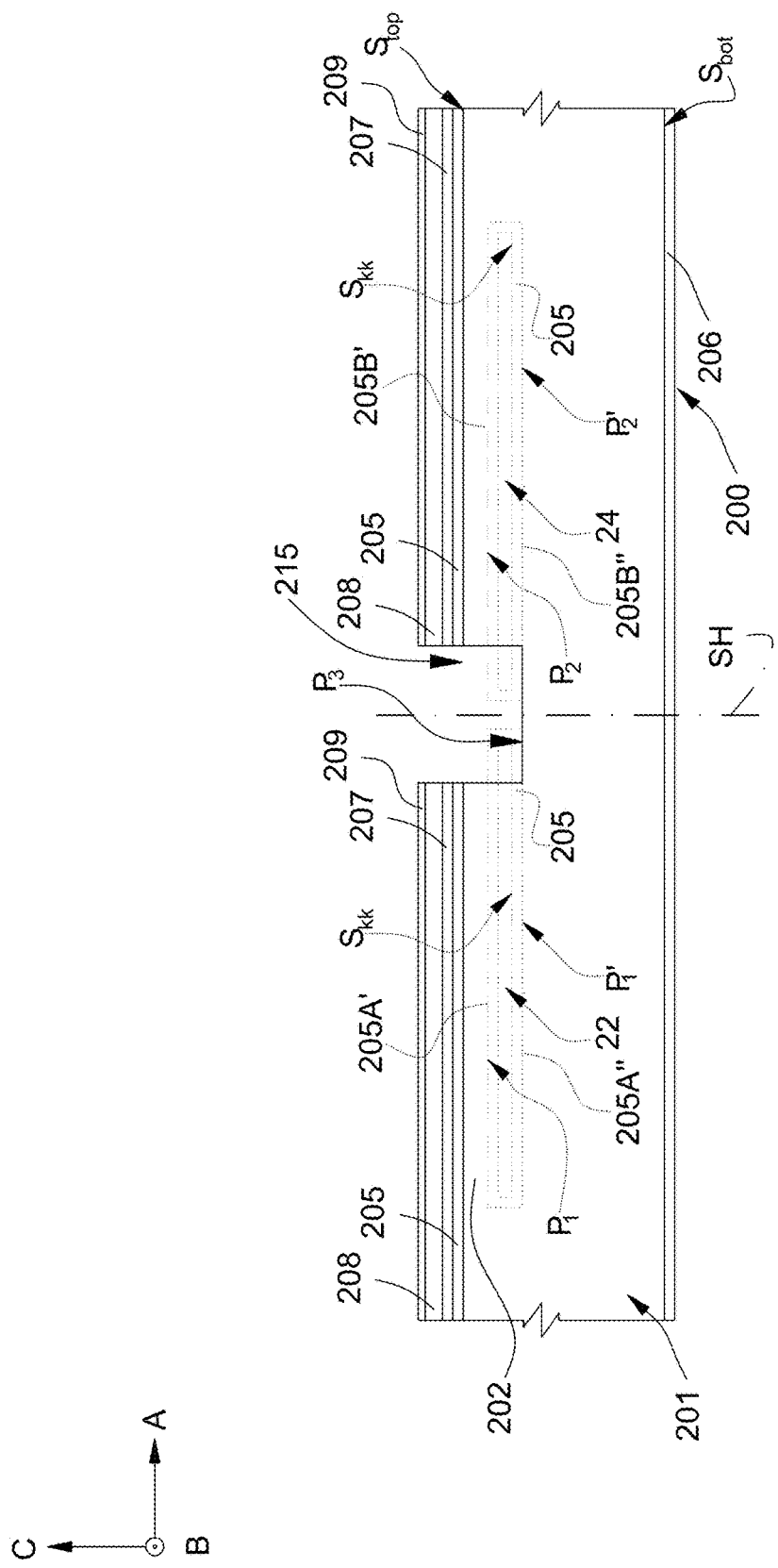
FIG. 17 schematically shows a cross-sectional view of the wafer shown in FIG. 15, after a subsequent step of the manufacturing process, and in a third plane of section, different from the first and the second planes of section.

Next, as shown in FIG. 17 (where to facilitate understanding the profiles of the first and second cavities 22, 24 are represented by a dotted line, which in themselves are not visible in this section) and 18 (to which the same simplifications as those of FIG. 16 apply), a succession of chemical etches, for example of a dry type, is carried out in order to form a recess 215. Once again with reference to FIG. 17, the profiles are represented therein by a dotted line (in actual fact, not visible) of parts (denoted, respectively, by 205A' and 205A") of the first dielectric layer 205 that coat the top wall $P_1$ and the bottom wall $P_1'$, respectively, of the first cavity 22 and are designed to form the first and second parts 25A', 25A", respectively, of the first inner coating region 25A. Furthermore, the profiles are represented by a dotted line (in actual fact, not visible) of parts (designated, respectively, by 205B' and 205B") of the first dielectric layer 205 that coat the top wall $P_2$ and the bottom wall $P_2'$, respectively, of the second cavity 22 and are designed to form the first and second parts 25B', 25B", respectively, of the second inner coating region 25B.

In practice, vertically aligned portions of the first and second dielectric layers 205, 207 and of the first and second coating layers 208, 209 are selectively removed, in addition to a part of the semiconductor body 201 adjacent to the front semiconductor region 202, so as to form the aforementioned recess 215, which extends underneath the top surface $S_{top}$ for a depth, for example, of approximately 5 µm and is designed to house the deformable region 240.

In detail, the recess 215 has approximately a parallelepipedal shape and extends through the first and second dielectric layers 205, 207 and the first and second coating layers 208, 209, as well as through part of the semiconductor body 201. In addition, the recess 215 is arranged symmetrically with respect to the plane of symmetry SH.

In greater detail, if we denote by $P_3$ the bottom wall of the recess 215, this extends to a depth at least equal to the depth of extension of the surfaces (which are denoted by $S_{kk}$ and are designed to form the aforementioned surfaces $S_{xx}$) that delimit the parts 205A" and 205B" of the first dielectric layer 205 at the top. Without this implying any loss of generality, in FIG. 17 the wall $P_3$ is coplanar with the bottom walls $P_1'$ and $P_2'$ of the first and second cavities 22, 24.

Figure 19:
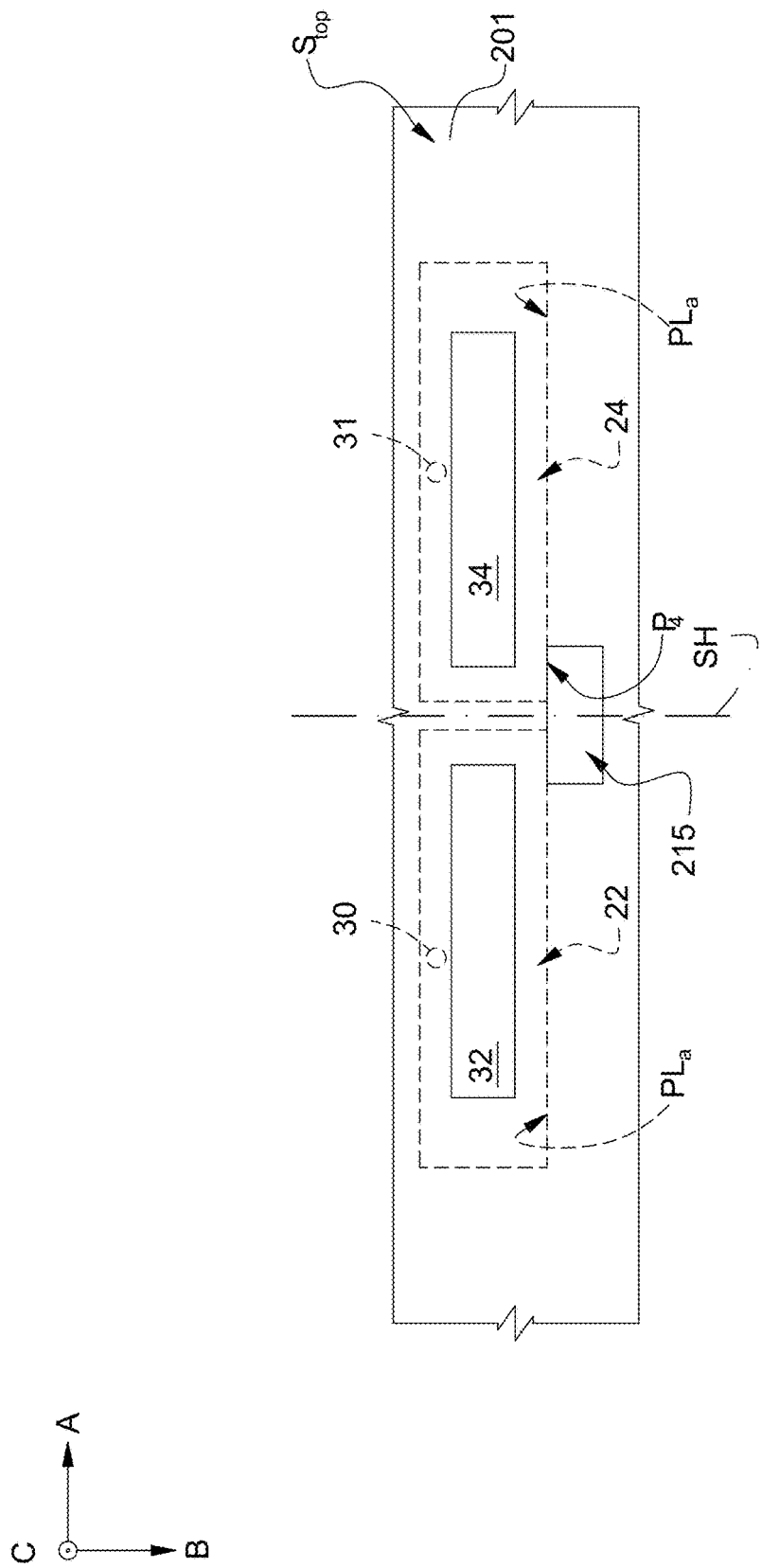
FIG. 19 schematically shows a top view, with portions removed, of the wafer shown in FIGS. 17 and 18.

As may be seen in FIG. 19 (where for simplicity of representation just the semiconductor body 201, the first and second piezoelectric regions 32, 34, the first and second cavities 22, 24, and the recess 215 are shown), the recess 215 is laterally staggered along the axis B with respect to the first and second piezoelectric regions 32, 34, in a first direction. Without this implying any loss of generality, also the first and second holes 30, 31 are laterally staggered along the axis B with respect to the first and second piezoelectric regions 32, 34, but in a direction opposite to the aforementioned first direction.

In even greater detail, if we denote by $P_4$ the side wall of the recess 215 arranged parallel to the plane AC and close to the first and second cavities 22, 24, to a first approximation, the wall $P_4$ is coplanar with the first side walls $PL_a$ of the first and second cavities 22, 24.

Figure 20:
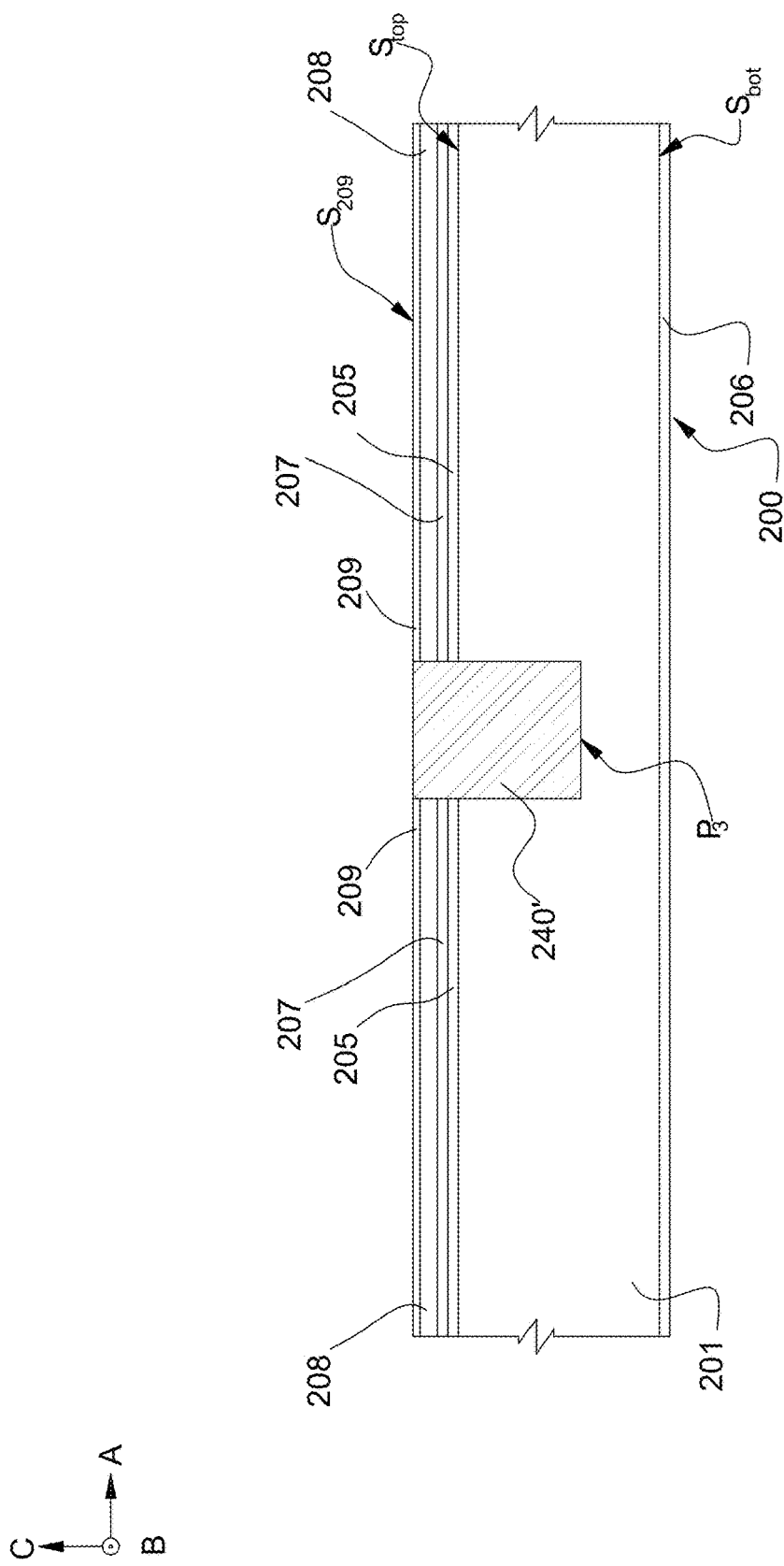
FIG. 20 schematically shows a cross-sectional view of the wafer shown in FIG. 17, after a subsequent step of the manufacturing process, the section being taken in the third plane of section.
Figure 21:
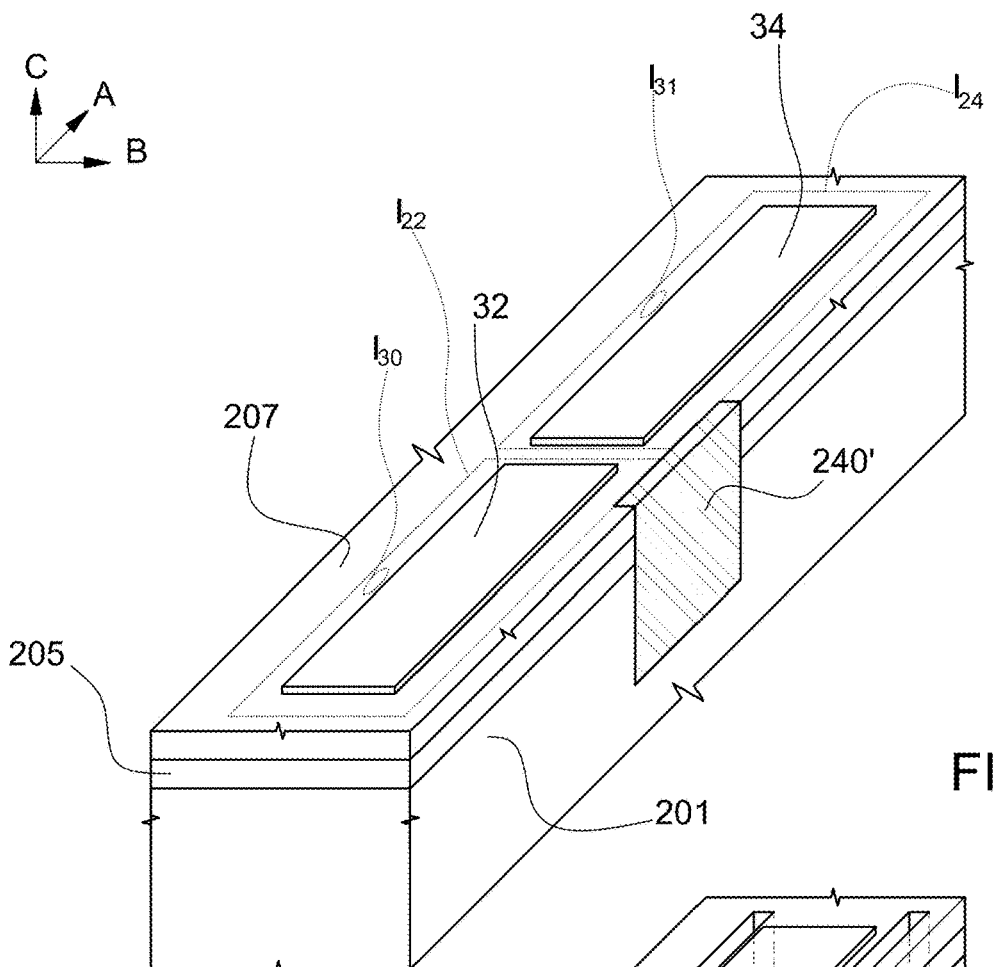
FIG. 21 schematically shows a perspective view, with portions removed, of a part of the wafer shown in FIG. 20.

Next, as illustrated in FIGS. 20 and 21, formed within the recess 215 is a preliminary deformable region 240', which is of a silicone polymer, is designed to form the deformable region 240, and fills the recess 215. For instance, formation of the preliminary deformable region 240' may be obtained via a process of spinning and subsequent patterning, so that the preliminary deformable region 240' will face out over a surface $S_{209}$ that delimits the second coating layer 209 at the top.

Figure 22:
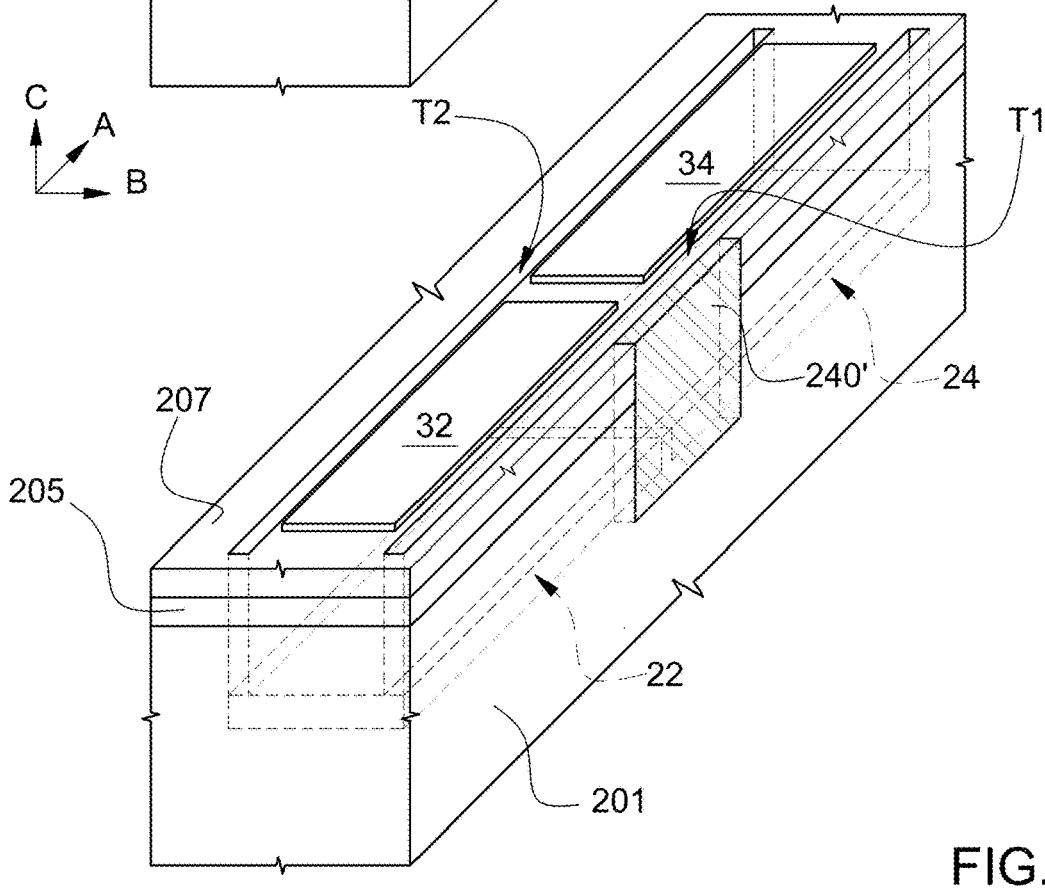
FIG. 22 schematically shows a perspective view, with portions removed, of the part of wafer shown in FIG. 21, after a subsequent step of the manufacturing process.
Figure 23:
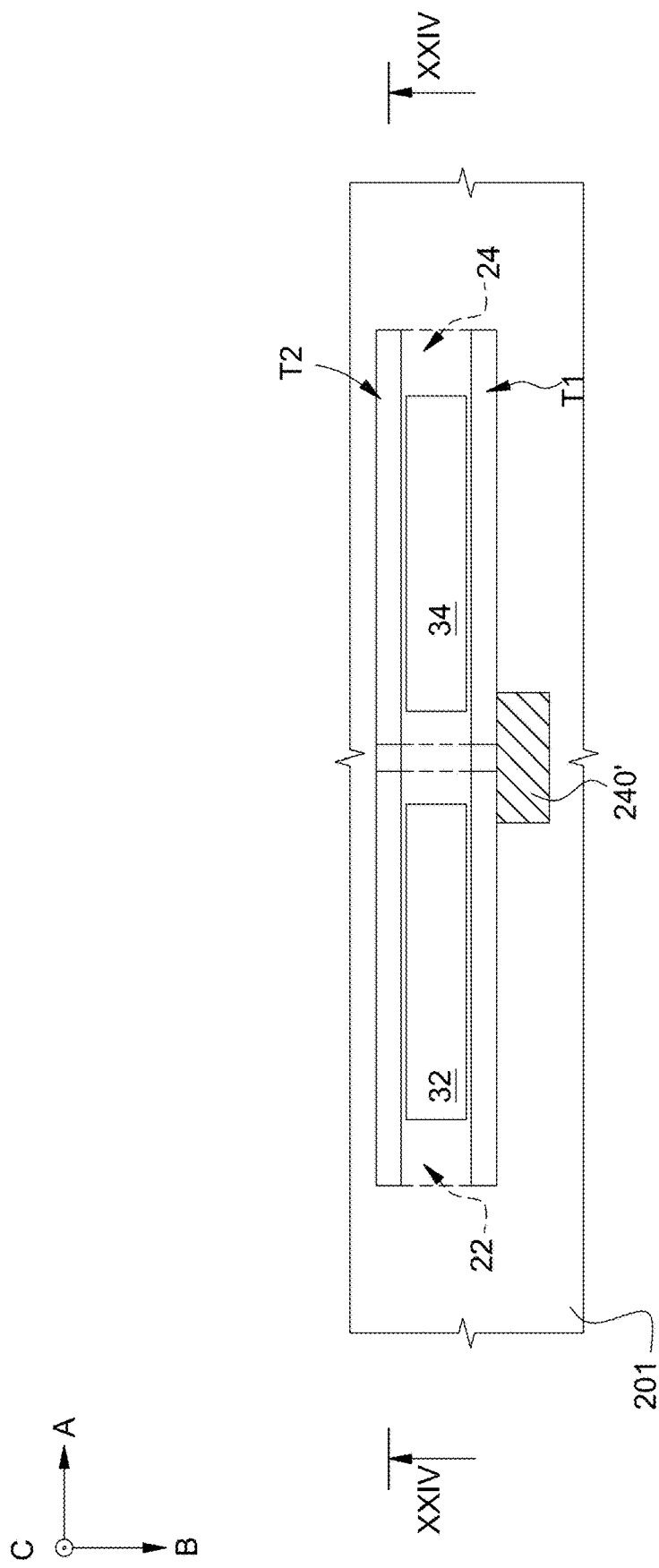
FIG. 23 schematically shows a top view, with parts removed, of the wafer shown in FIG. 22.
Figure 24:
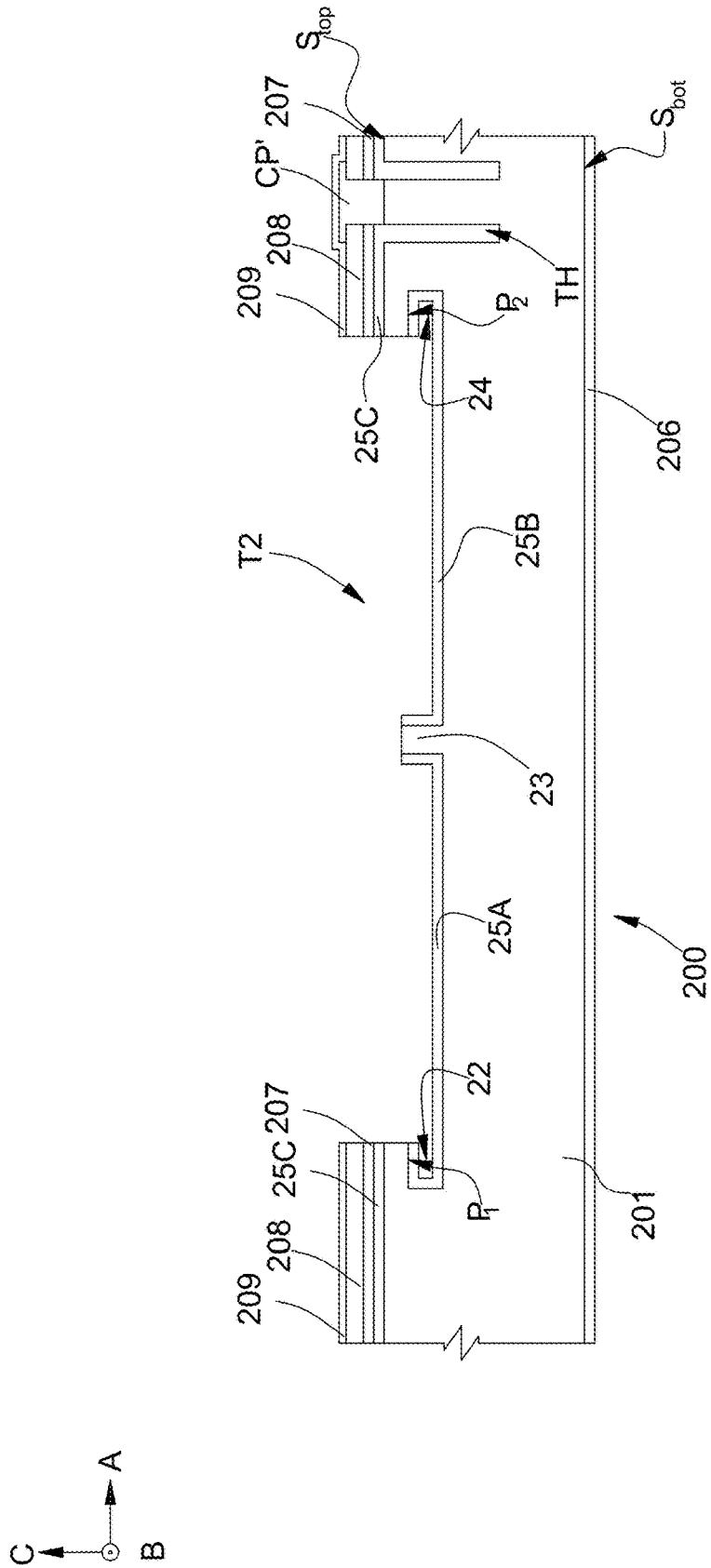
FIG. 24 schematically shows a cross-sectional view of the wafer shown in FIG. 23, taken along a line of section XXIV-XXIV shown in FIG. 23.

Next, as shown in FIG. 22 (to which the same simplifications of FIG. 8 apply), 23 and 24, a new succession of etches is carried out, for example of a dry type, so as to form the first and second trenches T1, T2 and, therefore, render the first and second cavities 22, 24 accessible, since, as explained previously, the first and second trenches T1, T2 function as ducts in so far as they are open downwards.

In particular, formation of the first and second trenches T1, T2 entails removal of peripheral parts of the front semiconductor region 202, so that the remaining central part of the front semiconductor region 202 forms the membrane region M. Formation of the first and second trenches T1, T2 moreover entails removal of parts of the first and second dielectric layers 205, 207 and of the first and second coating layers 208, 209.

Following upon formation of the first and second trenches T1, T2, the first dielectric layer 205 is divided into the first and second inner coating regions 25A, 25B, as well as the first outer coating region 25C.

Figure 25:
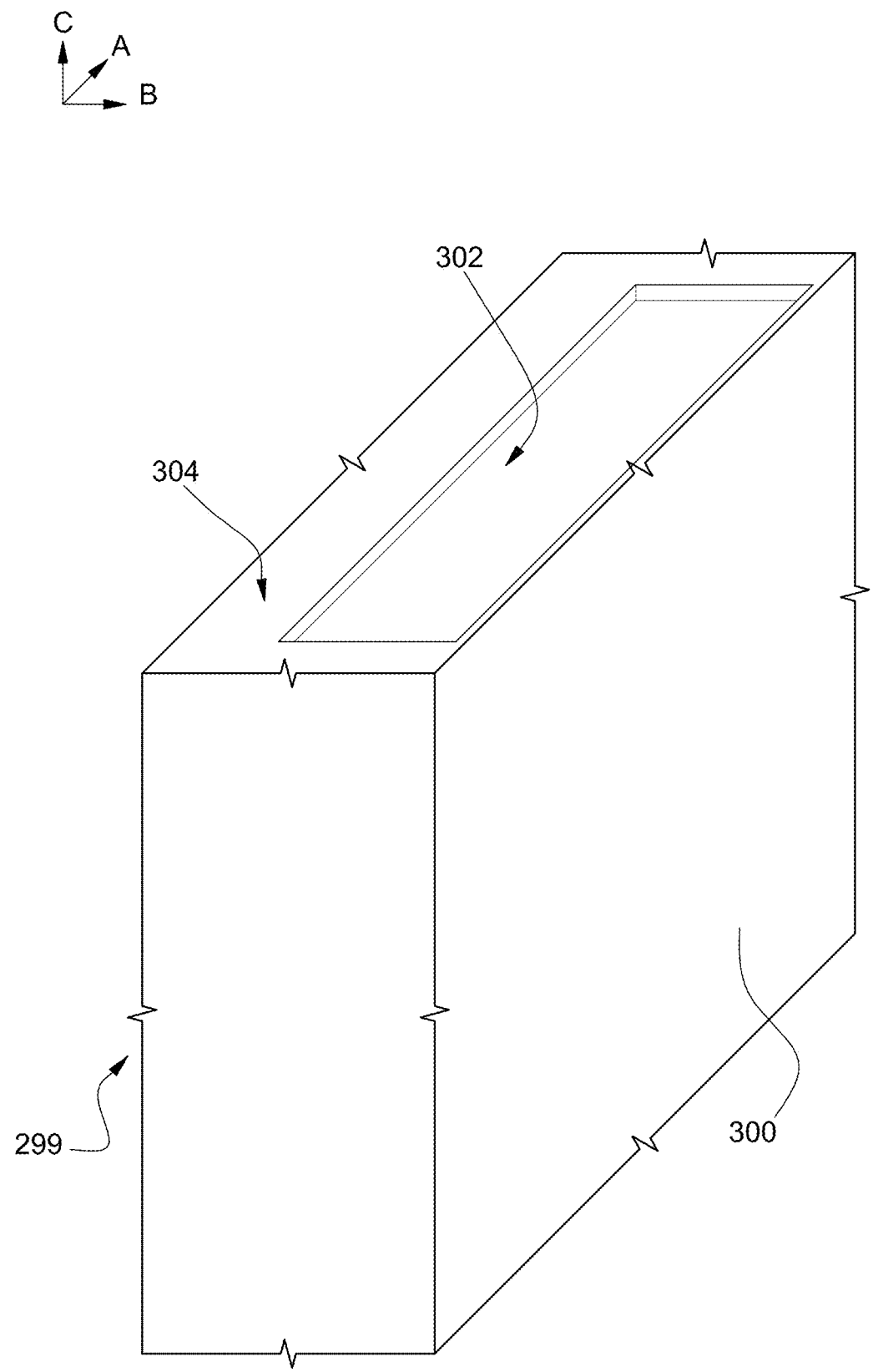
FIG. 25 schematically shows a perspective view of a portion of a further wafer.
Figure 26:
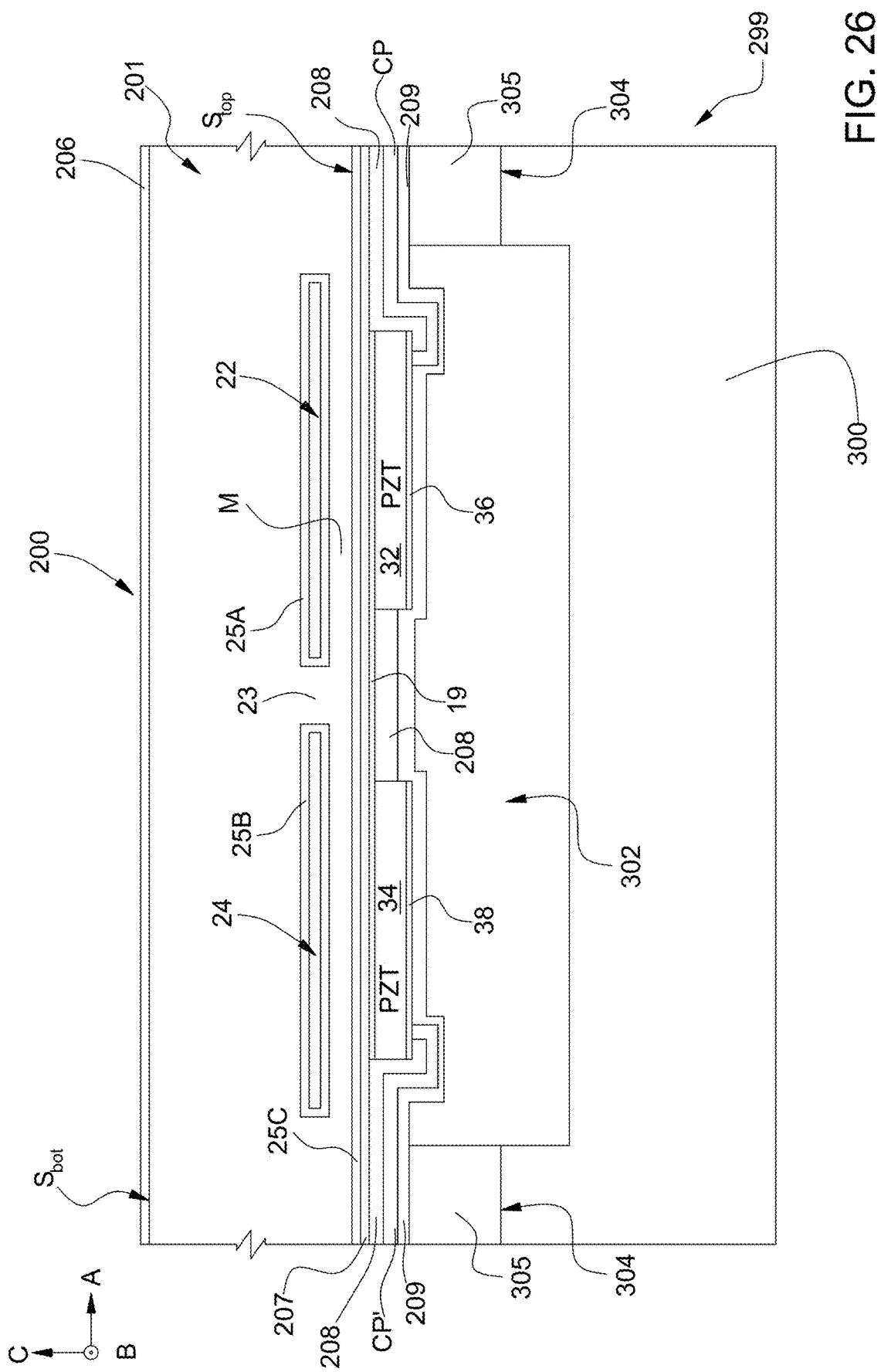
FIG. 26 schematically shows a cross-sectional view of an assembly formed by two wafers.

Next, as shown in FIG. 26, the first wafer 200 is mechanically coupled to a second wafer 299 (shown in FIG. 25), which is, for example, of an AlTiC alloy and includes a supporting body 300, in which housing cavities 302 are formed (one of which is visible in FIG. 25).

The supporting body 300 of the second wafer 299 is delimited by a base surface 304, onto which the housing cavities 302 face out, each of which corresponds to a respective actuator device 20 of the first wafer 200. Consequently, in what follows, reference is made to a single actuator device 20 and to the corresponding housing cavity 302, except where otherwise specified.

In detail, the first wafer 200 is flipped over and is fixed to the second wafer 299. More in particular, the actuator device 20 is flipped over and is fixed to the supporting body 300 so that the membrane region M, and therefore the first and second cavities 22, 24 and the first and second piezoelectric regions 32, 34 will overlie the housing cavity 302.

Figure 32:
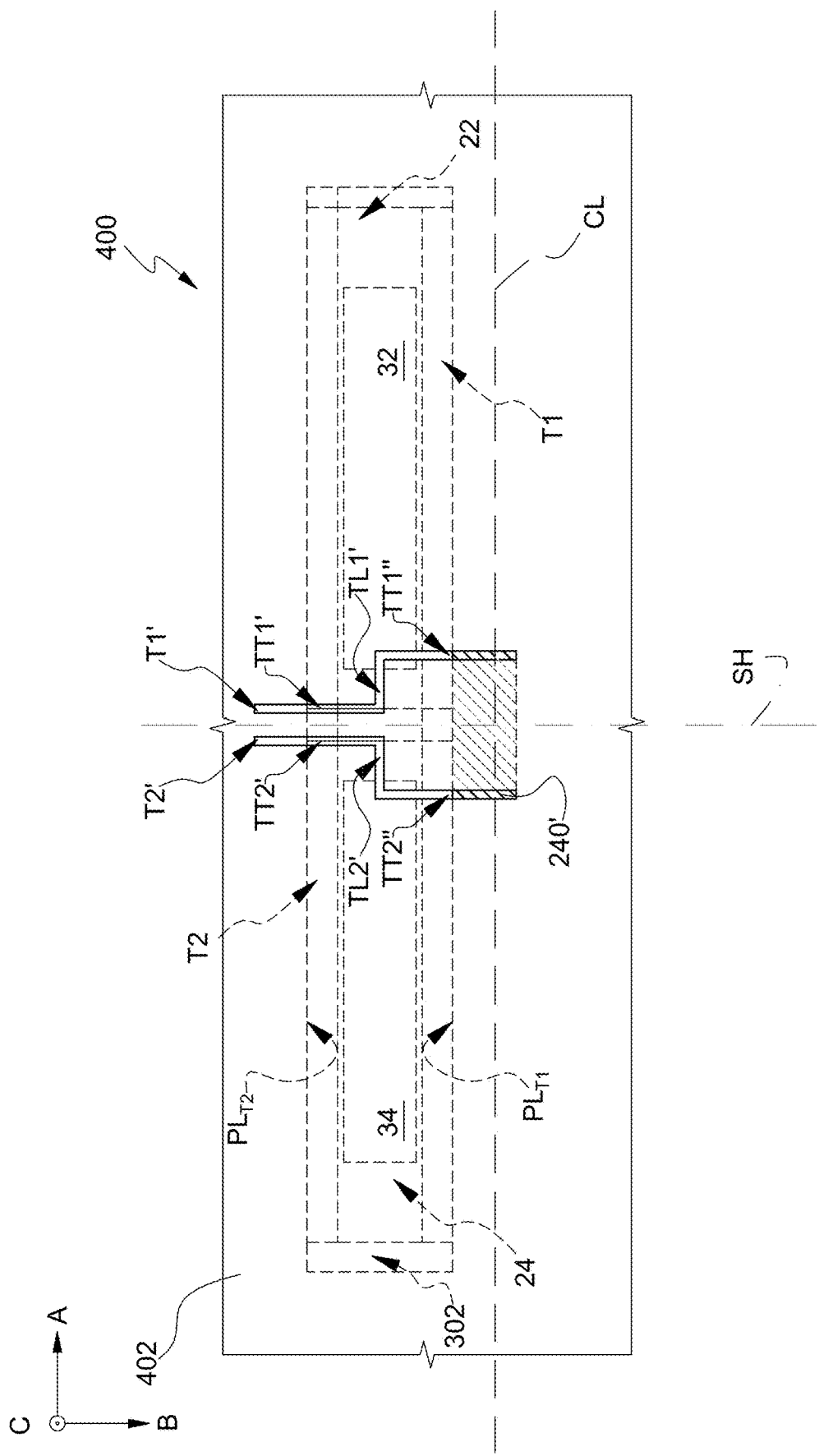
FIG. 32 schematically shows a top view, with portions removed, of the assembly shown in FIG. 31.
Figure 33:
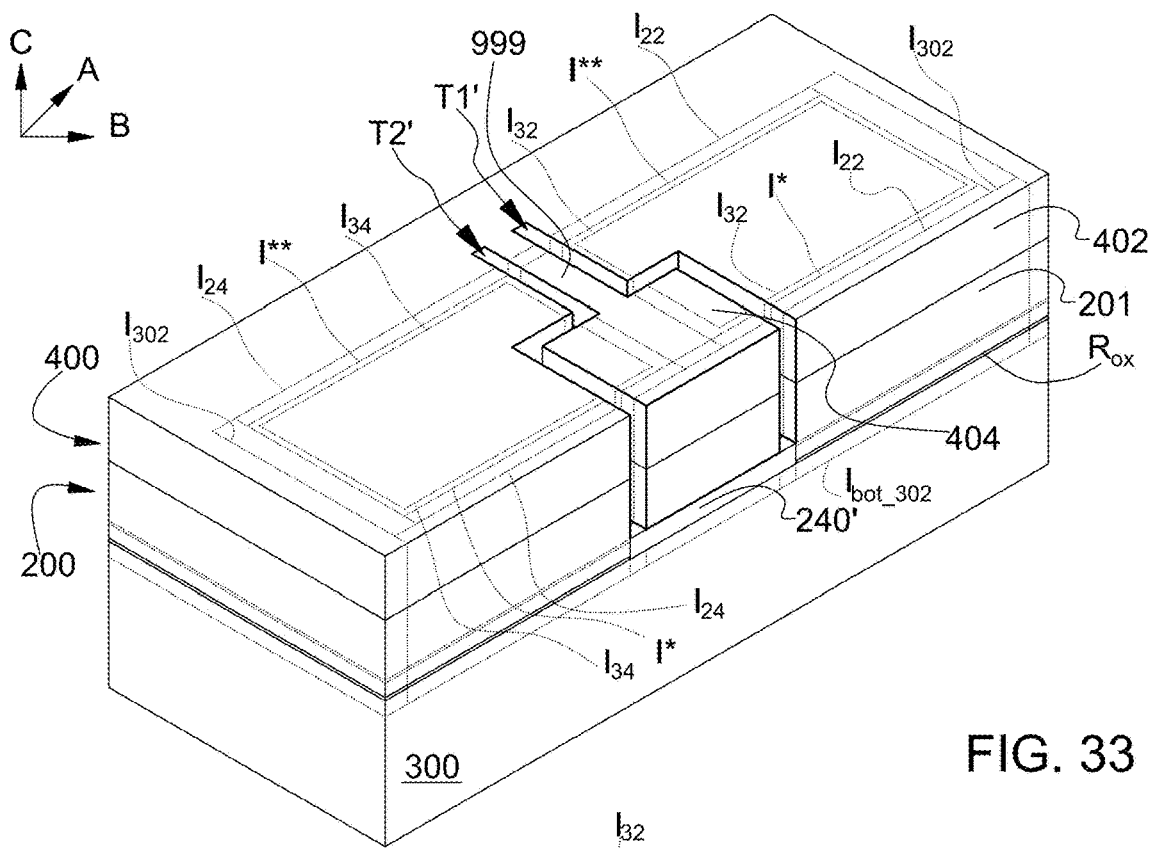
FIGS. 33-38 schematically show perspective views of sections of the assembly shown in FIG. 32.

Without this implying any loss of generality, as may be seen in FIG. 32, coupling is such that the outer side walls $PL_{T1}$, $PL_{T2}$ of the first and second trenches T1, T2 are approximately coplanar with underlying side walls of the housing cavity 302, which, moreover has an elongated shape parallel to the axis A so that the first and second cavities 22, 24, and therefore also the first and second piezoelectric regions 32, 34, are entirely suspended over the housing cavity 302. Instead, in top view, the preliminary deformable region 240' is laterally staggered with respect to the housing cavity 302.

Coupling is obtained by interposition, between the second coating layer 209 and the base surface 304, of a gluing region 305, for example, of a benzocyclobutene-based resin. The preliminary deformable region 240' comes into abutment against an underlying part of the gluing region 305, since it is laterally staggered with respect to the housing cavity 302.

Figure 27:
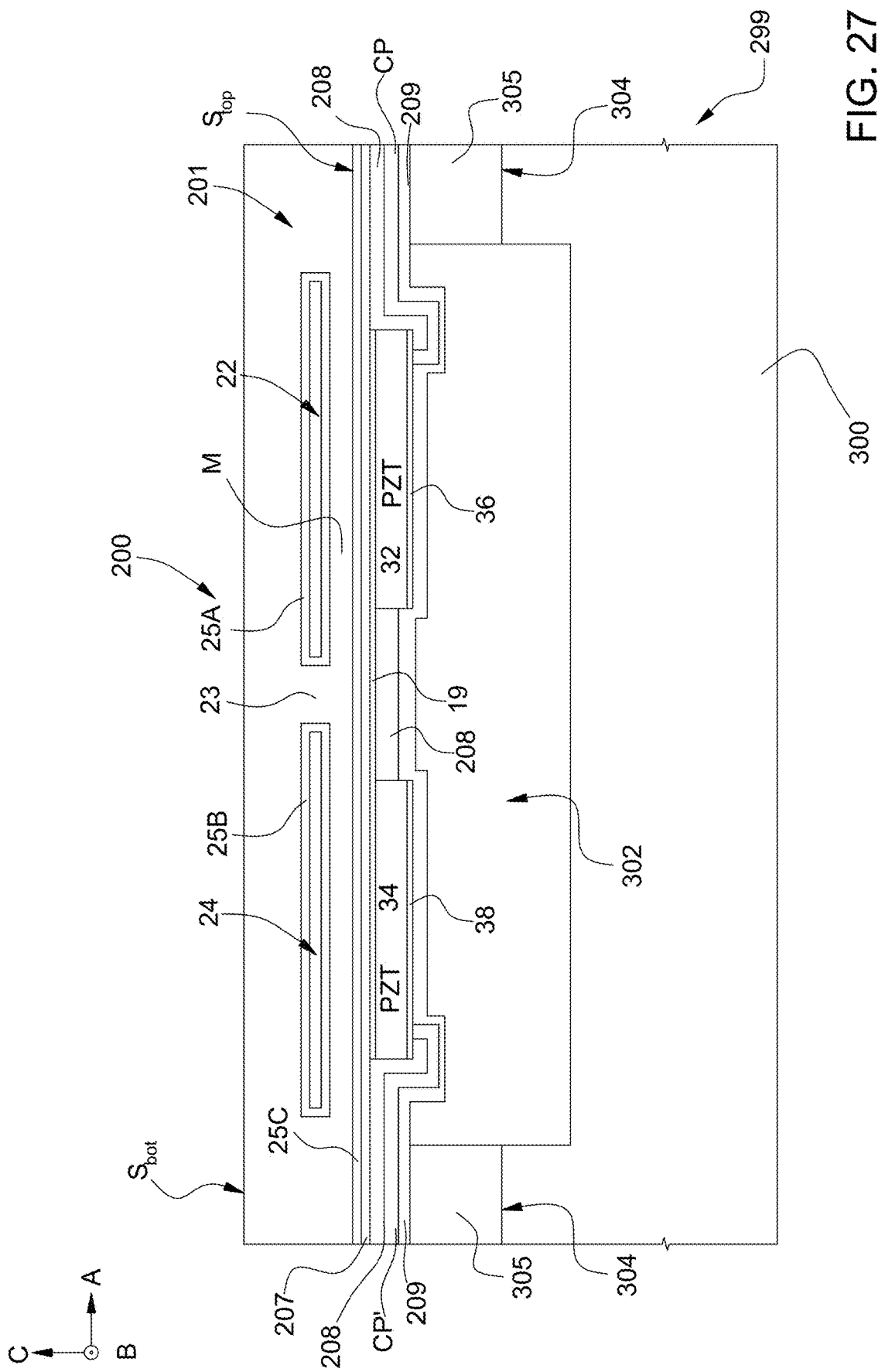
FIGS. 27 and 28 schematically show two different cross-sectional views of the wafer assembly shown in FIG. 26, after execution of a further step of the manufacturing process.
Figure 28:
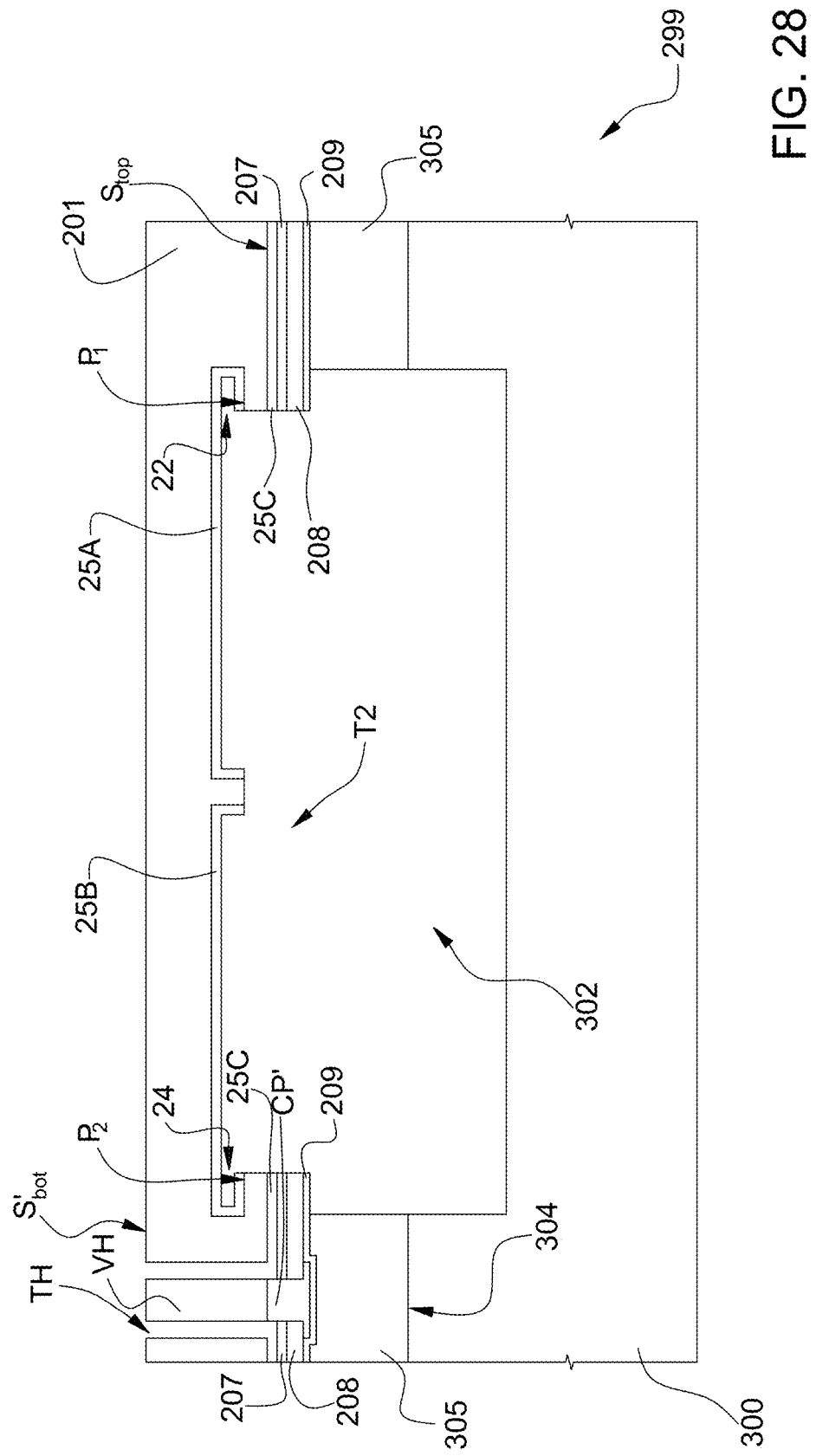

Next, as shown in FIG. 27, an operation of grinding and chemical-mechanical polishing is carried out so as to remove the rear layer 206 and reduce the thickness of the semiconductor body 201. In particular, as may be seen in FIG. 28, grinding and polishing lead to two successive reductions of the thickness of the semiconductor body 201 (for example, down to 30 µm and then down to 25 µm) so as to expose the circular trench TH and part of the first outer coating region 25C contained therein. Following upon the above operations, the semiconductor body 201 is delimited at the top by a new bottom surface $S_{bot}'$.

Figure 29:
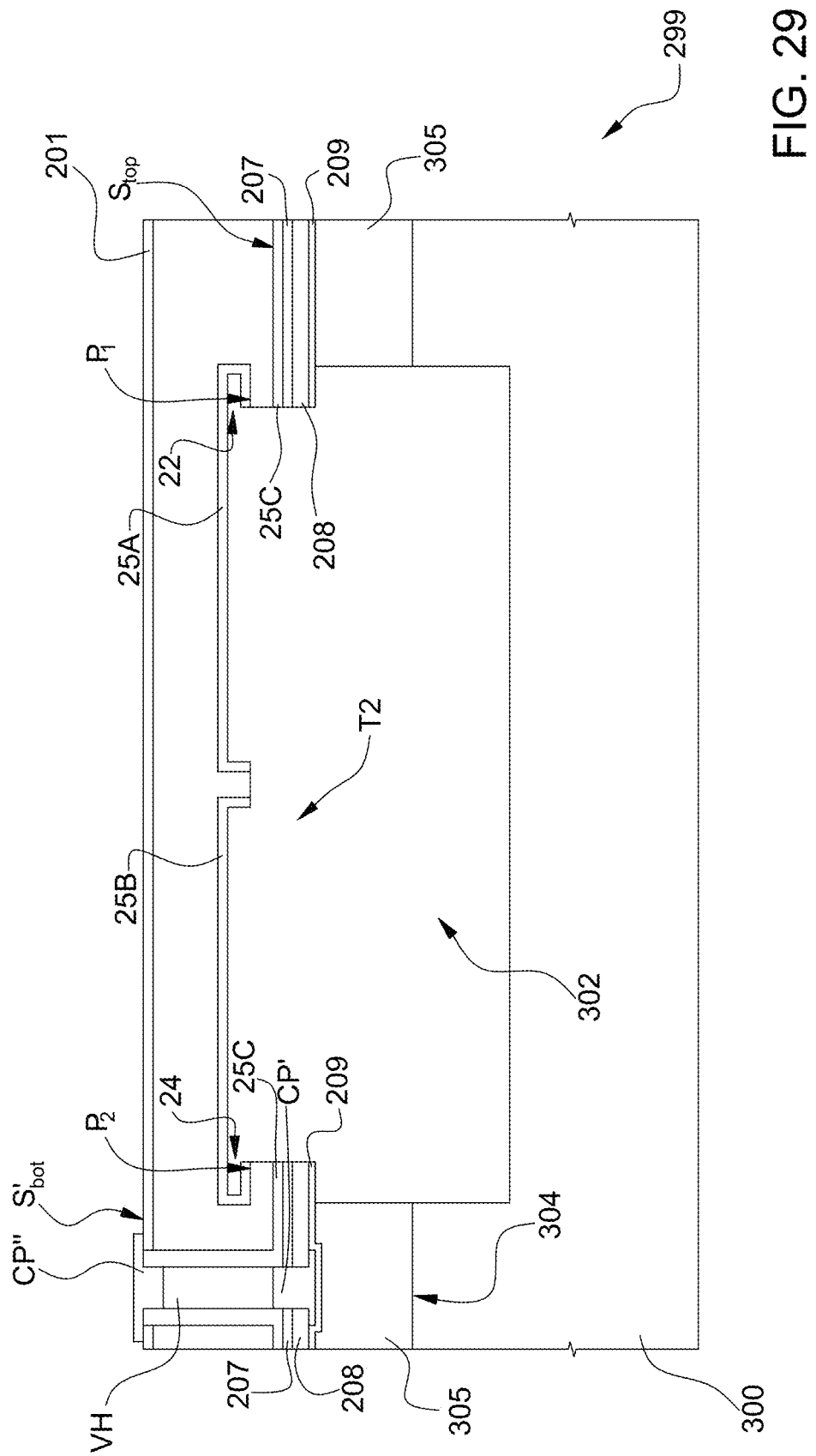
FIG. 29 schematically shows a same section of the wafer assembly shown in FIG. 28, after execution of a further step of the manufacturing process.

Next, as shown in FIG. 29, the contact regions are formed. For instance, FIG. 29 shows the contact region CP''', arranged above the bottom surface $S_{bot}$, in direct contact with the cylindrical portion VH.

Moreover, a layer 211 is formed over the new bottom surface $S_{bot}$, referred to in what follows as coupling layer 211. The coupling layer 211 is of a USG or TEOS oxide, deposited by chemical vapor deposition, and has a thickness, for example, of 1 µm. The contact region CP''' extends through the coupling layer 211.

Figure 30:
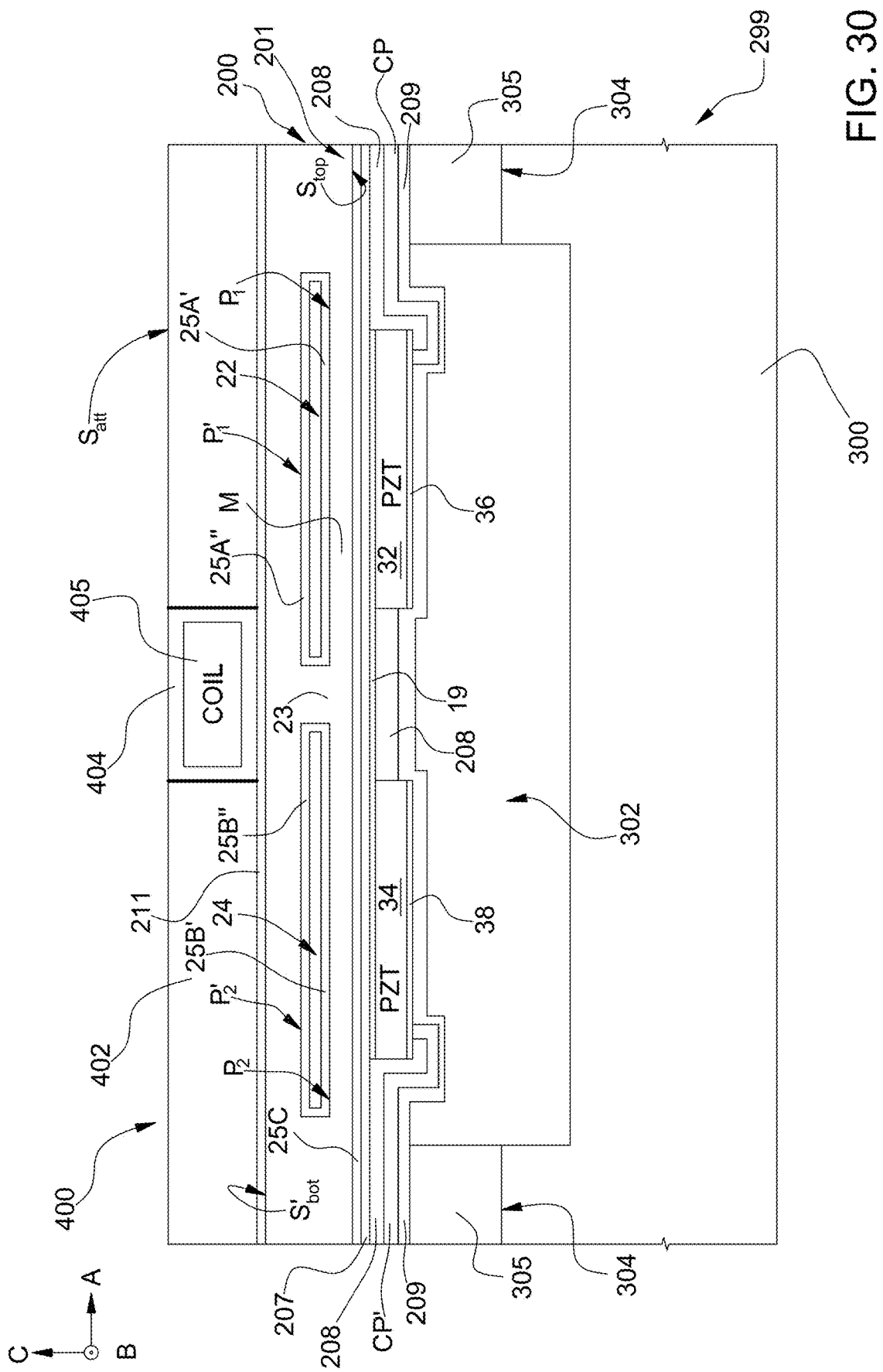
FIGS. 30 and 31 schematically show cross-sectional views of a further wafer assembly, during execution of successive steps of the manufacturing process.

Then, as shown in FIG. 30, a top structure 400 is formed over the first wafer 200, and in particular on the coupling layer 211.

Figure 43:
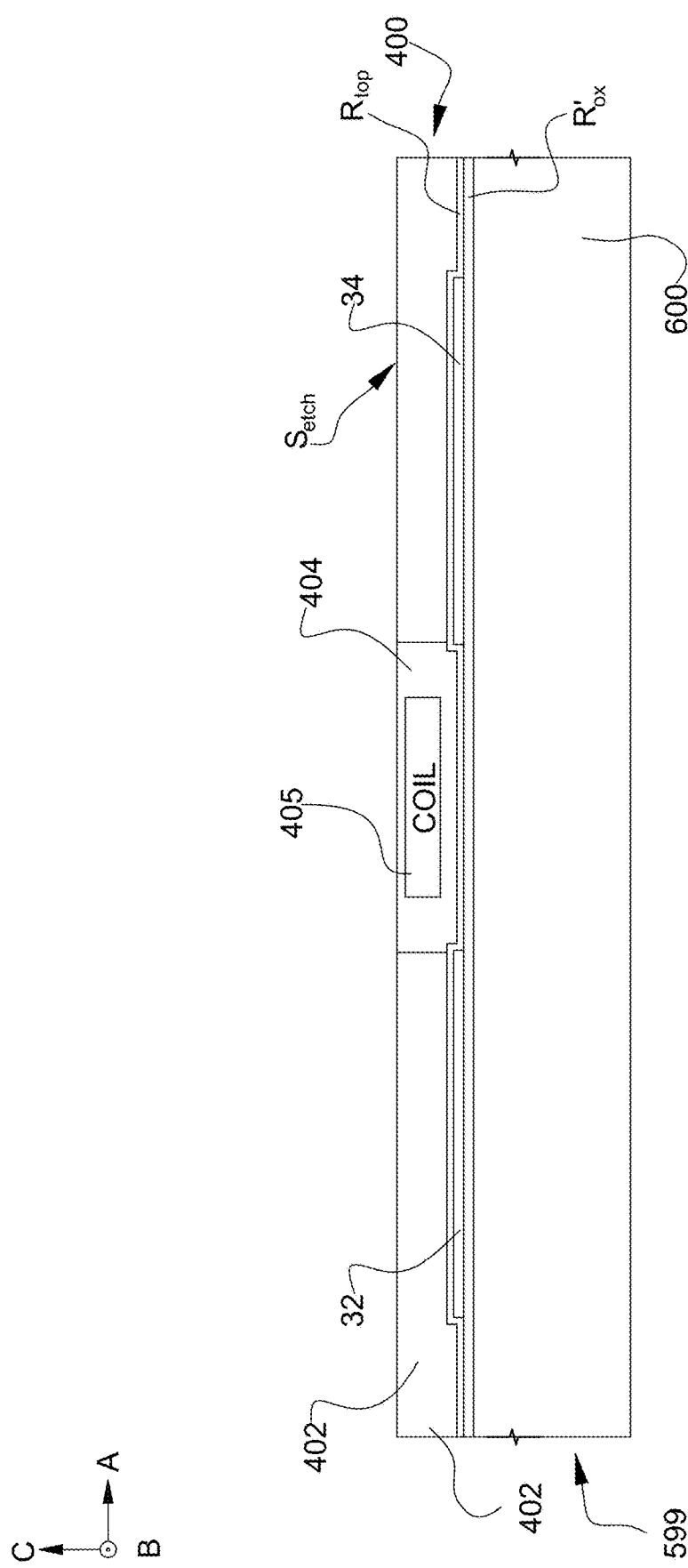
FIGS. 43 and 44 schematically show cross-sectional views of an assembly including the wafer of FIG. 42, during successive steps of a manufacturing process.

In particular, the top structure 400 is obtained by chemical vapor deposition of alumina (aluminum oxide). In addition, the top structure 400 comprises a plurality of read/write heads 404 of a per se known type, i.e., portions at least in part of alumina, each of which includes a respective conductive coil that can be controlled electronically by an external driving circuit so as to be traversed by electrical signals (in particular, currents) that are able to write the magnetic tracks 4 or that are indicative of the data stored in the magnetic tracks 4. A coil, designated by 405, is schematically shown in FIGS. 30 and 43.

Furthermore, the top structure 400 comprises a respective main body 402, to which the read/write heads 404 are fixed. The main body 402 is without read/write coils.

The main body 402 of the top structure 400 is formed on the coupling layer 211; furthermore, each read/write head 404 extends over a corresponding housing cavity 302, and therefore over a corresponding actuator device 20. In what follows, the description will be limited to a single read/write head 404. In addition, in what follows, the main surface of the top structure 400 facing the side opposite to the second wafer 200 is referred to as the surface to be etched Seta.

Albeit not shown, corresponding contacts are formed on the top structure 400, which are electrically connected to the coils 405 of the read/write heads 404 and enable electrical coupling of the latter to the outside world, and in particular to the respective driving circuits.

Figure 31:
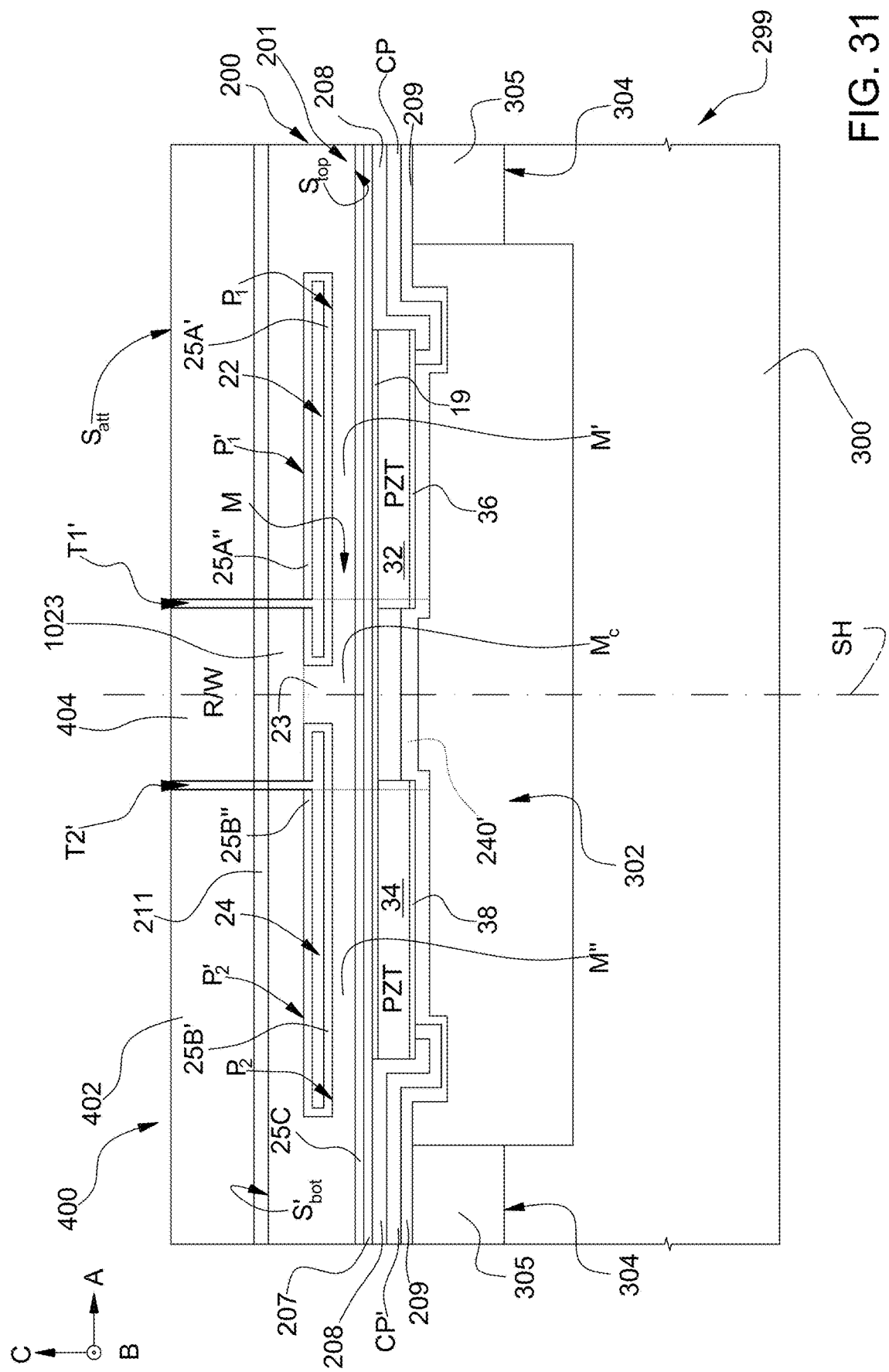

Next, as shown in FIGS. 31 and 32, a further succession of etches is carried out, for example of a dry type, starting from the surface to be etched Seta, so as to selectively remove portions of the main body 402 that surround the read/write head 404 laterally, as well as underlying portions of the coupling layer 211 and underlying portions of the semiconductor body 201, until portions of the first and second inner coating regions 25A, 25B that coat, respectively, the bottom walls $P_1'$ and $P_2'$ of the first and second cavities 22, 24 (i.e., the aforementioned second parts 25A'', 25B'' of the first and second inner coating regions 25A, 25B) are etched. Etching, however, does not involve portions of the first and second inner coating regions 25A, 25B that coat, respectively, the top walls $P_1$ and $P_2$ of the first and second cavities 22, 24 (i.e., the aforementioned first parts 25A', 25B' of the first and second inner coating regions 25A, 25B). To a first approximation, it may be assumed that the operations of etching stop at a depth equal to the depth where the second parts 25A'', 25B'' of the first and second inner coating regions 25A, 25B extend.

In greater detail, the etching operations shown in FIGS. 31 and 32 lead to formation of a first additional trench T1' and a second additional trench T2', which are arranged symmetrically with respect to the plane of symmetry SH and extend on opposite sides of the read/write head 404. Furthermore, to a first approximation, the first and second additional trenches T1' and T2' have a uniform depth such that, as explained previously, the first and second additional trenches T1' and T2' traverse the second parts 25A'', 25B'' of the first and second inner coating regions 25A, 25B, and therefore communicate with the first and second cavities 22, 24, respectively, but do not traverse the first parts 25A', 25B' of the first and second inner coating regions 25A, 25B.

As regards the vertical extension of the first and second additional trenches T1' and T2', the presence of the oxidized regions formed by the first parts 25A', 25B' and the second parts 25A'', 25B'' of the first and second inner coating regions 25A, 25B enables precise control of the extension in depth of the etch, for example using the second parts 25A'', 25B'' of the first and second inner coating regions 25A, 25B as etch-stop points.

Given the symmetry, in what follows the first additional trench T1' is described, except where otherwise specified. Portions of the second additional trench T2' that are the same as portions of the first additional trench T1' are designated by the same references, but "1" is replaced by "2". In addition, the ensuing description refers to FIGS. 32-38. As regards FIGS. 33-38, it is here assumed, for simplicity of representation, that the first and second inner coating regions 25A, 25B, the conductive region 19, the coupling layer 211, the gluing region 305, and the first and second top electrode regions 36, 38 are absent. Moreover, it is assumed that the first and second additional trenches T1', T2' extend as far as the bottom walls $P_1'$, $P_2'$ of the first and second cavities 22, 24. In addition, it is assumed that the first outer coating region 25C and the second dielectric layer 207 form a region $R_{ox}$, referred to in what follows as the thin region $R_{ox}$. It is likewise assumed that the first and second coating layers 208, 209 are negligible and that the conductive paths CP are absent. Consequently, the preliminary deformable region 240' extends as far as the thin region $R_{ox}$.

Once again with reference to FIGS. 33-38, the aforementioned contour lines 122, 124 present in said figures are projected on the top surface of the top structure 400. In addition, further contour lines are shown, which are designated by 132 and 134 and represent (approximately) the contour of the first and second piezoelectric regions 32, 34, respectively. Likewise denoted by I* and I** are the lines that represent the projections of the inner side walls of the first and second trenches T1, T2, respectively, whereas denoted by $I_{302}$ is the contour line of the housing cavity 302. Moreover, denoted by $W_{cavity}$, $W_{membrane}$, and $W_{ox}$, respectively, are the projections of the heights of the first and second cavities 22, 24, of the membrane region M, and of the thin region $R_{ox}$. Denoted by $I_{bot\_302}$ is a side projection of the height of the bottom base of the housing cavity 302.

Figure 34:
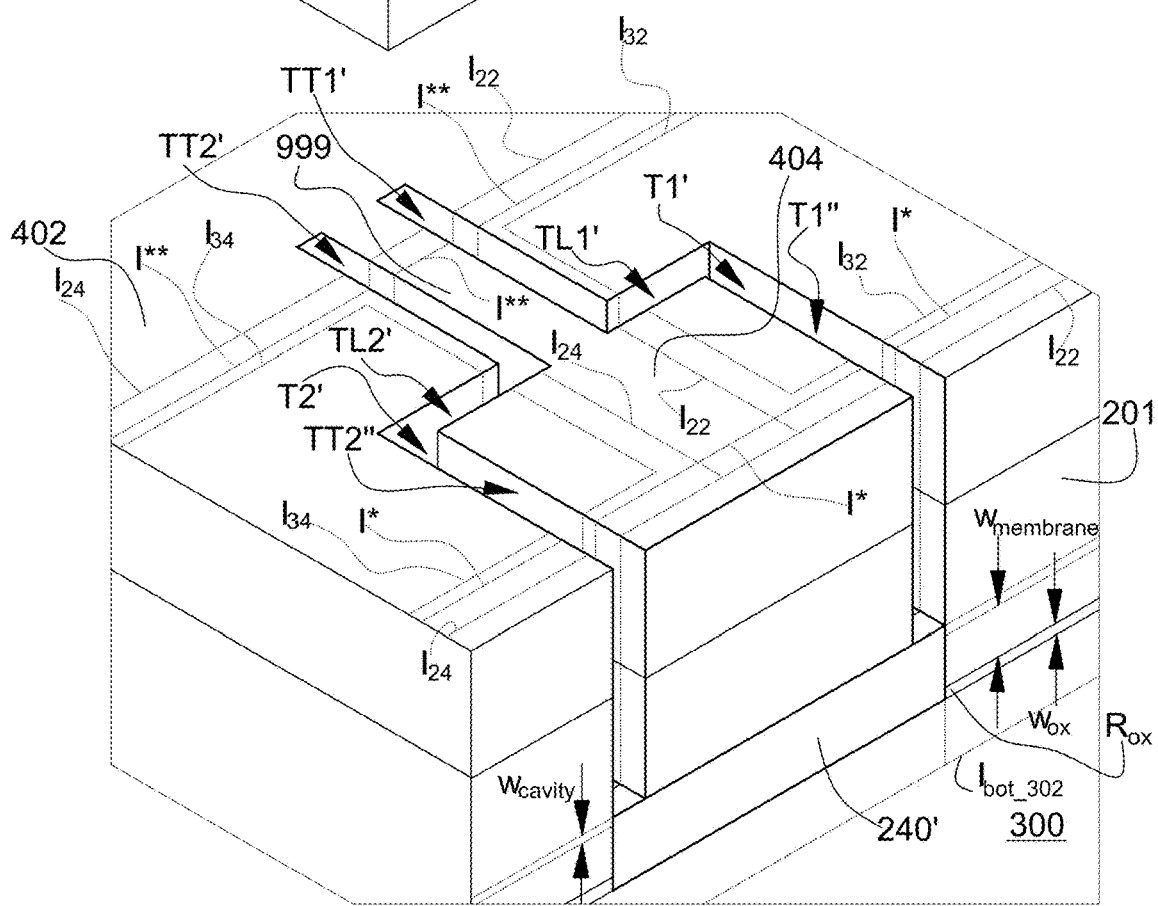
Figure 35:
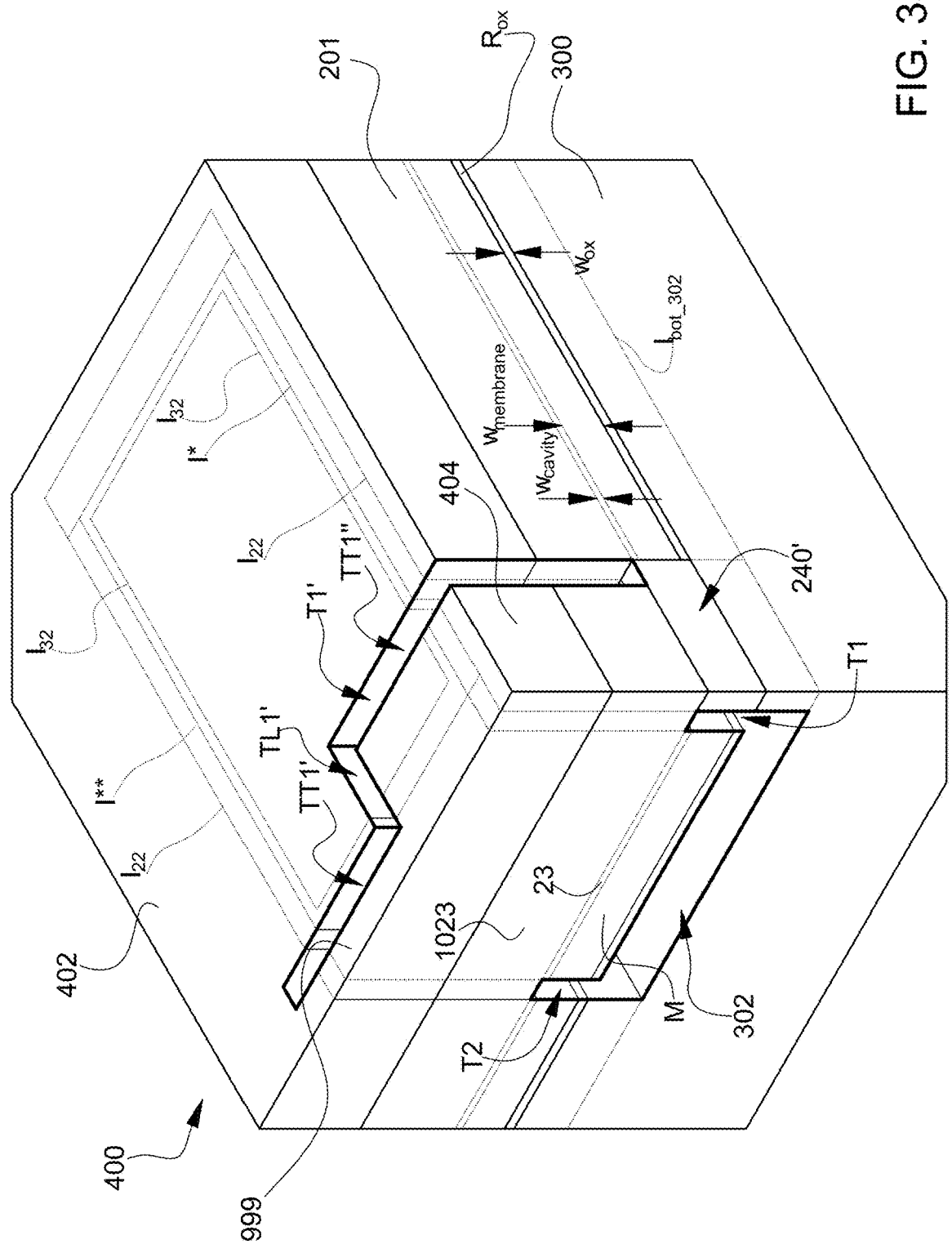

All this having been said, the first additional trench T1' comprises a first transverse portion TT1' and a second transverse portion TT1'' and a longitudinal portion TL1', which, as mentioned previously, extend, to a first approximation, as far as a same depth and have a parallelepipedal shape. Furthermore, the first and second transverse portions TT1', TT1'' extend parallel to the axis B and are interposed by the longitudinal portion TL1', which is interposed between them and extends parallel to the axis A. For simplicity of representation, the portions of the first additional trench T1' are shown in FIGS. 32, 34, and 35; the portions of the second additional trench T2' are shown in FIGS. 32 and 34.

In greater detail, the first transverse portion TT1' extends in a portion of the main body 402 and in an underlying portion of the semiconductor body 201 (as well as through a corresponding portion of the coupling layer 211, which in what follows will generally no longer be mentioned, except where otherwise specified), which are laterally staggered with respect to the housing cavity 302. Moreover, the first transverse portion TT1' extends in a portion of the main body 402 and in an underlying portion of the semiconductor body 201 that overlie the second trench T2 so that the first transverse portion TT1' of the first additional trench TT1 communicates with the underlying second trench T2. In addition, the first transverse portion TT1' extends through a portion of the main body 402 and in an underlying portion of the semiconductor body 201 that overlie the first cavity 22 and a part of the intermediate semiconductor region 23 adjacent to the first cavity 22, as well as through an underlying portion (not illustrated) of the second part 25A" of the first inner coating region 25A and through said adjacent part of the intermediate semiconductor region 23. In particular, as shown in FIG. 32, and without this implying any loss of generality, the first transverse portion TT1' has a shape (approximately) symmetrical with respect to a plane (not shown) parallel to the plane BC and coplanar with the side wall of the first cavity 22 parallel to the plane BC close to the plane of symmetry SH. In this regard, albeit not shown, variants are possible where the first and second transverse portions TT1', TT2' are close to the plane of symmetry SH to such a point as not to communicate with the first and second cavities 22, 24.

The longitudinal portion TL1' of the first additional trench T1' has its axis parallel to the plane CA and extends through a portion of the main body 402 and an underlying portion of the semiconductor body 201 that overlie the first cavity 22, as well as in an underlying portion of the second part 25A" of the first inner coating region 25A. Without this implying any loss of generality, the longitudinal portion TL1' extends parallel to the axis A so that part of the longitudinal portion TL1' overlies, at a distance, part of the first piezoelectric region 32.

In practice, the longitudinal portion TL1' gives out into the first cavity 22.

A first part of the second transverse portion TT1" connects up to the longitudinal portion TL1' and extends in a portion of the main body 402 and in an underlying portion of the semiconductor body 201 that overlie the first cavity 22, as well as through an underlying portion of the second part 25A" of the first inner coating region 25A so as to face out into the first cavity 22.

A second part of the second transverse portion TT1" extends in a portion of the main body 402 and in an underlying portion of the semiconductor body 201 that overlie the first trench T1 so that the second part of the second transverse portion TT1" communicates with the underlying first trench T1.

Finally, a third part of the second transverse portion TT1" extends in a portion of the main body 402 and in an underlying portion of the semiconductor body 201, which are laterally staggered with respect to the housing cavity 302 and overlie the preliminary deformable region 240'. In this way, the third part of the second transverse portion TT1" exposes a corresponding part of the preliminary deformable region 240'.

In other words, the first and second parts of the second transverse portion TT1" of the first additional trench T1' both face out into the first cavity 22. Furthermore, the first part of the second transverse portion TT1" is laterally staggered with respect to the first trench T1, whereas the second part of the second transverse portion TT1" is arranged above the first trench T1. The third part of the second transverse portion TT1" is delimited, underneath, by the preliminary deformable region 240'.

In practice, the second transverse portion TT1" and the longitudinal portion TL1' of the first additional trench T1' extend through portions of the body 402 so as to delimit the read/write head 404 laterally.

As mentioned previously, to the second additional trench T2', and in particular to the arrangement of the latter with respect to the second cavity 24, the housing cavity 302, the second piezoelectric region 34, and the preliminary deformable region 240', there applies what has been said as regards the first additional trench T1', and in particular as regards the arrangement of the first additional trench T1' with respect to the first cavity 22, the housing cavity 302, the first piezoelectric region 32, and the preliminary deformable region 240'.

Figure 36:
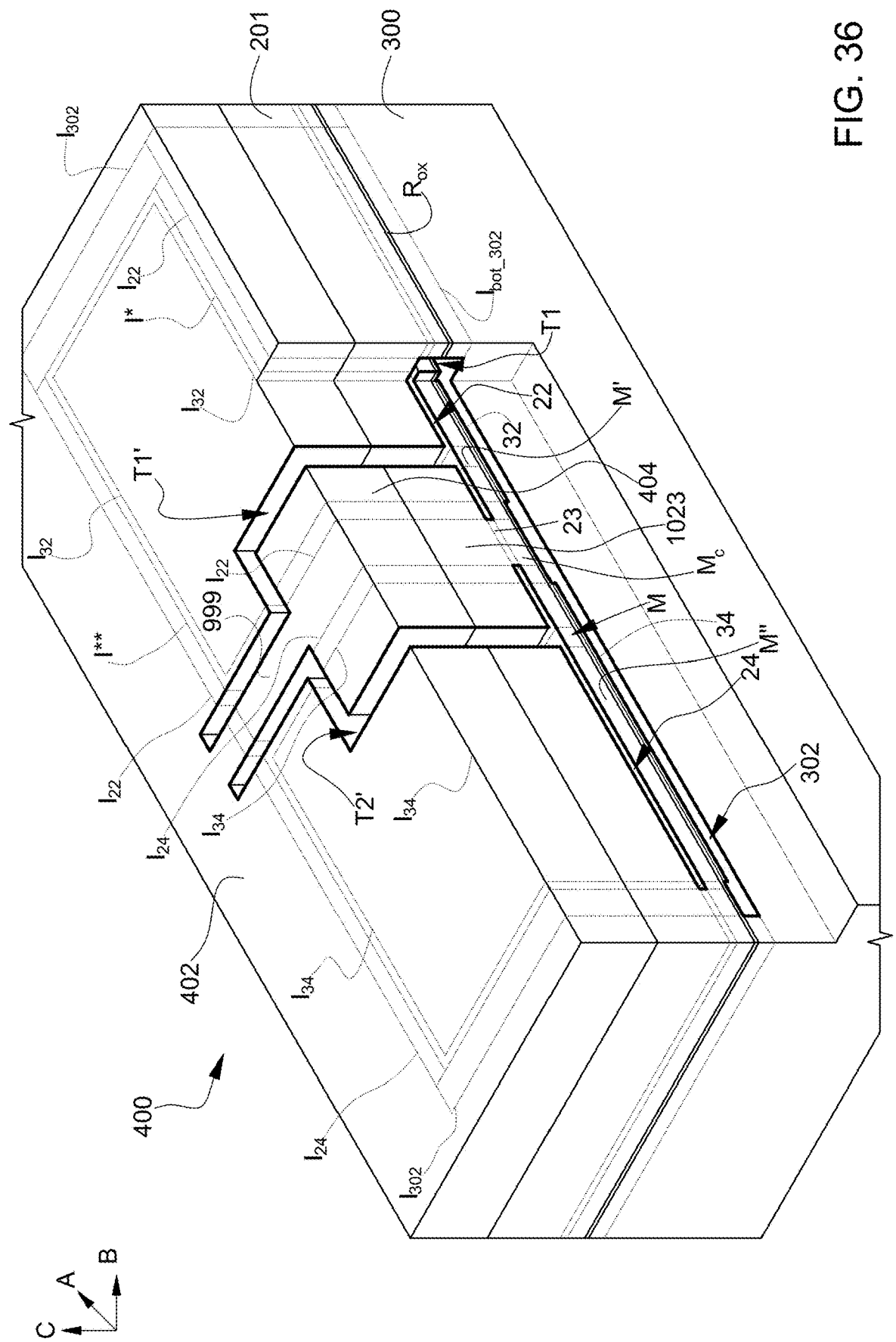
Figure 37:
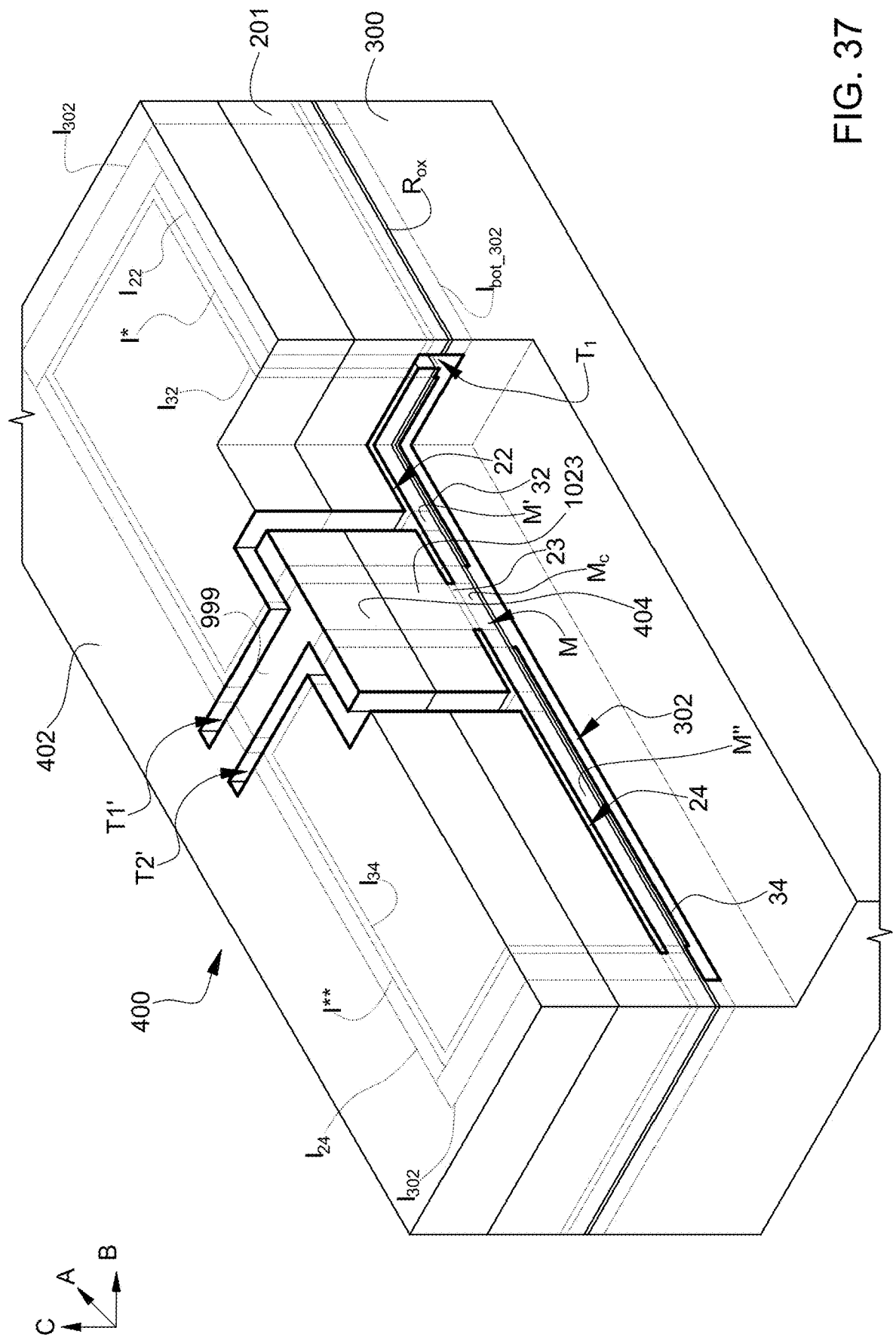
Figure 38:
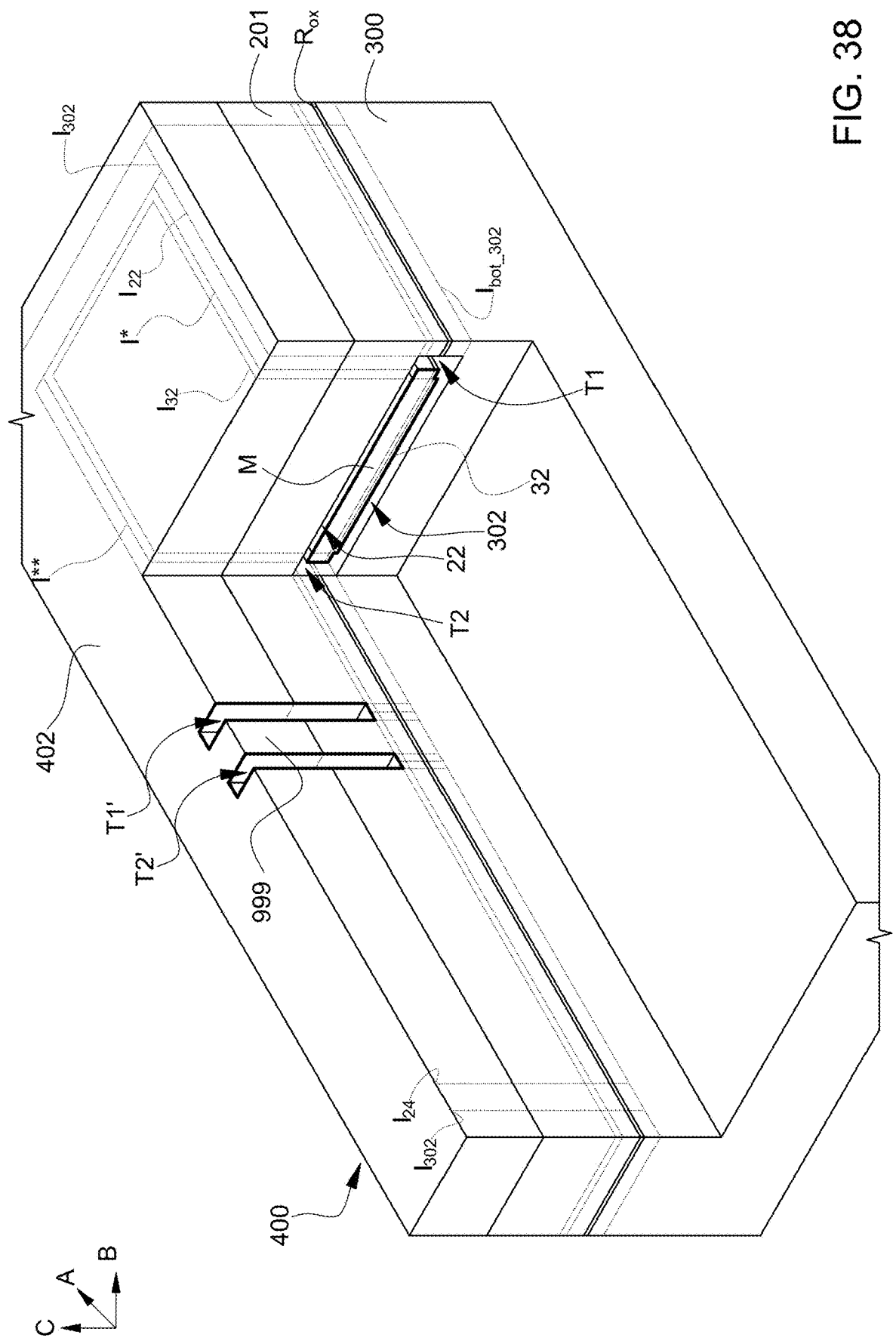

As may be seen in FIGS. 31 and 36, the second transverse portions TT1", TT2" of the first and second additional trenches T1', T2' laterally delimit a portion (designated by 1023) of the semiconductor body 201, which overlies the intermediate semiconductor region 23 and underlies the read/write head 404; in what follows, said portion of the semiconductor body is referred to as the mobile region 1023.

In addition, the first transverse portions TT1', TT2' of the first and second additional trenches T1', T2' laterally delimit a bridge structure 999, which is formed by a portion of the main body 402 adjacent to the read/write head 404 and by an underlying portion of the semiconductor body 201, adjacent to the mobile region 1023. A first end of the bridge structure 999 is constrained to a fixed body, which is formed by the semiconductor body 201 and by the main body 402 and is fixed with respect to the supporting body 300 of the second wafer 299. A second end of the bridge structure 999 is fixed with respect to a first end of the read/write head 404 and to a first end of the underlying mobile region 1023, which overlies the intermediate semiconductor region 23, and therefore overlies a central portion $M_c$ of the membrane region M, which in turn is suspended over the housing cavity 302. The read/write head 404 is therefore fixed to the central portion $M_c$ of the membrane region M, which is interposed between the first and second membranes M', M", i.e., between two peripheral portions of the membrane region M, to which the first and second piezoelectric regions 32, 34 are respectively coupled.

Following upon dicing operations that will be described hereinafter, a second end of the read/write head 404, laterally staggered with respect to the first end, overlies a second end of the mobile region 1023, which overlies the first trench T1, extends laterally until it faces out over the side surface Peat, and is constrained to the fixed body through a compliant region, represented by the deformable region 240. The first and second ends of the read/write head 404 are laterally staggered in a direction parallel to the axis B. Each one of the first and second membranes M', M" has in turn a first end, fixed to the semiconductor body 201, and a second end, which is laterally staggered with respect to the first end in a direction parallel to the axis A and is fixed to the central portion $M_c$ of the membrane region M.

Once again with reference to the manufacturing process, the assembly formed by the first and second wafers 200, 299 and by the top structure 400 is subjected to a process of singulation, which envisages carrying out dicing operations so as to form sub-assemblies that each include a corresponding actuator device 20 and a corresponding read/write head 404. These dicing operations include execution of a cut along a cutting line CL (represented in FIG. 32) parallel to the axis A and passing through the preliminary deformable region 240'. The remaining portion of the preliminary deformable region 240' forms the deformable region 240.

Albeit not represented any further, following upon the dicing operations, the remaining portions of the second dielectric layer 207 and of the first and second coating layers 208, 209 form, respectively, the second, third, and fourth outer coating regions 27, 28, 29. In addition, the remaining portions of the top surface $S_{top}$ and bottom surface $S_{bot}$ form, respectively, the first and second surfaces $S_1$, $S_2$.

In use, the present Applicant has noted how it is possible to control in voltage the first and second piezoelectric regions 32, 34 so as to deform the membrane region M and cause, to a first approximation, a consequent translation, parallel to the axis A, of the mobile region 1023, and therefore also of the read/write head 404, fixed with respect to the latter. An example of said movement is shown in FIG. 39.

Figure 39:
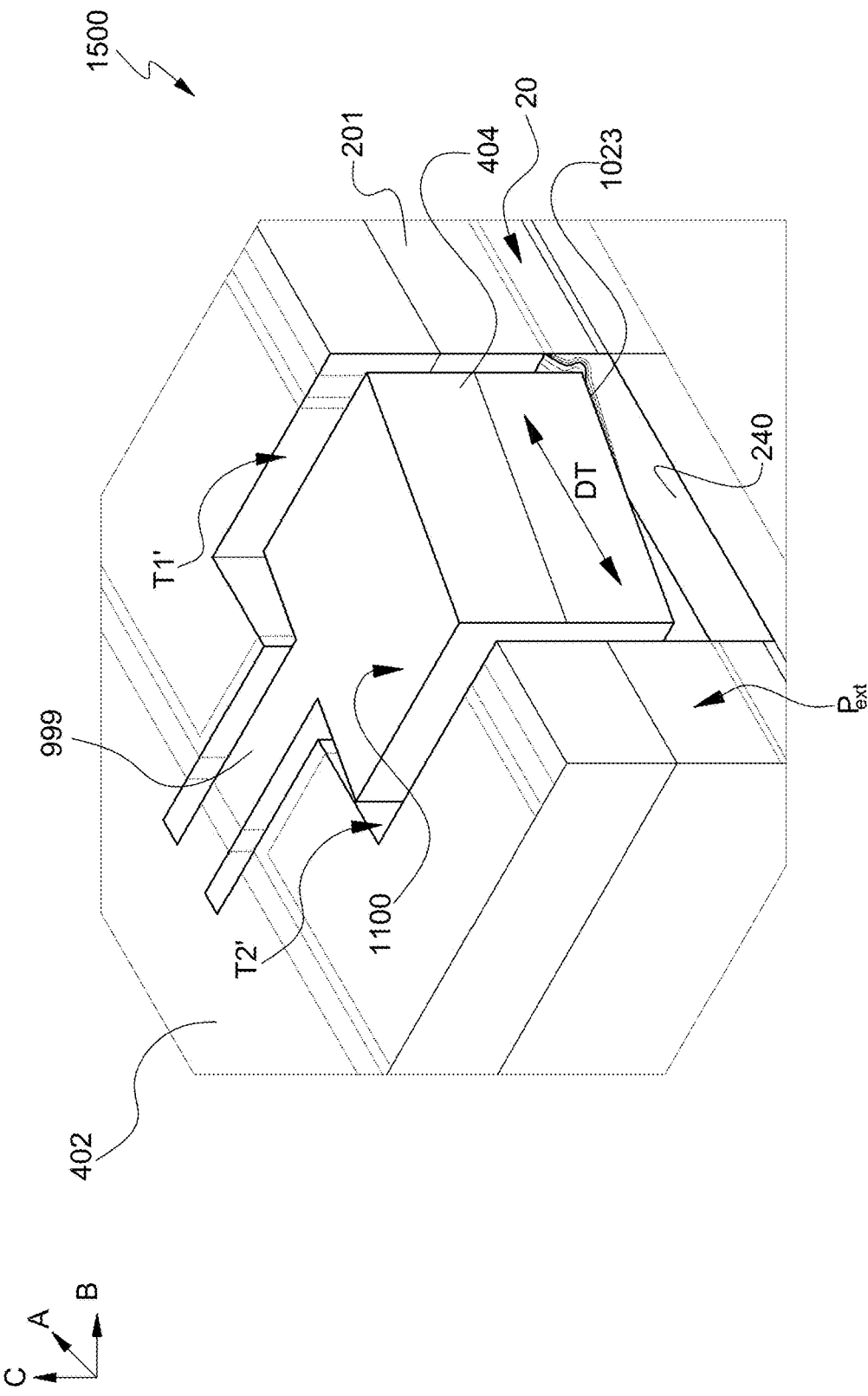
FIG. 39 schematically shows a perspective view of a read/write device, in use.

In detail, in FIG. 39 designated by 1100 is a mobile body formed by the read/write head 404 and by the mobile region 1023 (as well as by the portion of coupling layer 211 interposed between them), which has the shape of a parallelepiped with dimensions of, for example, 50 µm, 150 µm, and 200 µm along the axes C, B, and A, respectively. Following upon application of a voltage of approximately 30 V to one of the first and second piezoelectric regions 32, 34 and upon consequent deformation of the portion of membrane region M that overlies the piezoelectric region to which this voltage is applied (i.e., alternatively the first membrane M' or the second membrane M"), the mobile body 1100 undergoes, to a first approximation, a rototranslation. This rototranslation includes a translation (designated by DT) parallel to the axis A, in the region of some thirty nanometers. Translation of the mobile body 1100 parallel to the axis C is, to a first approximation, negligible, since it is in the region of a few tens of nanometers. By changing the piezoelectric region to which the voltage is applied, the direction of the translation DT is reversed. In particular, translation of the mobile body 1100 occurs in a direction of the piezoelectric region subjected to voltage, i.e., to deformation.

Rototranslation of the mobile body 1100 entails a deformation of the deformable region 240, the compliance of which does not limit, to a first approximation, the degree of rototranslation.

In practice, following upon the operations of singulation, each actuator device 20 forms, together with the corresponding read/write head 404, a MEMS (MicroElectroMechanical System) read/write device 1500, which is laterally delimited by the aforementioned side surface $P_{ext}$. Furthermore, even though variants are possible in which the deformable region 240 is absent (in other words, variants in which the recess 215 is not filled by the preliminary deformable region 240'), the presence of the deformable region 240 limits the number of openings of the MEMS read/write device 1500 that face out over the side surface $P_{ext}$ just to the portions of the first and second additional trenches T1', T2' that overlie the deformable region 240, which may have a reduced width along the axis A (for example, comprised between 0.5 µm and 2 µm). In this way, there is a reduction in the intensity of the turbulent aerodynamic forces to which the mobile body 1100 is subjected during its relative motion with respect to the disk 2, and the spurious movements of the mobile body 1100, induced by said aerodynamic forces, are therefore reduced. In this regard, in use it is precisely the side surface $P_{ext}$ that faces the disk 2.

As may be seen in FIG. 40, moreover possible are variants, in which the number and shape of the bridge structures 999 are different from what has been described. For instance, in the embodiment shown in FIG. 40, the first end of the read/write head 404 is fixed to two bridge structures 999 that are the same as one another and laterally staggered along the axis A.

As shown in FIG. 41, it is moreover possible for the system of constraint of the first end of the read/write head 404 to be different from what has been described and to include, for example, a pair of springs 1001, which are of alumina and are arranged, respectively, within the first and second additional trenches T1', T2'. In particular, each spring 1001 is fixed between a corresponding portion of the read/write head 404 and a corresponding portion of the main body 402 of the top structure 400. The springs 1001 enable reduction of the depth of the notches parallel to the axis B.

A variant of the manufacturing process is described with reference to FIG. 42 and the subsequent figures. Also in this case, the description is limited to a single actuator device 20 and to the portions coupled thereto.

Figure 42:
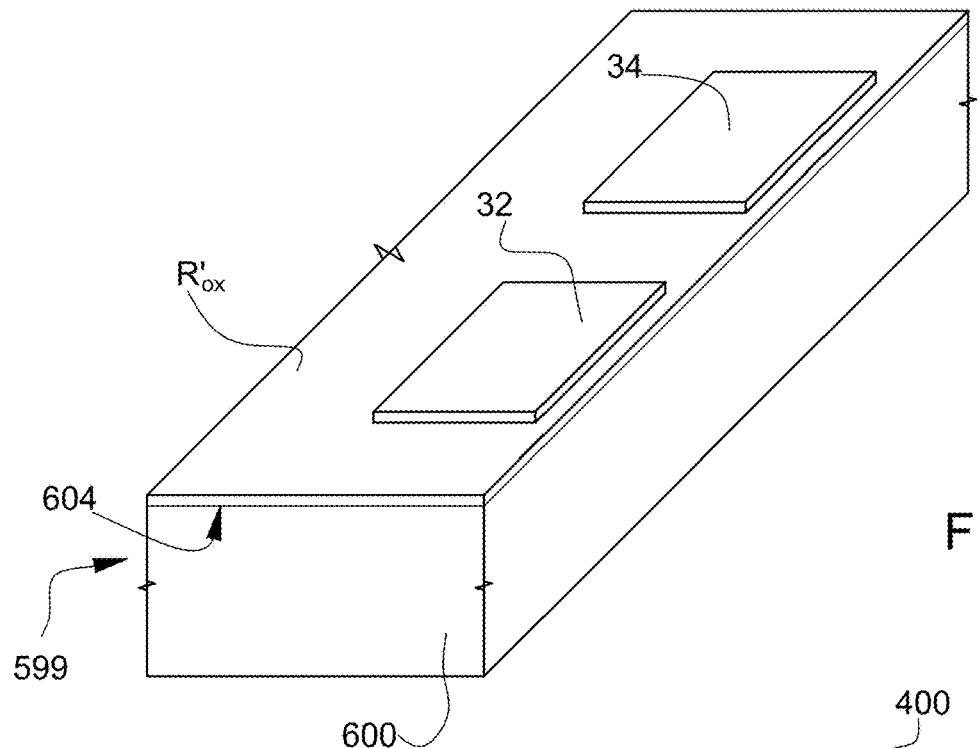
FIG. 42 schematically shows a perspective view, with portions, of a wafer.

In detail, as shown in FIG. 42, the second wafer, here designated by 599, is initially provided. The base surface of the second wafer 599 is here designated by 604 and is plane and without the housing cavity 302; moreover, the supporting body of the second wafer 599 is designated by 600. In addition, the second wafer 599 may be of AlTiC or a material different from AlTiC; for example, the second wafer 599 may be of a semiconductor (e.g., silicon).

Formed on the base surface 604 is an intermediate dielectric region $R'_{ox}$, formed on which are the first and second piezoelectric regions 32, 34, as well as, even though not shown, the conductive region 19 and the first and second top electrode regions 36, 38. Moreover, as may be seen in FIG. 43, a top dielectric region $R_{top}$ is formed on the exposed portions of the intermediate dielectric region $R'_{ox}$ and on the first and second piezoelectric regions 32, 34 (more precisely, on the first and second top electrode regions 36, 38, not shown in FIG. 43). Albeit not illustrated, the top dielectric region $R_{top}$ may be formed, in turn, by a USG oxide layer and by an overlying silicon-nitride layer.

Next, as represented once again in FIG. 43, formed on the second wafer 599, and in particular on the top dielectric region $R_{top}$, is the top structure 400, which includes the main body 402 and the read/write head 404 (including the corresponding coil 405) and is once again delimited on top by the surface to be etched $S_{etch}$.

Figure 44:
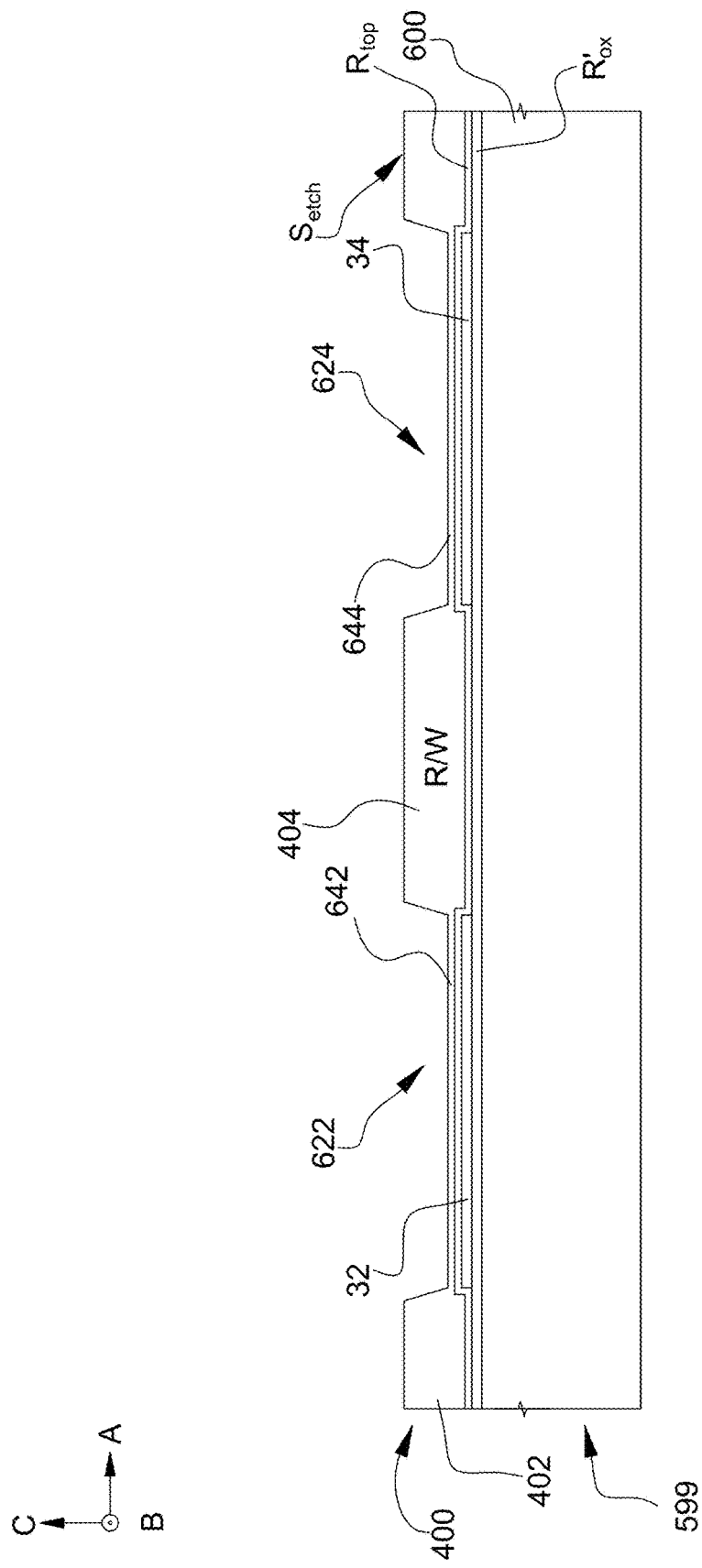

Next, as shown in FIG. 44, a process of etching the top structure 400 is carried out so as to selectively remove, starting from the surface to be etched Sewn, portions of the main body 402 that overlie the first and second cavities 32, 34, respectively. In this way, a first recess 622 and a second recess 624 are formed, which have approximately a frustopyramidal shape, with the minor base that overlies respectively, at a distance, the first and second piezoelectric regions 32, 34. This etching operation is of a time-based type. Consequently, the bottoms of the first and second recesses 622, 624 are formed, respectively, by a first residual portion 642 and a second residual portion 644 of the main body 402, which coat corresponding portions if the top dielectric region $R_{top}$ and overlie the first and second piezoelectric regions 32, 34, respectively. Albeit not illustrated, variants are in any case possible, in which etching is carried out so as that the top dielectric region $R_{top}$ functions as etch stop. In this case, the bottoms of the first and second recesses 622, 624 are formed, respectively, by a first portion and a second portion of the top dielectric region $R_{top}$, which overlie the first and second piezoelectric regions 32, 34, respectively.

The first and second recesses 622, 624 are closed laterally and laterally delimit the read/write head 404, which is thus interposed in between.

Figure 45:
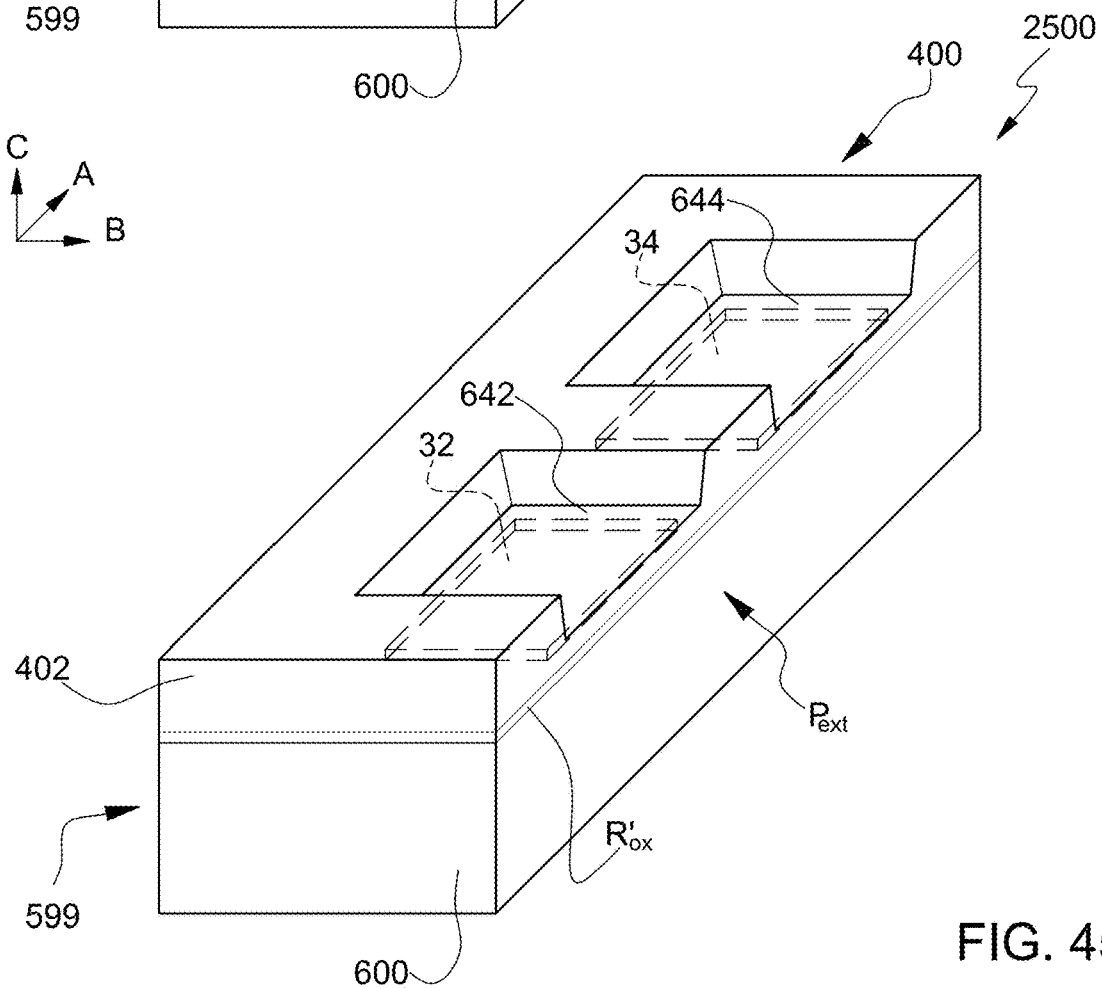
FIG. 45 schematically shows a perspective view of a device obtained by singulation of the assembly shown in FIGS. 43 and 44.

Next, an operation of singulation of the assembly formed by the second wafer 599 and the top structure 400 is carried out in a per se known manner, following upon which the MEMS read/write device 2500 is formed. This MEMS read/write device 2500 is shown in FIG. 45, where for simplicity the top dielectric region $R_{top}$, the conductive region 19, and the first and second top electrode regions 36, 38 are not represented.

In detail, the cut is so that the plane defined by the side surface $P_{ext}$ traverses the first and second recesses 622, 624, which thus become open not only at the top but also on one side. Moreover, without this implying any loss of generality, the cut passes through the first and second residual portions 642, 644 of the main body 402. In addition, the first and second piezoelectric regions 32, 34 are at a distance from the side surface $P_{ext}$ comprised, for example, between 5 µm and 10 µm. In practice, following upon the dicing operation, the first and second recesses 622, 624 face out over the side surface $P_{ext}$.

Figure 46:
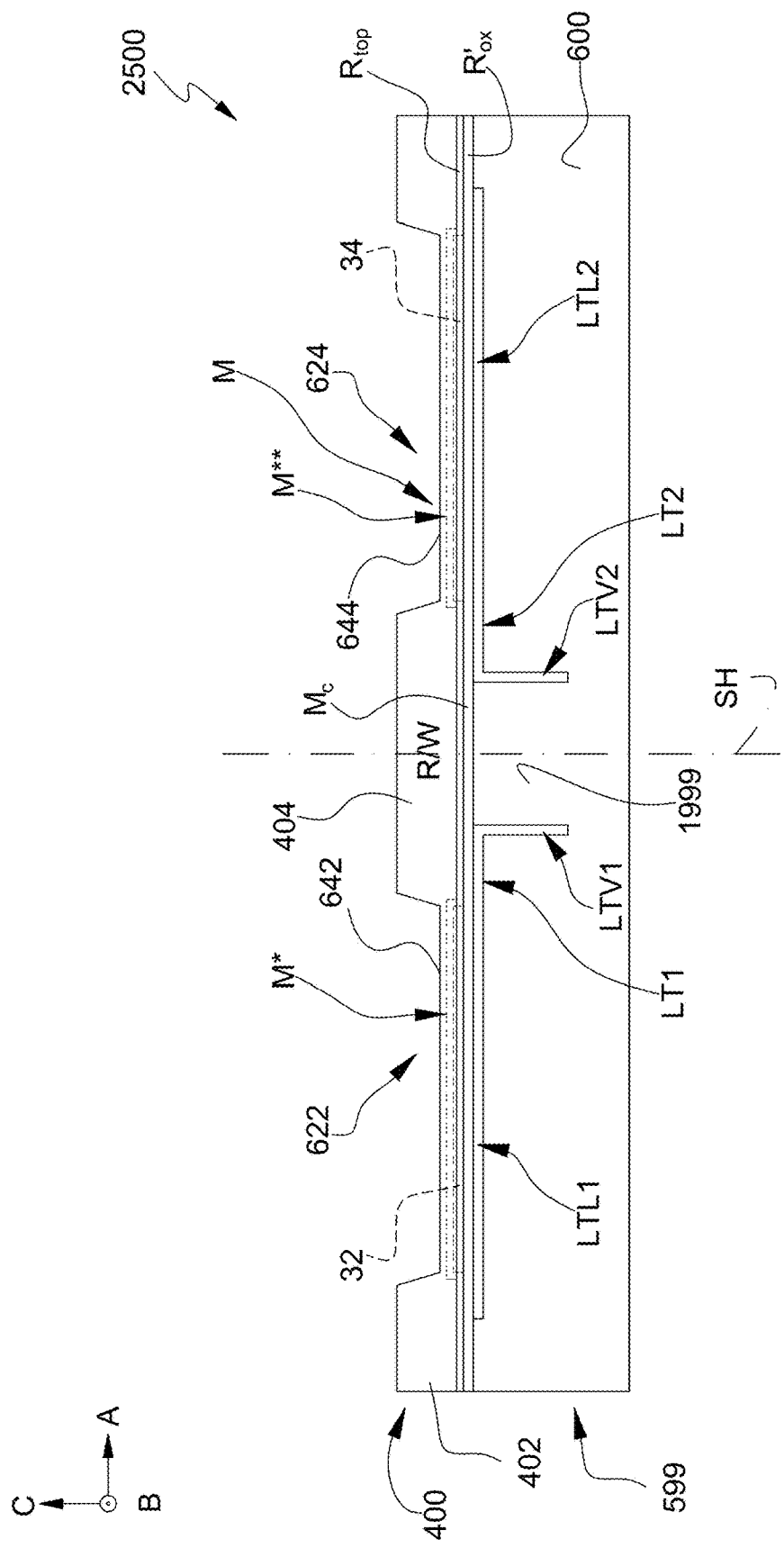
FIG. 46 shows a side view of the device shown in FIG. 45, after a subsequent step of the manufacturing process.
Figure 47:
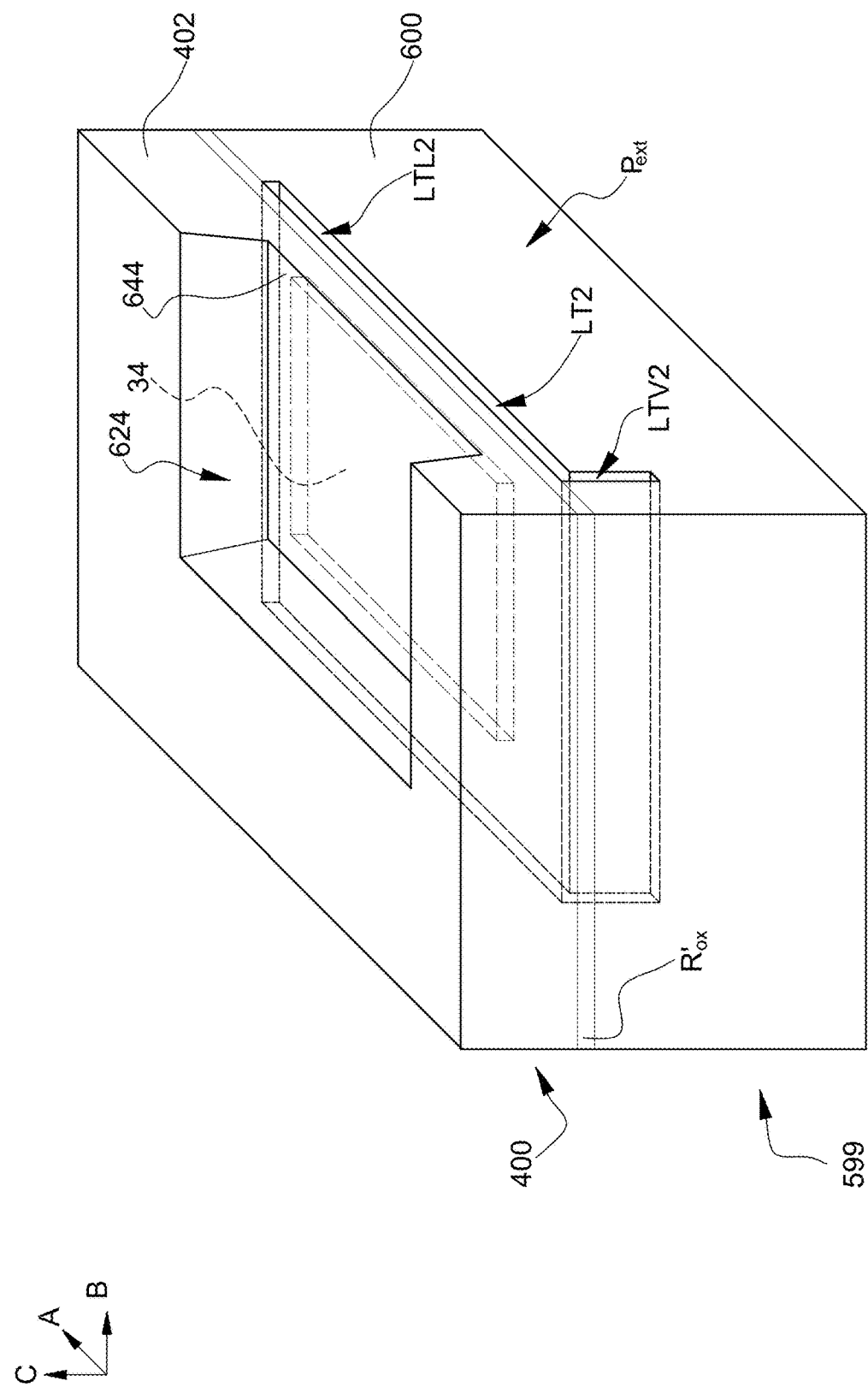
FIG. 47 schematically shows a perspective view, with portions removed, of a part of the device shown in FIG. 46.

Next, as illustrated in FIGS. 46 and 47, an etch is carried out starting from the side surface $P_{ext}$ so as to selectively remove portions of the supporting body 600 of the second wafer 599 that extend underneath the intermediate dielectric region $R'_{ox}$ in order to form a pair of trenches, referred to in what follows as first and second side trenches LT1, LT2, respectively.

The first and second side trenches LT1, LT2 are the same as one another and symmetrical with respect to the plane of symmetry SH. Given the symmetry, in what follows just the first side trench LT1 is described, except where otherwise specified. Portions of the second side trench LT2 that are the same as portions of the first side trench LT2 and are designated by the same references, but with the "1" replaced by a "2".

In detail, the first side trench LT1 comprises a longitudinal portion LTL1 and a vertical portion LTV1, which have, to a first approximation, a parallelepipedal shape and have a same extension in a direction parallel to the axis B.

The first piezoelectric region 32 extends entirely over the longitudinal portion LTL1, which moreover extends so as to be adjacent to the intermediate dielectric region $R'_{ox}$. In other words, as may be seen in FIG. 46, the longitudinal portion LTL1 is delimited at the top and at the bottom by a corresponding portion of the intermediate dielectric region $R'_{ox}$ and a corresponding portion of the supporting body 600 of the second wafer 599, respectively. However possible are embodiment, where present between the longitudinal portion LTL1 and the intermediate dielectric region $R'_{ox}$ is a residual portion of supporting body 600.

The vertical portion TLV1 connects up to the longitudinal portion LTL1. Furthermore, along the axis C, the vertical portion TLV1 has a length greater than the length of the longitudinal portion LTL1; for instance, along the axis C, the vertical portion TLV1 has a length, for example, of between 100 µm and 500 µm, whereas the longitudinal portion LTL1 has a length of between 1 µm and 3 µm.

In side view, the vertical portion TLV1 and the longitudinal portion LTL1 are arranged at 90°, i.e., to form an L, and with vertical portion TLV1 facing the plane of symmetry SH.

In greater detail, the vertical portion TLV1 is laterally staggered with respect to the first piezoelectric region 32 and is arranged underneath the read/write head 404.

In practice, the vertical portions LTV1, LTV2 of the first and second side trenches LT1, LT2 laterally delimit a part of the supporting body 600 that forms a supporting structure 1999, which has a parallelepipedal shape. This parallelepipedal shape is free on three sides, whereas on the fourth side and on the bottom base it is fixed to the remaining part of the supporting body 600. The read/write head 404 is fixed to the top base of the parallelepipedal shape, as described in greater detail hereinafter.

The supporting structure 1999 has a symmetrical shape with respect to the plane of symmetry SH. The first and second piezoelectric regions 32, 34, as also the first and second recesses 622, 624, extend on opposite sides with respect to the supporting structure 1999, whereas the read/write head 404 is vertically aligned with respect to the latter.

For practical purposes, the first and second residual portions 642, 644 form, together with underlying portions of the intermediate dielectric region $R'_{ox}$ and of the top dielectric region $R_{top}$, the first and second membranes, here denoted by M* and M** (FIG. 46), which face out over the side surface $P_{ext}$. Moreover, the first and second side trenches LT1, LT2 form corresponding cavities open laterally, between which the supporting structure 1999 extends. These cavities are closed at the top by a portion of the intermediate dielectric region $R'_{ox}$, which forms, together with the first and second residual portions 642, 644, the membrane region (designated once again by M in FIG. 46) and carries the first and second piezoelectric regions 32, 34, which are therefore coupled to corresponding peripheral portions of the membrane region M. Said portion of the intermediate dielectric region $R'_{ox}$ also carries the read/write head 404.

In greater detail, the read/write head 404 is fixed with respect to a central portion (designated once again by $M_c$ in FIG. 46) of the membrane region M, which is formed, on one side, in the intermediate dielectric region $R'_{ox}$, is interposed between the peripheral portions of the membrane region M, and is moreover fixed to the underlying supporting structure 1999. In addition, whereas a first end of the read/write head 404 faces out over the side surface $P_{ext}$ and is therefore free, a second end of the read/write head 404, opposite to the first end and aligned to the latter in a direction parallel to the axis B, is fixed to the main body 402 of the top structure 400.

Figure 48:
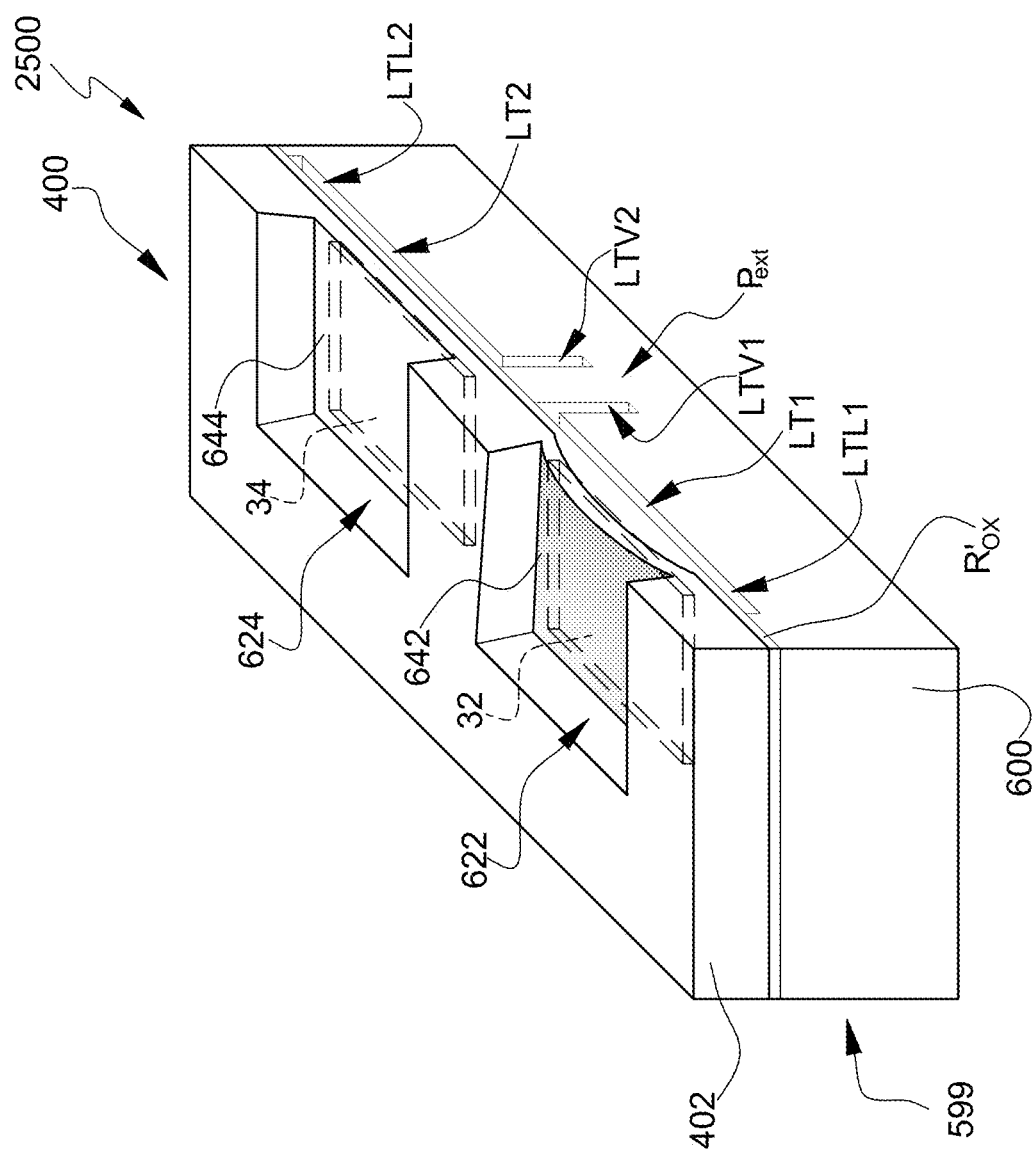
FIG. 48 schematically shows a perspective view of a read/write device, in use.

As may be seen in FIG. 48, it is found that, by applying in turns a voltage to the first piezoelectric region 32 and to second piezoelectric region 32, 34, and thus causing deformation of the piezoelectric region to which the voltage is applied, there is induced, to a first approximation, a translation of the read/write head 404 (and of the supporting structure 1999) in a direction parallel to the axis A, towards the deformed piezoelectric region. The characteristics, and in particular the degree, of the above movement are, to a first approximation, similar to the ones described with reference to FIG. 39.

Also in the embodiment illustrated in FIG. 46, each one of the first and second membranes M*, M** has a first end, which is fixed to the main body 402 and to the supporting body 600, and a second end, which is laterally staggered with respect to the first end in a direction parallel to the axis A and is fixed to the central portion $M_c$ of the membrane region M.

In practice, the actuator device and the read/write head form a read/write device, which affords advantages that emerge clearly from the foregoing description. In particular, it is possible to translate the read/write head with respect to the supporting body obtained starting from the second wafer, which functions as slider. Moreover, the degree of said translation is sensibly higher than what can be obtained with the solutions according to the prior art.

Finally, it is clear that modifications and variations may be made to what has been described and illustrated herein, without thereby departing from the scope of the present disclosure.

For instance, the alignments may be different from what has been described, for example so as to take into account possible tolerances of the manufacturing process. In particular, the alignments between the first and second cavities 22, 24 and the first and second trenches T1, T2 may vary, as well as the alignments with respect to the housing cavity. Likewise, the shape and arrangement of the first and second additional trenches T1', T2' may vary.

It is moreover possible for the first and second cavities 22, 24 to have walls without oxide coating, in which case, however, control of the depth of the first and second additional trenches T1', T2' may be more problematical.

The number and shape of the piezoelectric regions may vary with respect to what has been described.

As mentioned previously, the materials may be different from the ones described and/or regions may be present additional to the ones described. For instance, metal paths may extend within the main body 402 of the top structure 400.

The first and second additional trenches T1', T2' can terminate, respectively, on corresponding portions of the second parts 25A'', 25B'' of the first and second inner coating regions 25A, 25B, without traversing them. In this case, in fact, the portions of the second parts 25A'', 25B'' that would delimit the bottoms of the first and second additional trenches T1', T2' would be thin to such a point as to undergo failure at the very first actuation.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate;
a first cavity in the substrate;
a first membrane overlying the first cavity;
a first actuator overlying the first membrane;
a second cavity in the substrate, the first and second cavities being spaced from each other by a portion of the substrate;
a second membrane overlying the second cavity;
a second actuator overlying the second membrane;
a first trench extending into the substrate; and
a second trench extending into the substrate, the first and second trenches being fluidically coupled to the first and second cavities, the first and second actuators positioned between the first and second trenches.

2. The device of claim 1, further comprising:
a read/write head coupled to the substrate, the first and second actuators positioned on a first side of the substrate, the read/write head positioned on a second side, opposite to the first side, of the substrate.

3. The device of claim 2, further comprising:
a body on the second side of the substrate, the read/write head coupled to the body.

4. The device of claim 3, further comprising:
a bridge structure that couples the read/write head to the body.

5. The device of claim 4, further comprising:
a plurality of springs that couples the read/write head to the body.

6. The device of claim 1 wherein the first and second actuators are piezoelectric actuators.

7. The device of claim 1, further comprising:
a deformable region that is a portion of a sidewall of the second trench.

8. The device of claim 7 wherein the deformable region includes a silicone polymer.

9. The device of claim 1, further comprising:
a circular trench extending into the substrate, the circular trench encircling a cylindrical portion of the substrate.

10. The device of claim 1, further comprising:
a dielectric layer on walls of the first and second cavities.

11. The device of claim 1, further comprising:
a first electrode on the substrate, the first and second actuators being on the first electrode;
a second electrode on the first actuator; and
a third electrode on the second actuator.

12. The device of claim 1, further comprising:
a dielectric layer on the substrate, the first and second cavities being spaced from the first and second actuators by the dielectric layer.

13. A method, comprising:
forming a first cavity in a substrate;
forming a first membrane that overlies the first cavity;
forming a first actuator that overlies the first membrane;
forming a second cavity in the substrate, the first and second cavities being spaced from each other by a portion of the substrate;
forming a second membrane that overlies the second cavity;
forming a second actuator that overlies the second membrane;
forming a first trench that extends into the substrate; and
forming a second trench that extends into the substrate, the first and second trenches being fluidically coupled to the first and second cavities, the first and second actuators positioned between the first and second trenches.

14. The method of claim 13, further comprising:
forming a deformable region that forms a portion of a sidewall of the second trench.

15. The method of claim 13, further comprising:
forming a circular trench extending into the substrate, the circular trench encircling a cylindrical portion of the substrate.

16. The method of claim 13, further comprising:
forming a dielectric layer on walls of the first and second cavities.

17. The method of claim 13, further comprising:
forming a first electrode on the substrate, the first and second actuators being on the first electrode;

forming a second electrode on the first actuator; and
forming a third electrode on the second actuator.

18. A device, comprising:
a substrate having a first side and a second side opposite to the first side;
a fixed structure on the first side of the substrate;
a read/write head on the first side of the substrate and coupled to the fixed structure;
a plurality of actuators on the second side of the substrate;
a plurality of cavities in the substrate;
a plurality of membranes between the plurality of actuators and the plurality of cavities; and
first and second trenches extending into the substrate and fluidically coupled to the plurality of cavities, the plurality of actuators positioned between the first and second trenches.

19. The device of claim 18, further comprising:
a deformable region that is a portion of a sidewall of one of the first and second trenches.

20. The device of claim 18, wherein the read/write head is coupled to the fixed structure by a bridge structure, springs, or a combination thereof.

\* \* \* \* \*